(12) United States Patent
Miida

(10) Patent No.: US 7,221,029 B2
(45) Date of Patent: May 22, 2007

(54) SEMICONDUCTOR DEVICE AND SEMICONDUCTOR MEMORY USING THE SAME

(75) Inventor: Takashi Miida, Yokohama (JP)

(73) Assignee: Innotech Corporation, Kanagawa (JP)

( * ) Notice: Subject to any disclaimer, the term of this patent is extended or adjusted under 35 U.S.C. 154(b) by 78 days.

(21) Appl. No.: 11/236,629

(22) Filed: Sep. 28, 2005

(65) Prior Publication Data

US 2006/0027857 A1    Feb. 9, 2006

Related U.S. Application Data

(62) Division of application No. 10/397,377, filed on Mar. 27, 2003, now Pat. No. 6,984,863.

(30) Foreign Application Priority Data

Mar. 27, 2002  (JP)  ............................ 2002-89744
Feb. 14, 2003  (JP)  ............................ 2003-36005

(51) Int. Cl.
*H01L 29/76* (2006.01)
(52) U.S. Cl. .................. 257/368; 257/314; 257/315; 257/401; 365/185.05; 365/185.11
(58) Field of Classification Search ................ 257/368, 257/314, 315, 401; 365/185.05, 185.11
See application file for complete search history.

(56) References Cited

U.S. PATENT DOCUMENTS 5,379,255 A    1/1995  Shah
5,508,544 A    4/1996  Shah
6,861,315 B1   3/2005  Chen et al.
6,944,062 B2   9/2005  Miida
2002/0014666 A1  2/2002  Ohmi et al.
2003/0080356 A1  5/2003  Miida
2003/0095441 A1  5/2003  Miida

FOREIGN PATENT DOCUMENTS

JP    2001-160555 A    6/2001
JP        3249811 B1   11/2001
JP        3249812 B1   11/2001
JP        3283872 B1    3/2002

OTHER PUBLICATIONS

Paper No. 29p-YC-4, The 48th Joint Meeting of Engineers of Applied Physics of Japan.

*Primary Examiner*—Doug Menz
(74) *Attorney, Agent, or Firm*—Birch, Stewart, Kolasch & Birch, LLP

(57) ABSTRACT

A cell transistor includes source/drain regions formed at a lower level than part of its channel region. A select transistor has a channel region and source/drain regions formed at substantially the same level as the source/drain regions of the cell transistor. One of the source/drain regions of the cell transistor and one of the source/drain regions of the select transistor are electrically interconnected to each other in substantially the same plane.

9 Claims, 57 Drawing Sheets

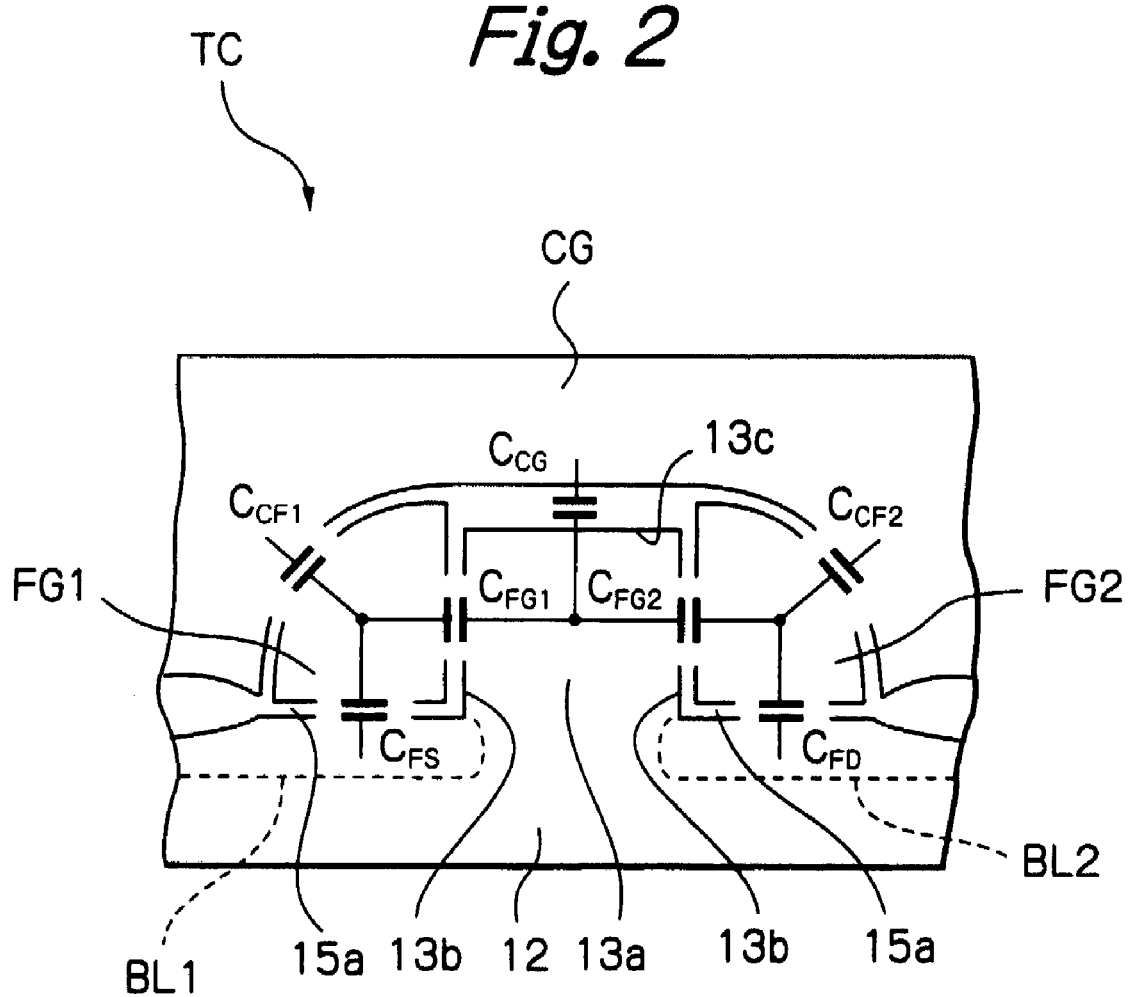

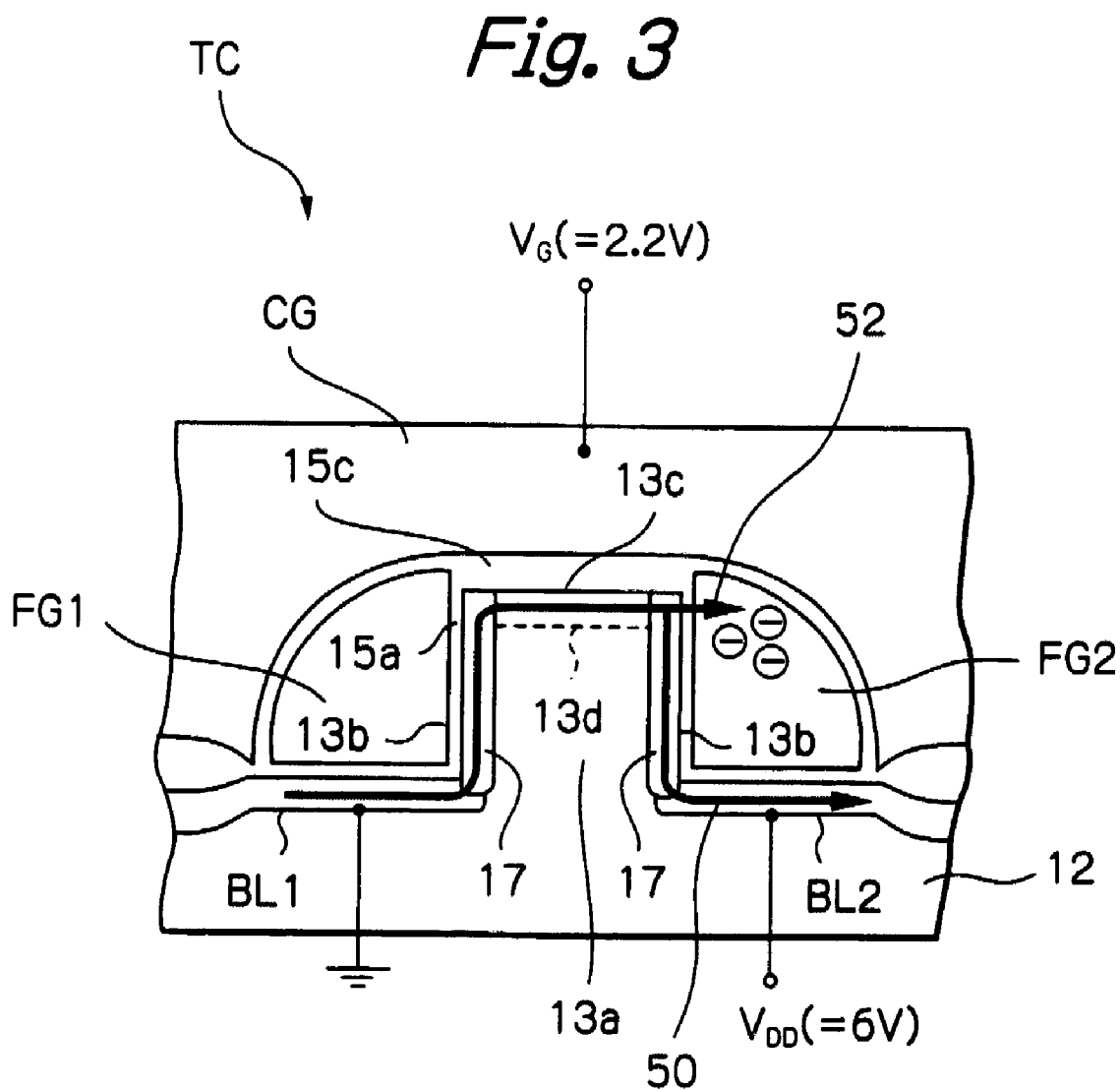

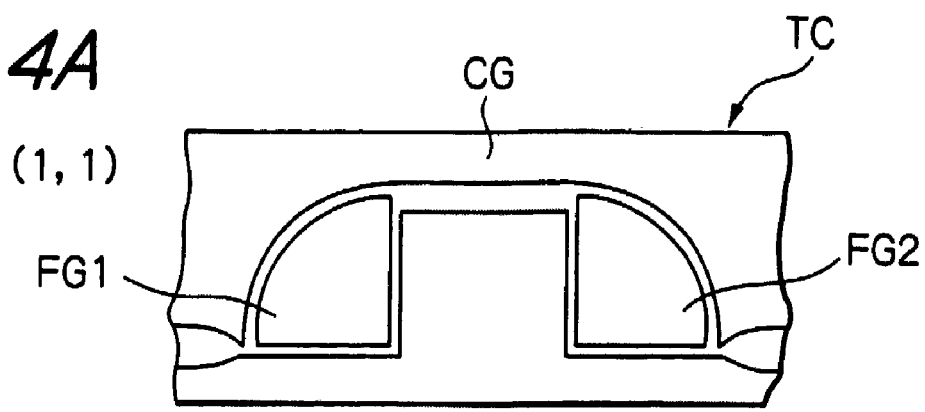
Fig. 4A (1, 1)
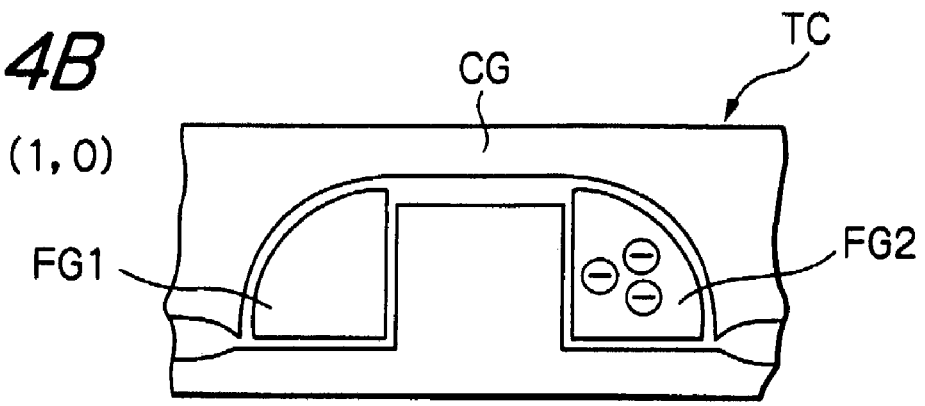
Fig. 4B (1, 0)
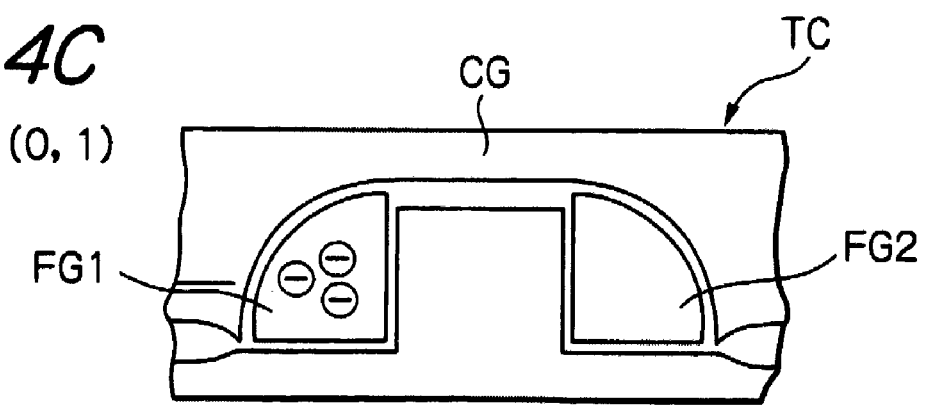
Fig. 4C (0, 1)
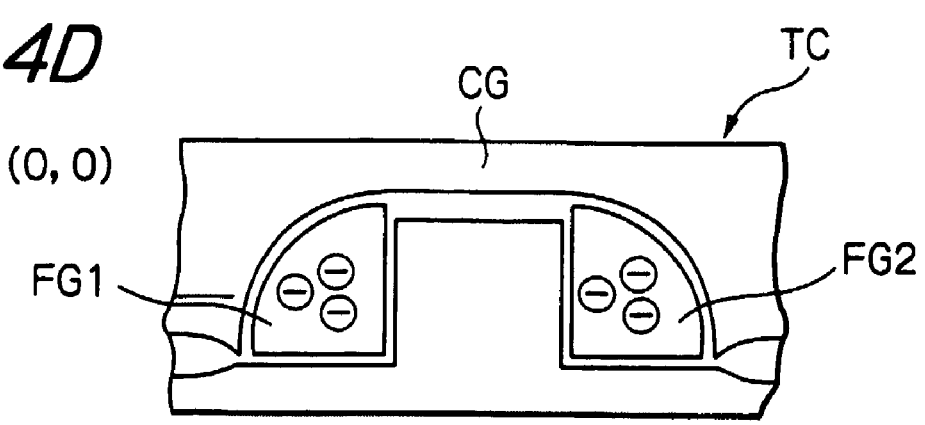
Fig. 4D (0, 0)

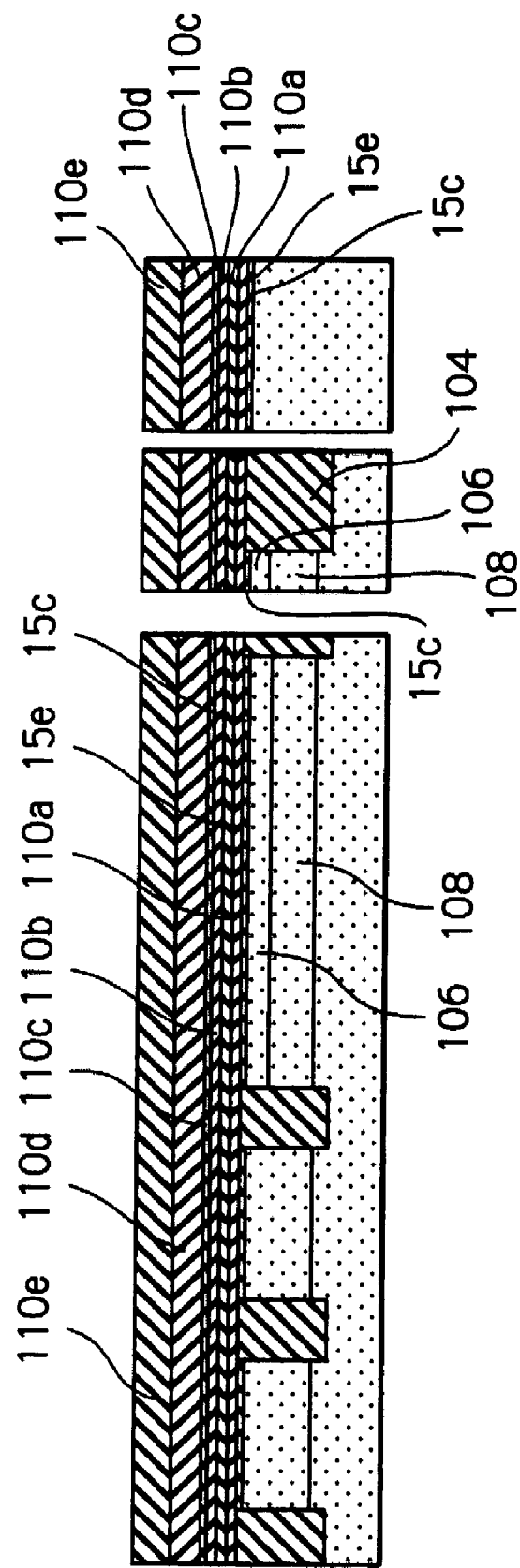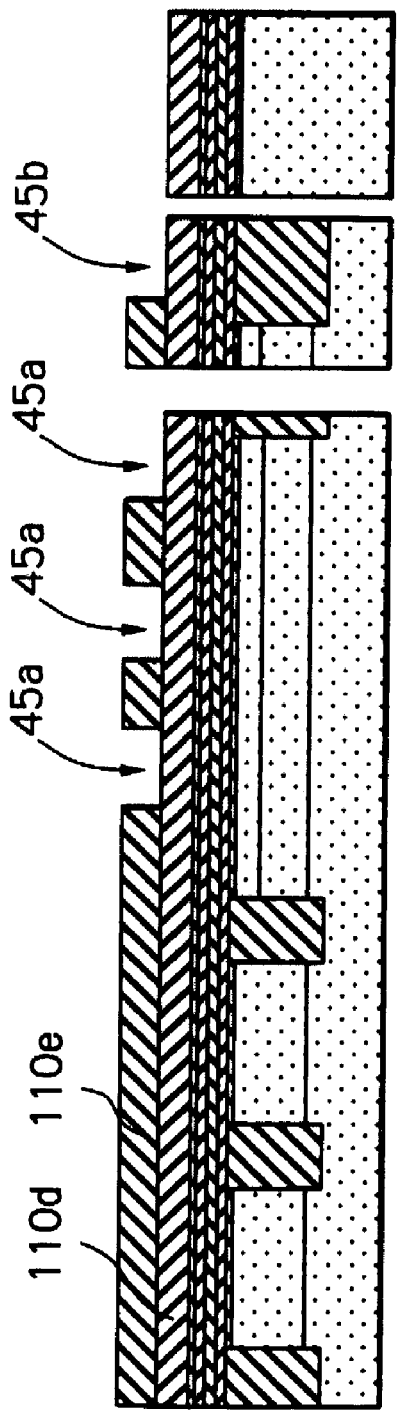

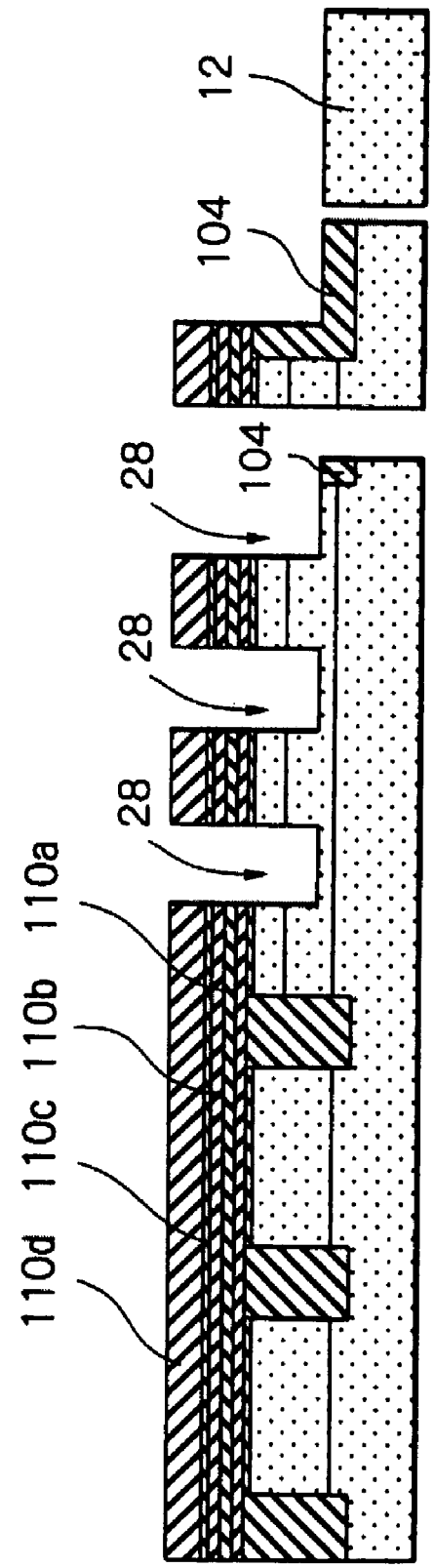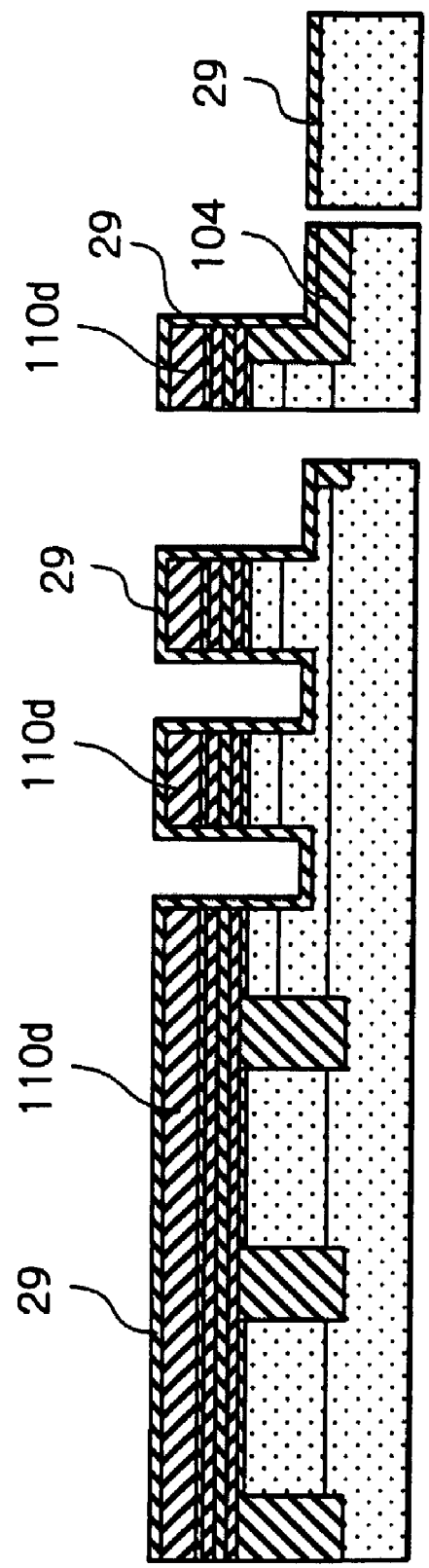

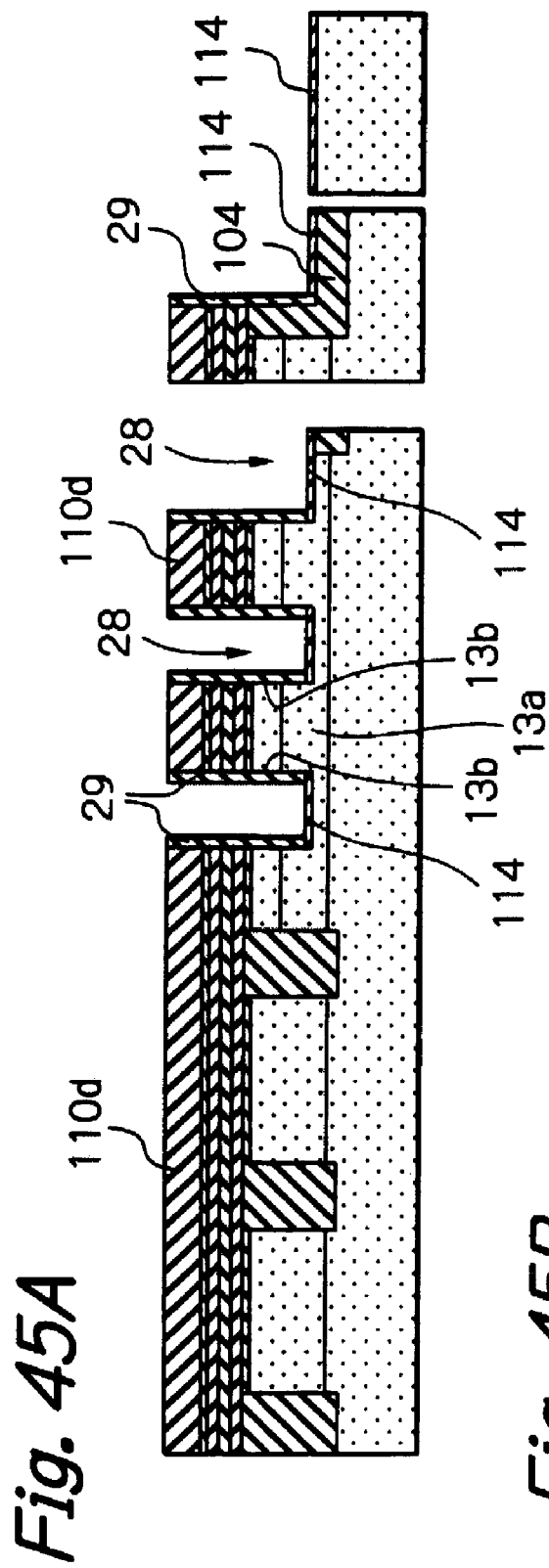
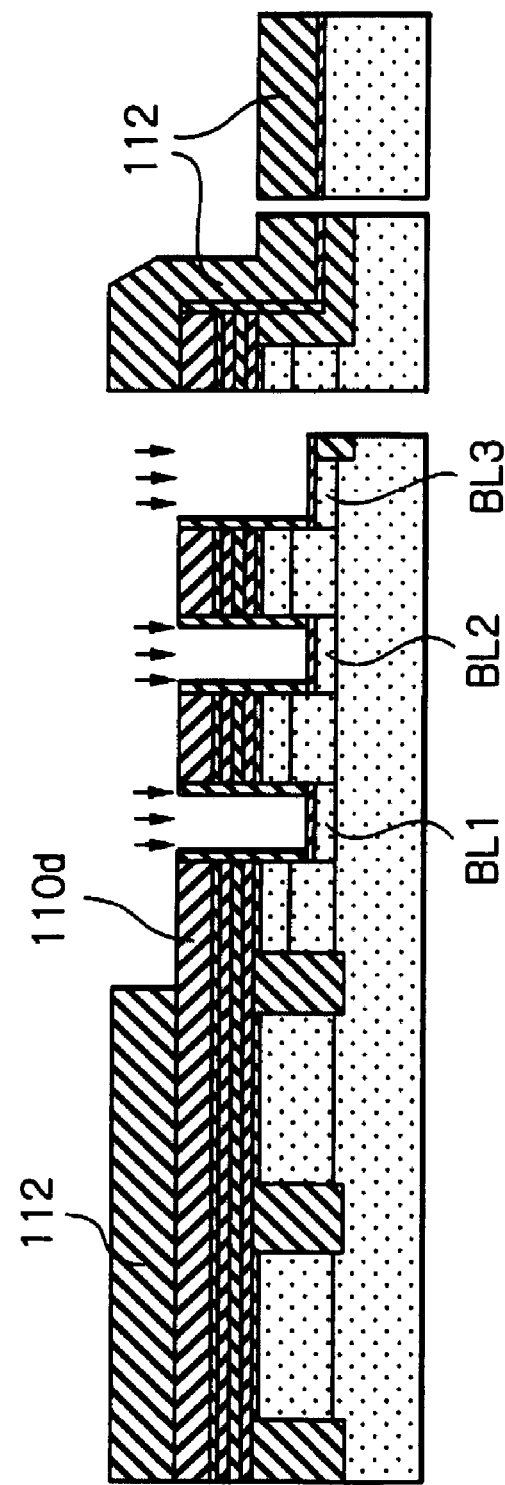
Fig. 45A
Fig. 45B

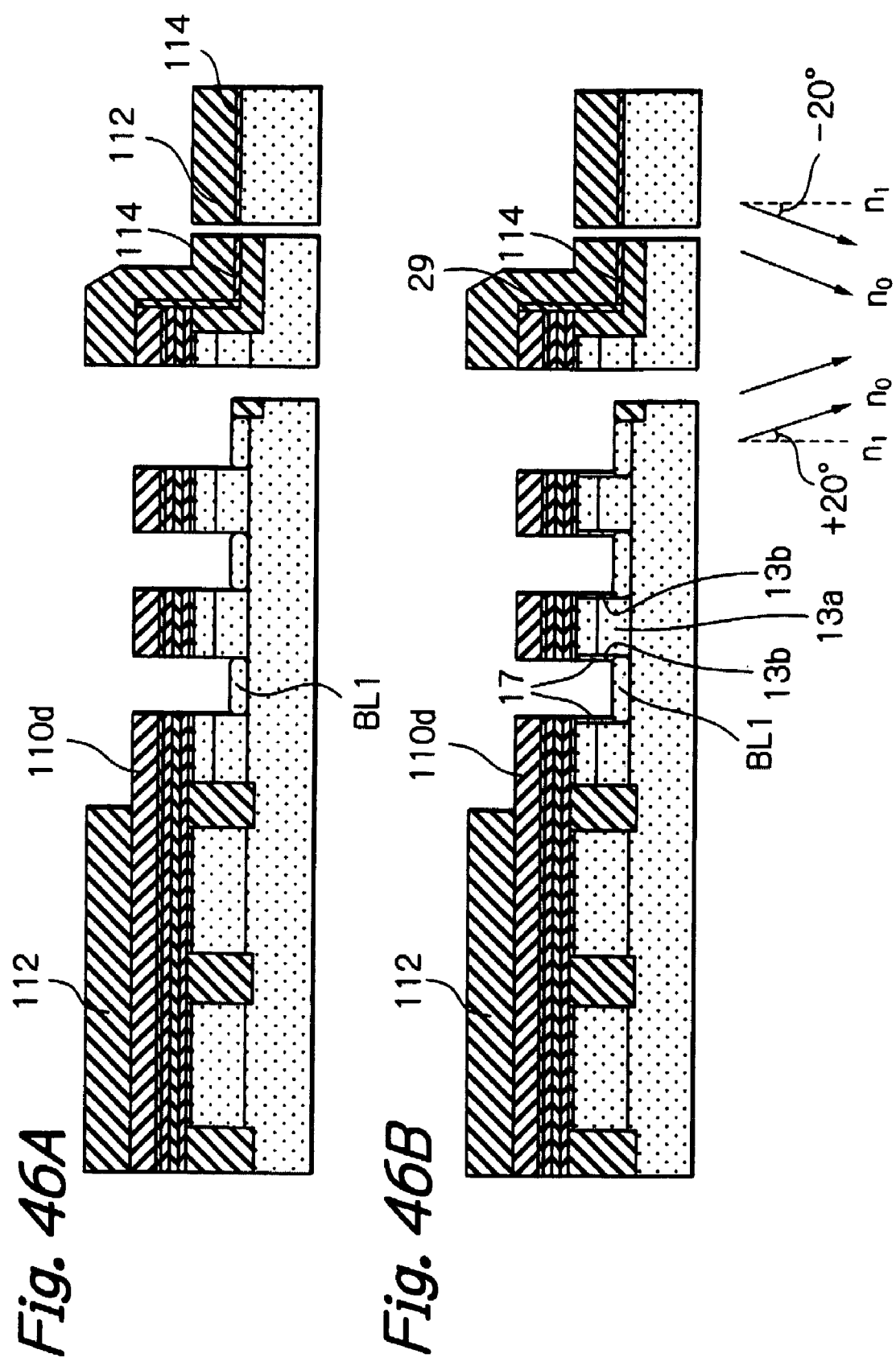

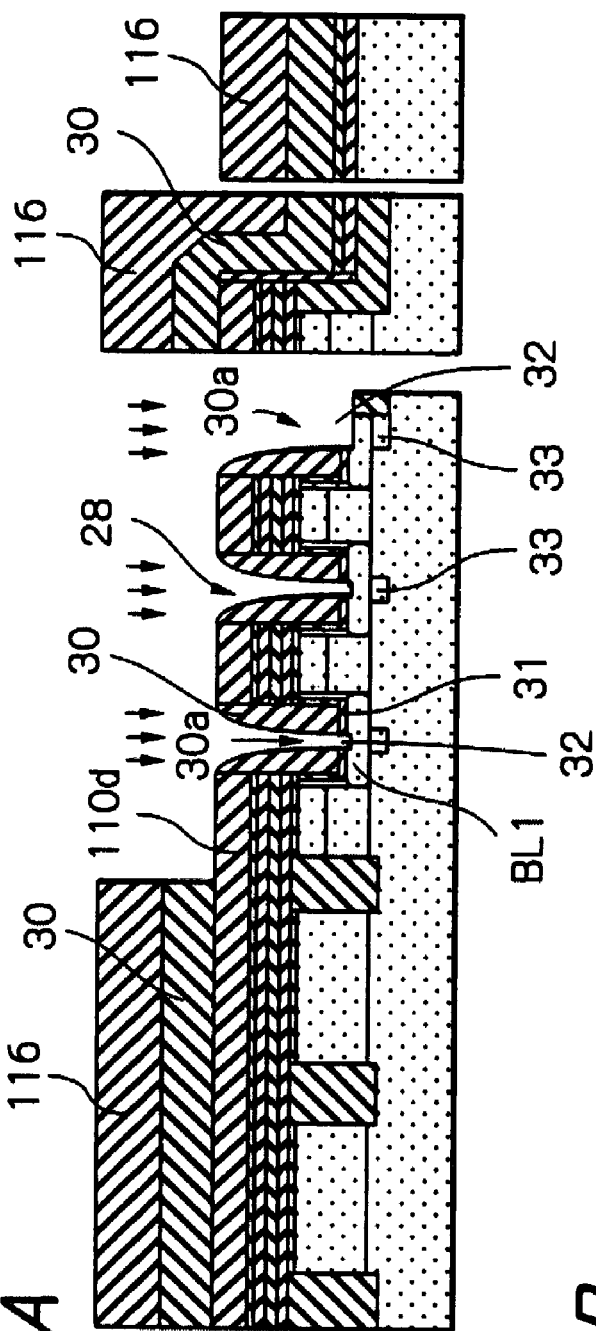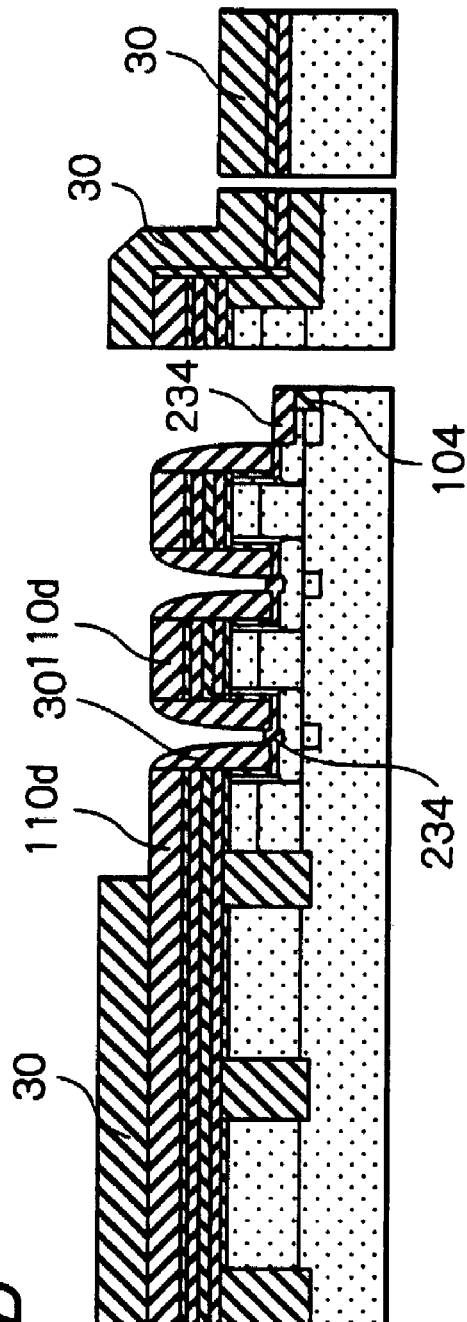

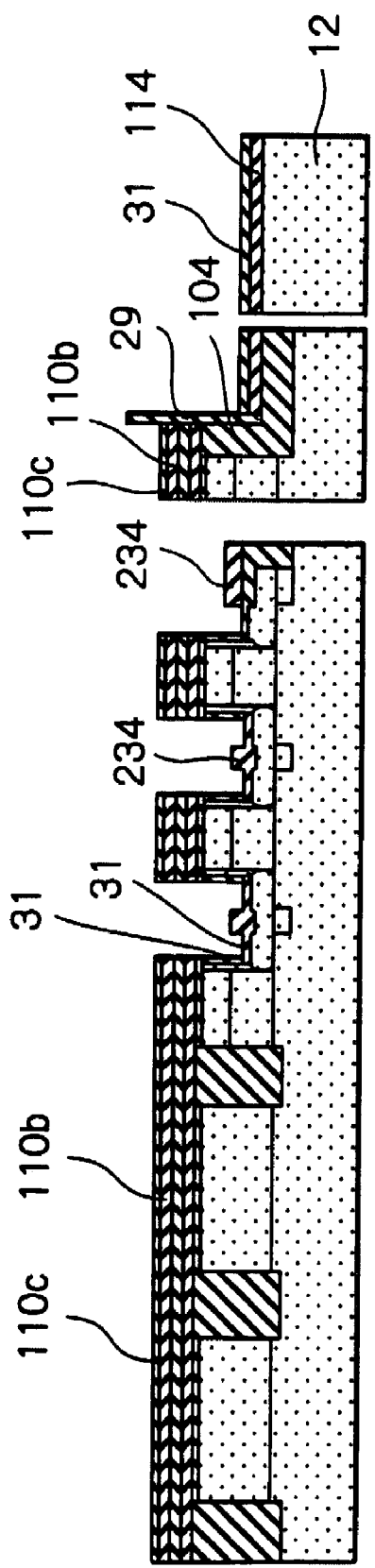
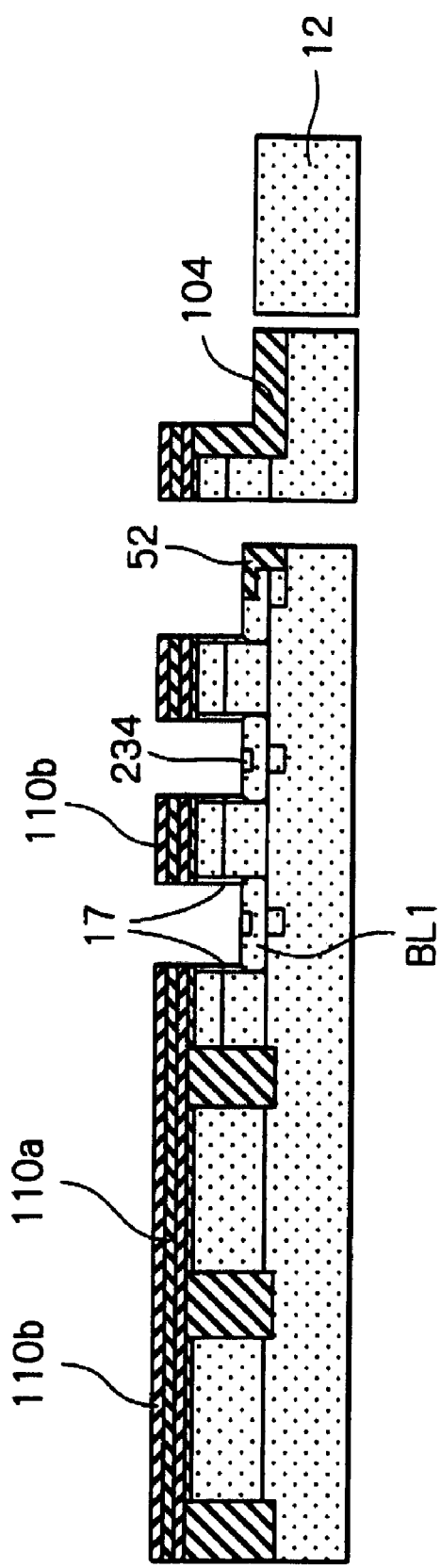
Fig. 49A
Fig. 49B

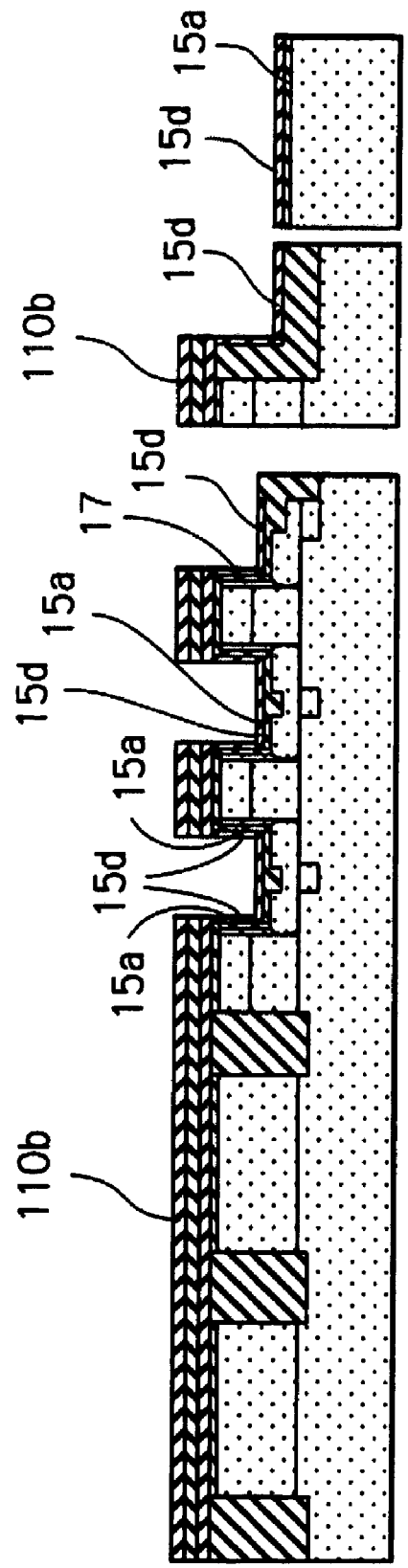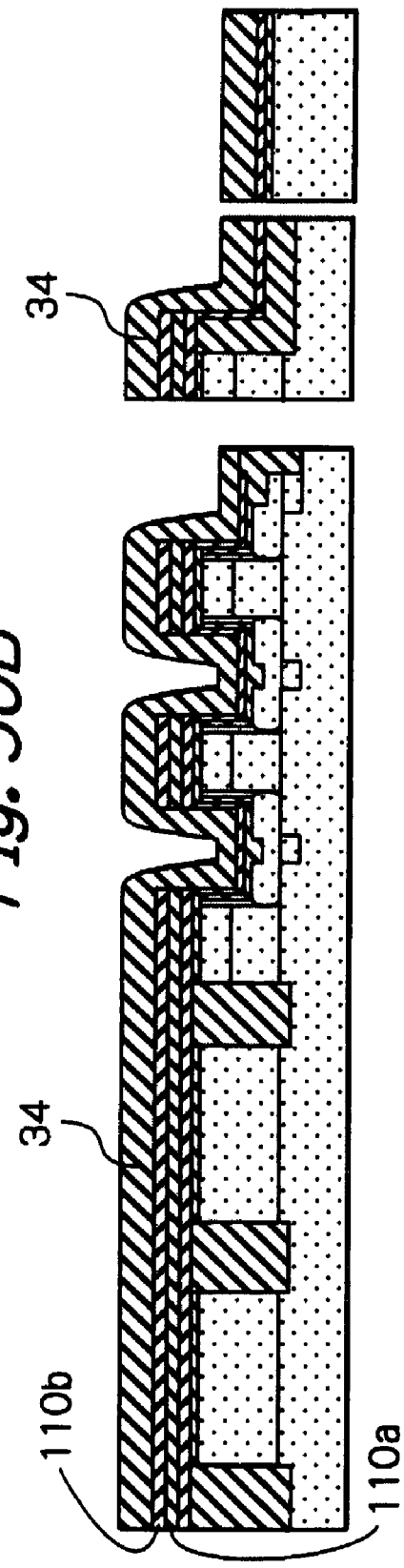

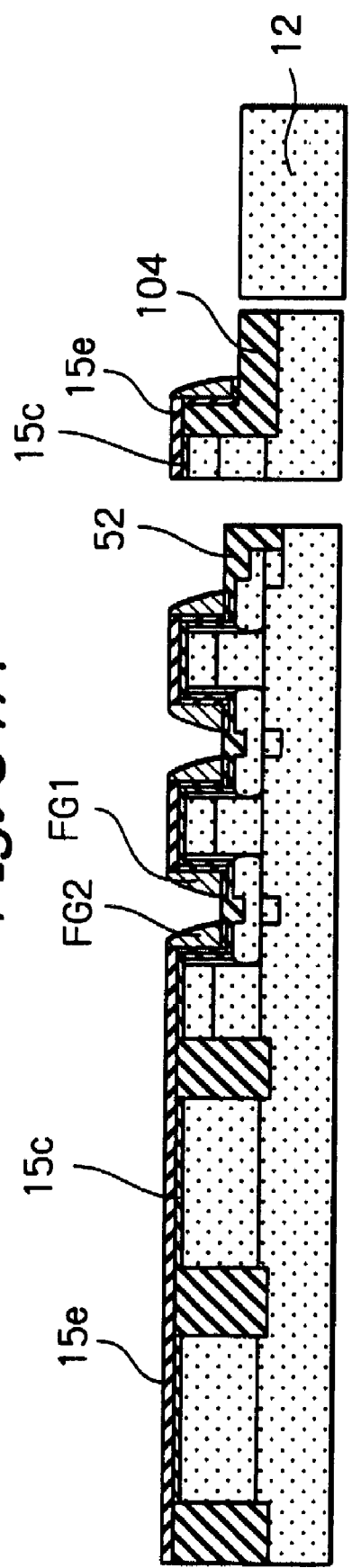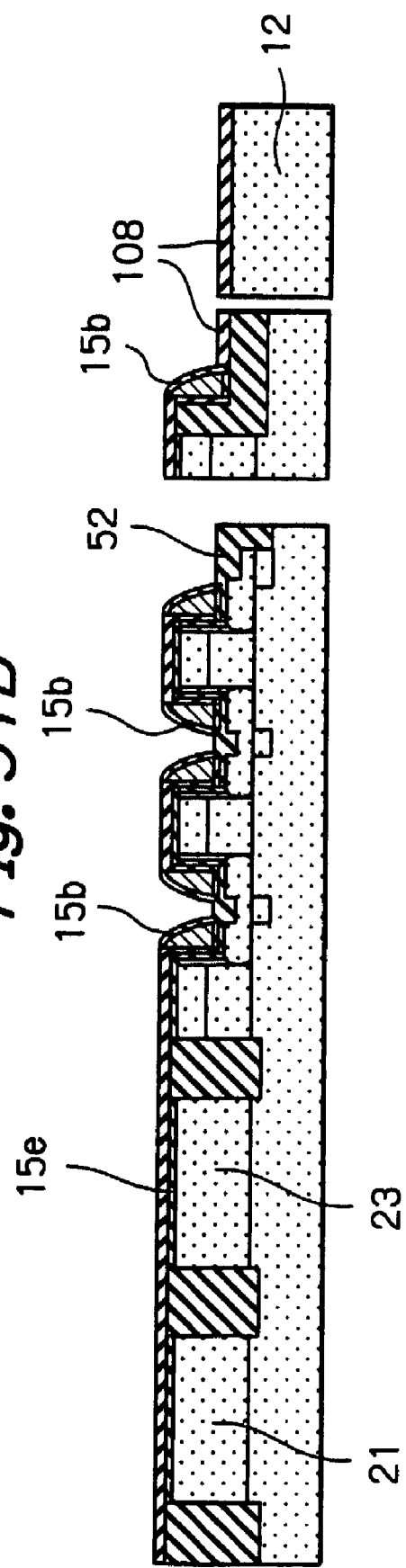

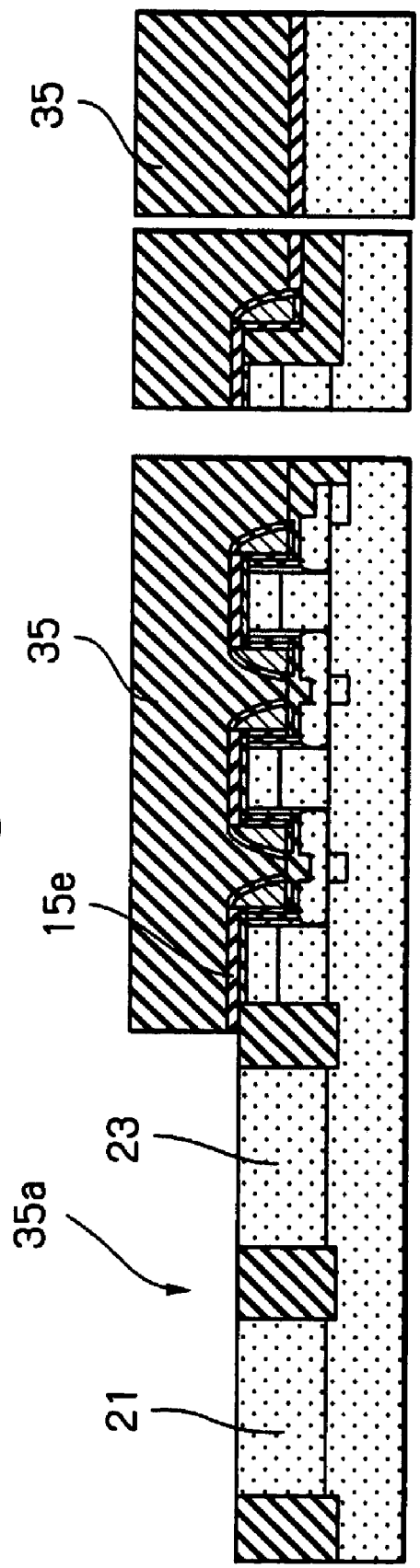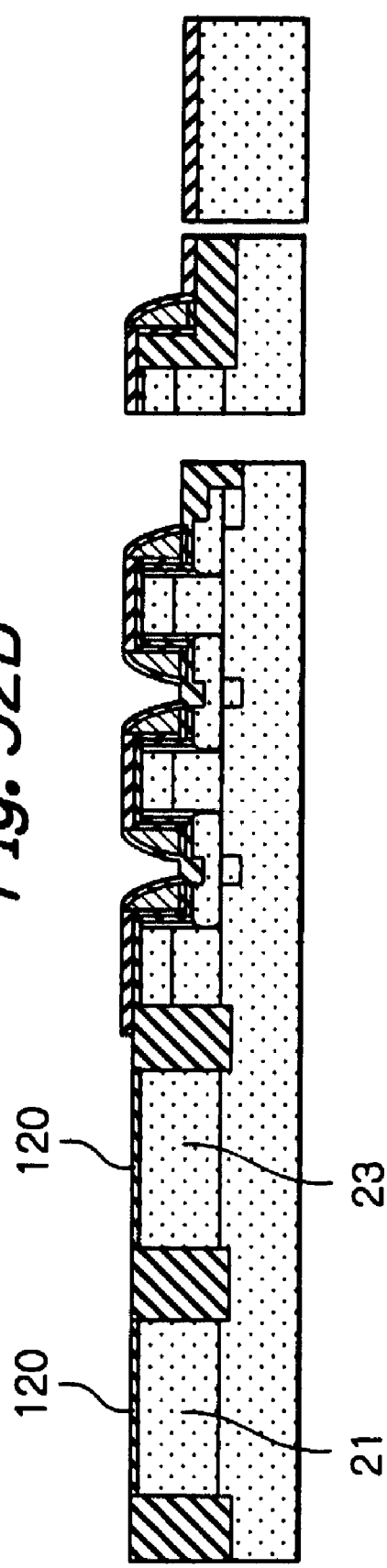

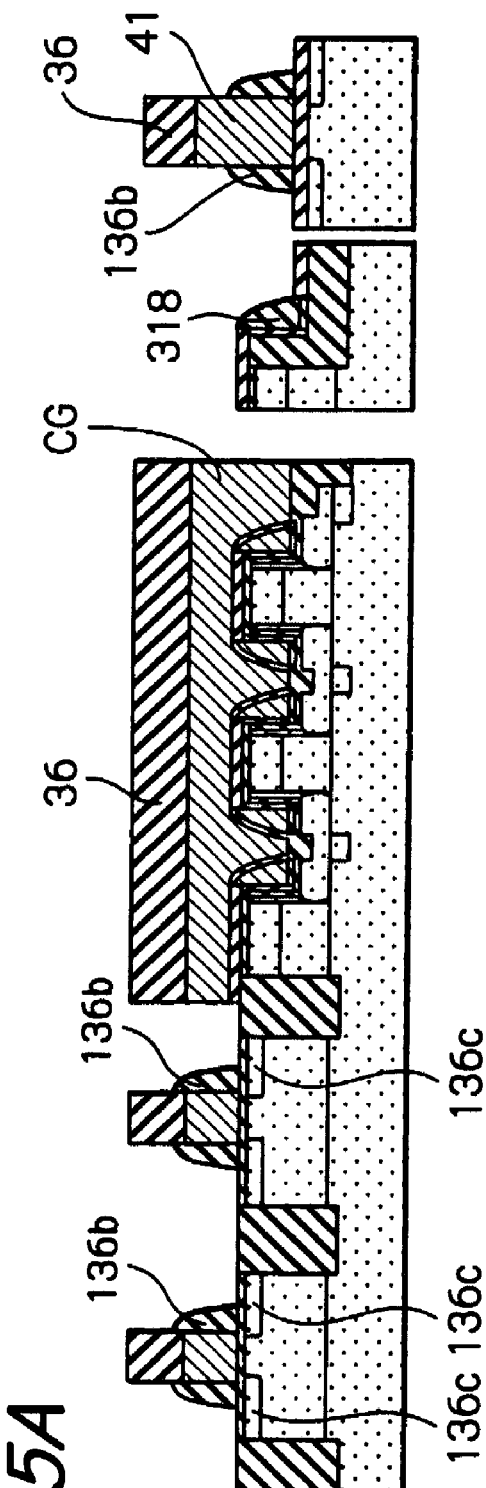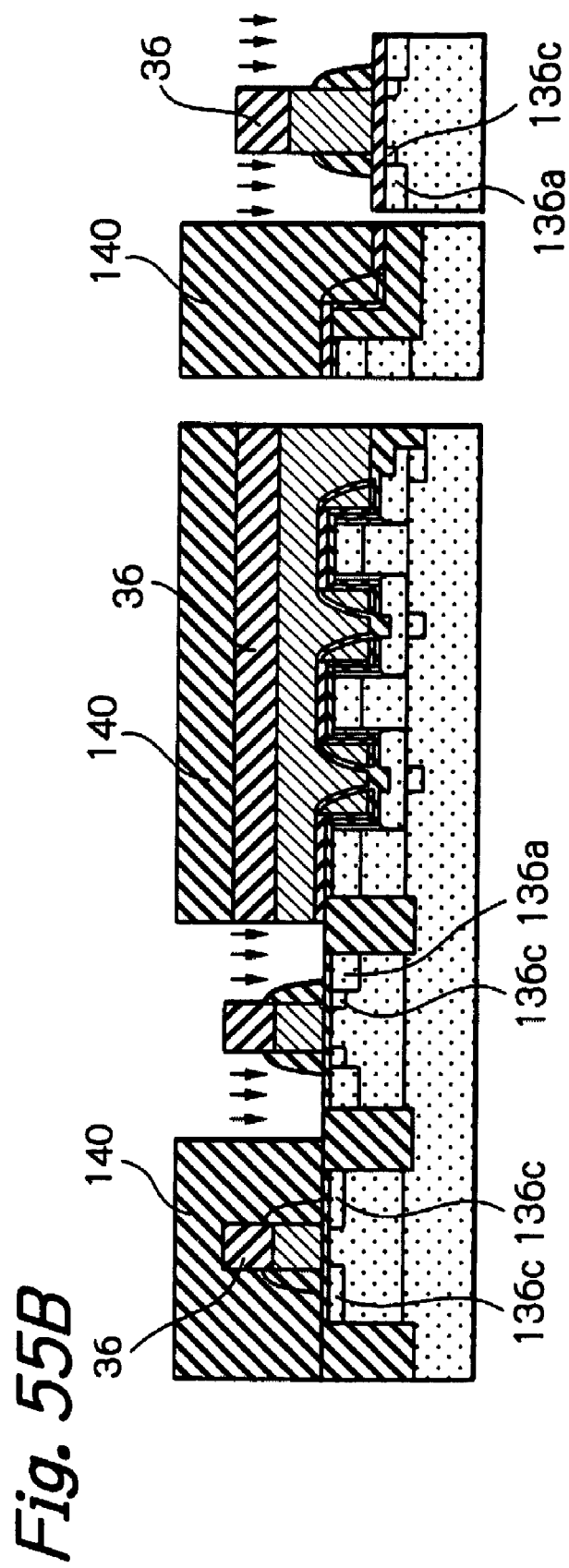
Fig. 55A
Fig. 55B

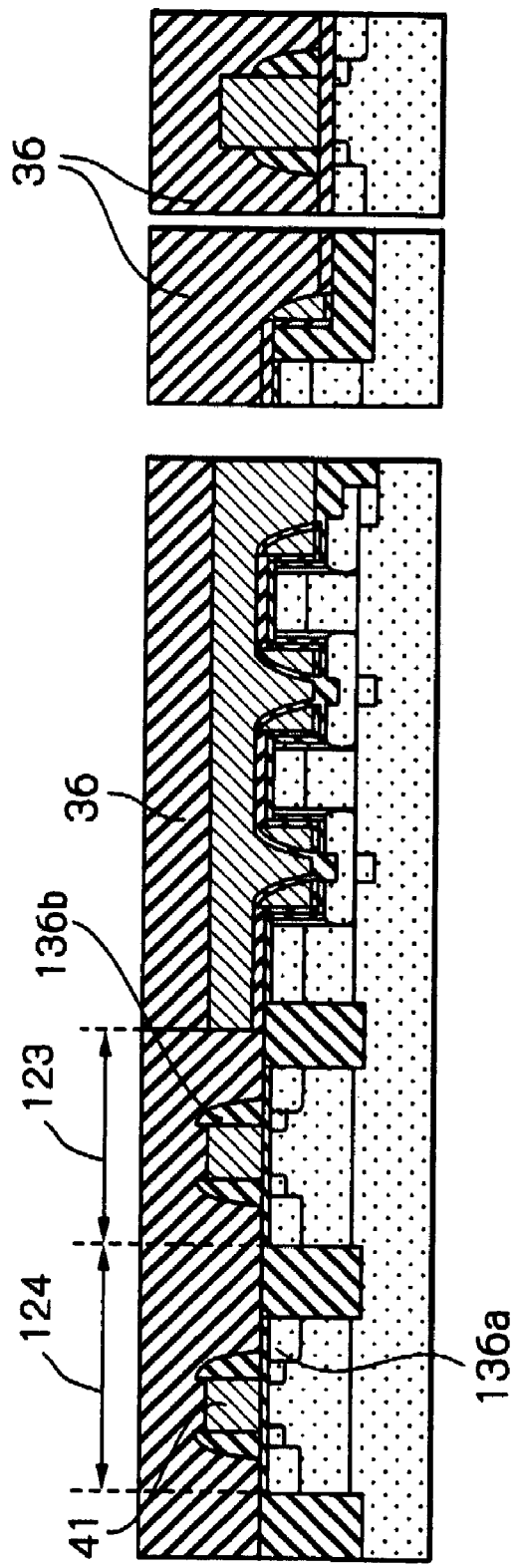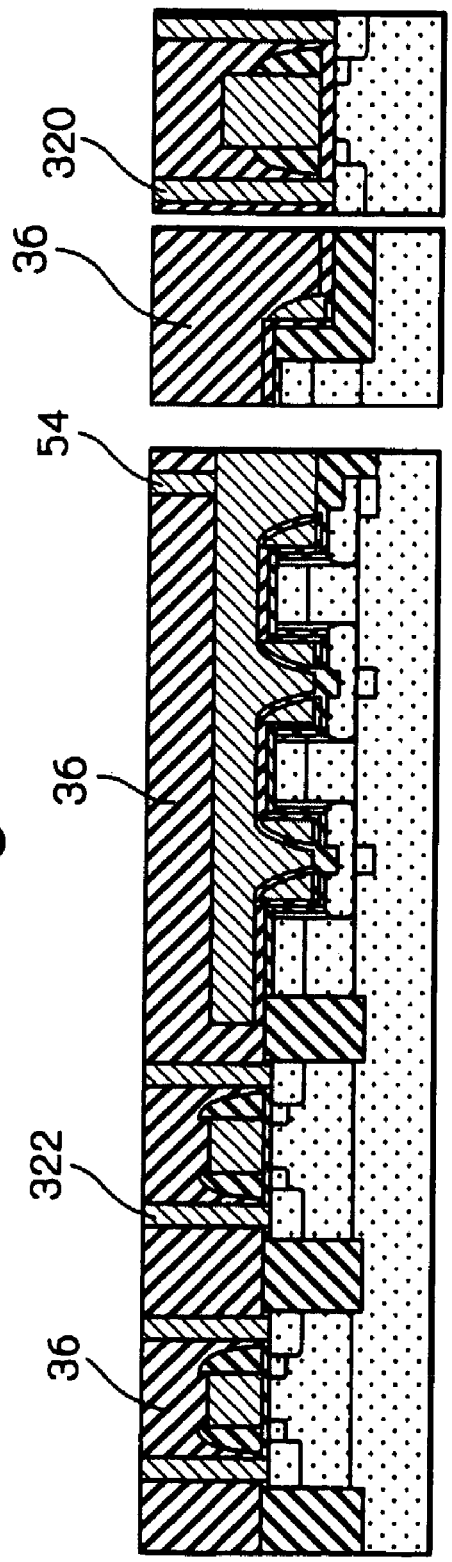

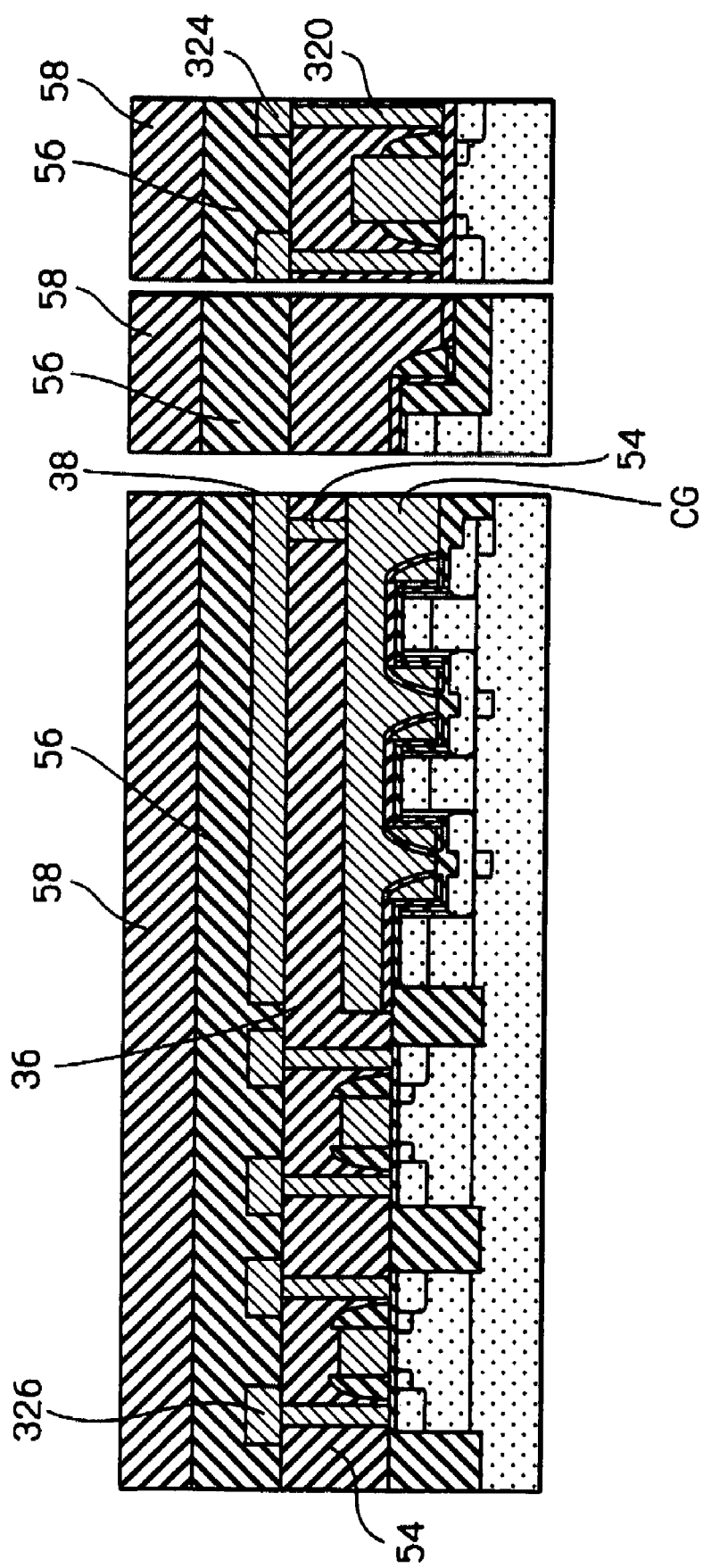

Fig. 60

|  | CG | | BL1, BL2 (DRAIN) | | BL1, BL2 (SOURCE) | |
| --- | --- | --- | --- | --- | --- | --- |
|  | SELECTED | UN-SELECTED | SELECTED | UN-SELECTED | SELECTED | UN-SELECTED |
| WRITE | 2.5V | 0V | 5V | OPEN | 0V | OPEN |
| READ | 2.5V | 0V | 1.2V | OPEN | 0V | OPEN |
| DELETE | -8.5V | OPEN | 8.5V | OPEN | 8.5V | OPEN |

Fig. 61

|  | CG | | BL1, BL2 (DRAIN) | | BL1, BL2 (SOURCE) | |
| --- | --- | --- | --- | --- | --- | --- |
|  | SELECTED | UN-SELECTED | SELECTED | UN-SELECTED | SELECTED | UN-SELECTED |
| WRITE | 2.5V | 0V | 5V | OPEN | 0V | OPEN |
| READ | 2.5V | 0V | 1.2V | OPEN | 0V | OPEN |
| DELETE | 6.5V | OPEN | -6.5V | OPEN | -6.5V | OPEN |

SEMICONDUCTOR DEVICE AND SEMICONDUCTOR MEMORY USING THE SAME

This application is a Divisional of application Ser. No. 10/397,377, filed on Mar. 27, 2003, now U.S. Pat. No. 6,984,863 the entire contents of which are hereby incorporated by reference and for which priority is claimed under 35 U.S.C. § 120.

BACKGROUND OF THE INVENTION

1. Field of the Invention

The present invention relates to a semiconductor device and a semiconductor memory and more particularly to a technology useful to connect the source/drain regions of two transistors to each other.

2. Description of the Background Art

Today, nonvolatile memories including EEPROMs (Electrically Erasable Programmable Read-Only Memories) are widely applied to, e.g., mobile telephones. An EEPROM, for example, allows only one bit of information to be stored in each storage cell transistor on the basis of whether or not a charge is present in its floating gate. However, to promote size reduction of the device, there should preferably be implemented the multiple-bit configuration of a cell transistor that allows two or more bits of information to be stored in the cell transistor.

While a multiple-bit transistor has been proposed in various forms in the past, I have paid attention to a multiple-bit transistor of the type including a silicon substrate formed with a plurality of grooves and floating gates formed on the side walls of the grooves. For details of this type of multiple-bit transistor, reference may be made to, e.g., Japanese patent Nos. 3249811 and 3249812.

In the multiple-bit transistor mentioned above, source/drain regions are formed on the bottoms of the grooves while a channel region is formed on the surface of the silicon substrate. The source/drain regions and channel region are therefore positioned at different levels from each other. This configuration is entirely different from the configuration of a typical MOS (Metal Oxide Semiconductor) transistor having both of source/drain regions and a channel region positioned on the surface of a substrate.

Generally, a semiconductor memory includes not only cell transistors but also select transistors for selecting the transistors or banks. The select transistors are usually implemented as MOS transistors. The source/drain regions of the cell transistors and those of the select transistors are connected together, so that any one of the select transistors selects the cell transistors or the bank connected thereto when turned on. However, the source/drain regions of the select transistors are formed on the surface of a substrate while the source/drain regions of the cell transistors are formed on the bottoms of grooves, as stated above. More specifically, the source/drain regions of such two different kinds of transistors differ in level from each other, i.e., do not lie in the same plane. Technically, therefore, connecting the source/drain regions of the two kinds of transistors to each other is difficult and has not been implemented yet.

SUMMARY OF THE INVENTION

It is an object of the present invention to provide a semiconductor device and a semiconductor memory allowing the source/drain regions of a transistor, which are different in level from the channel region of the same transistor, to be easily connected to the source/drain regions of other transistors.

In accordance with the present invention, a semiconductor device includes a first and a second transistor. The first transistor is formed with source/drain regions at a lower level than part of its channel region. The second transistor is formed with a channel region and source/drain regions at substantially the same level as the source/drain regions of the first transistor. One of the source/drain regions of the first transistor and one of the source/drain regions of the second transistor are electrically interconnected to each other in substantially the same plane.

Also, in accordance with the present invention, a semiconductor memory includes a semiconductor substrate of one conductivity type formed with a plurality of projections. A bit line of counter conductivity type is formed on the primary surface of the semiconductor substrate between nearby projections. Cell transistors are arranged in a plurality of arrays in each of the direction of row and direction of column, and each of the cell transistors uses the bit line as either one of a source region and a drain region. The channel region is formed at least on the top of one projection. A select transistor is formed with a channel region and source/drain regions at substantially the same level as the bit line for selecting the bit lines. One of the source/drain regions of the select transistor and bit line are electrically interconnected to each other in substantially the same plane.

BRIEF DESCRIPTION OF THE DRAWINGS

The objects and features of the present invention will become more apparent from consideration of the following detailed description taken in conjunction with the accompanying drawings in which:

FIG. 2 shows an equivalent circuit representative of the cell transistor of FIG. 1;

FIG. 3 is a section demonstrating a write mode for writing data in the cell transistor of the illustrative embodiment;

FIGS. 4A through 4D are sections showing four different states achievable with the cell transistor of the illustrative embodiment;

FIGS. 38A through 57 are sections demonstrating a series of steps of manufacturing the semiconductor memory of the alternative embodiment;

FIG. 60 shows a table listing specific voltages assigned to the source/drain regions BL1 and BL2 and control gate CG in each of a write mode, a read mode and a delete mode in the embodiment of FIG. 58; and FIG. 61 shows a table listing specific voltages assigned to the source/drain regions BL1 and BL2 and control gate in each of the write mode, read mode and delete mode in the embodiment of FIG. 59.

DESCRIPTION OF THE PREFERRED EMBODIMENTS

Figure 1:
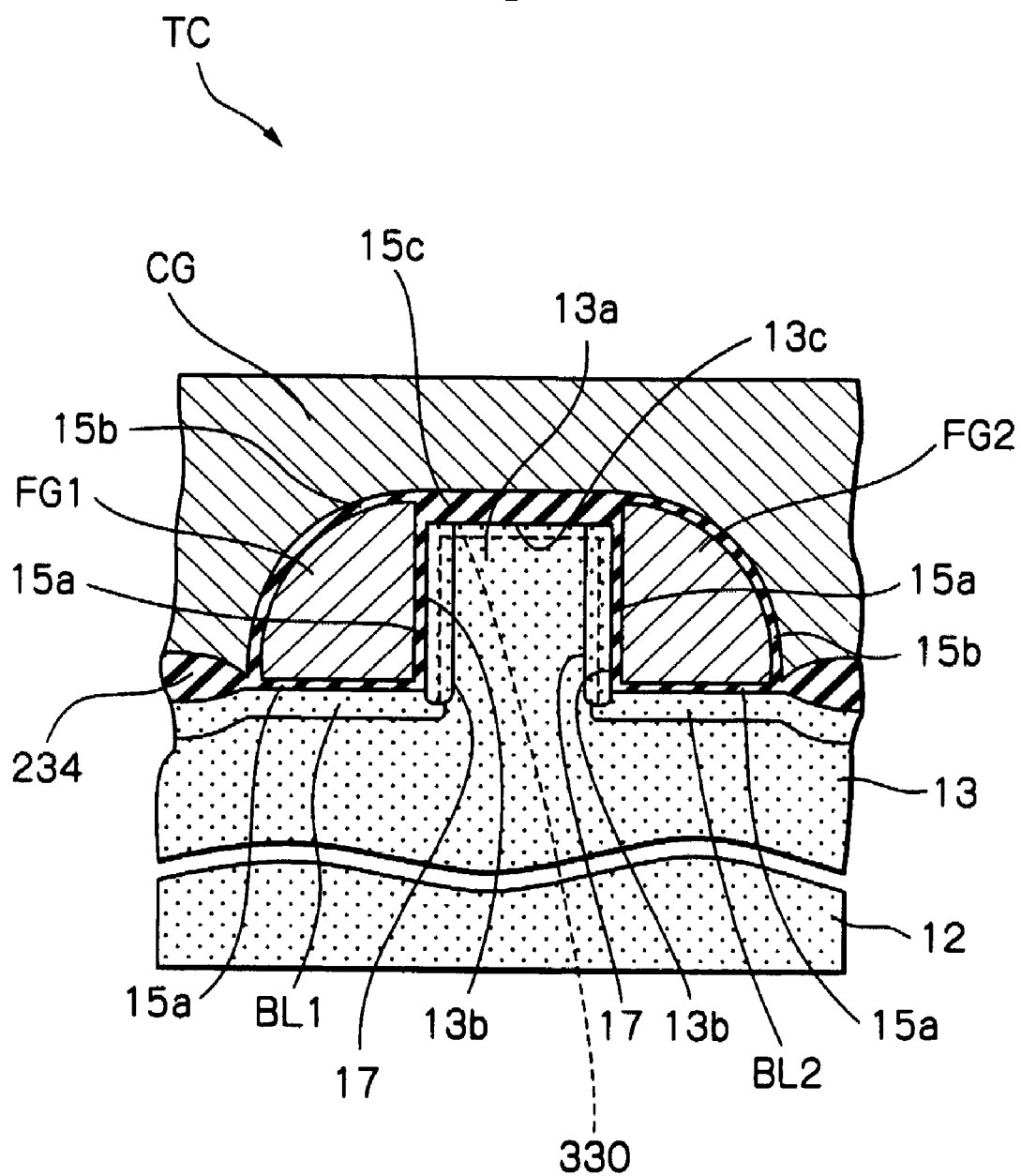
FIG. 1 is a fragmentary section showing a cell transistor embodying the present invention.

Referring to FIG. 1 of the drawings, a cell transistor included in a semiconductor memory embodying the present invention is shown. As shown, the cell transistor, labeled TC, is formed on a P type silicon substrate 12, which is a semiconductor substrate of one conductivity type. A P type well 13 is formed in the P type silicon substrate 12. A plurality of projections 13a (only one is shown) protrude from the primary surface of the P type silicon substrate 12.

Bit lines BL1 and BL2 are formed on the surface of the P type well 13 at both sides of the projection 13a. More specifically, ions of an N type impurity, opposite in conductivity type to the P type well 13, are implanted in the surface of the P type well 13 at positions expected to form the bit lines BL1 and BL2. The bit lines BL1 and BL2 are arranged side by side in the direction of row of a memory cell array while extending in the direction of column each.

A gate insulation layer or first insulation layer 15c is formed on the top surface 13c of the projection 13a. The projection 13a has a pair of side walls 13b opposite to each other on which formed are counter-conductivity type, N type, regions 17 opposite in conductivity type to the projection 13a. The impurity concentration of the N type regions 17 is selected to fall between 1/100 and 1/10,000, preferably 1/1,000, as high as that of the bit lines BL1 and BL2.

Tunnel insulation layers or second insulation layers 15a respectively cover one of the side walls 13b and bit line BL1 and the other side wall 13b and bit line BL2. The bit lines BL1 and BL2 bifunction as source/drain regions, as will be described specifically later. In this sense, the bit lines BL1 and BL2 will be sometimes referred to as source/drain regions.

Floating gates FG1 and FG2 respectively face the source/drain regions BL1 and BL2 and the opposite side walls 13b of the projection 13a via the tunnel insulation layers 15a adjoining them. Inter-polycrystalline insulation layers or third insulation layers 15b each are formed on one of the floating gates FG1 and FG2. In the illustrative embodiment, the tunnel insulation layers 15a, inter-polycrystalline insulation layers 15b and gate insulation layer 15c all are formed of silicon oxide.

A control gate CG faces the floating gates FG1 and FG2 via the inter-polycrystalline insulation layers 15b and faces the top surface 13c of the projection 13a via the gate insulation layer 15c. Alternatively, the control gate CG may comprise segments facing the floating gates FG1 and FG2 with the inter-polycrystalline insulation layers 15b intervening in between and a segment facing the top surface 13c with the gate insulation layer 15c intervening in between. In such an alternative case, the above segments will be electrically separate from and electrically controlled independently of each other.

The floating gates FG1 and FG2 and control gate C all are formed of polycrystalline silicon. In practice, a plurality of control gates CG are arranged in the direction of column while extending in the direction of row each, as will be described specifically later. The control gates CG respectively play the role of word lines WL0, WL1 and so forth.

In the illustrative embodiment, a channel region 330 is formed on the surface layers of the opposite side walls 13b and top 13c of the projection 13a in a tridimensional configuration. It follows that the channel region 330 and the source/drain regions BL1 and BL2 are different in level or height from each other, i.e., part of the latter is positioned below the former. This configuration is entirely different from the configuration of a typical MOS transistor having both of source/drain regions and a channel region formed on the surface of a substrate, as stated earlier.

FIG. 2 shows an equivalent circuit representative of the cell transistor TC and including various capacitance associated therewith. The capacitance is represented by a capacitor $C_{CG}$ between the control gate CG and the top 13c of the projection 13c, a capacitor $C_{CF1}$ ($C_{CF2}$) between the control gate CG and the floating gate FG1 (FG2) facing each other, a capacitor $C_{FG1}$ ($C_{FG2}$) between the floating ate FG1 (FG2) and the side 13b of the projection 13a facing each other, and a capacitor $C_{FS}$ ($C_{FD}$) between the floating gate FG1 (FG2) and the source/drain region BL1 (BL2) facing each other.

A method of driving the cell transistor TC will be described hereinafter. First, reference will be made to FIG. 3 for describing how two-bit data is written to the cell transistor TC. In the illustrative embodiment, electrons can be selectively injected into either one of the floating gates FG1 and FG2, which are positioned at opposite sides of the projection 13a. As shown in FIG. 3, to inject electrons into the right floating gate FG2 in the figure by way of example, a gate voltage $V_G$ of, e.g., 2.2 V is applied to the control gate CG while a voltage $V_{DD}$ of, e.g., 6 V is applied to the source/drain region BL2 into which electrons should be injected. At the same time, the substrate 12 and the other source/drain region BL1 are grounded. As a result, a potential difference for write-in, i.e., 6 V is applied between the source/drain regions BL1 and BL2.

In the condition shown in FIG. 3, the positive potential applied to the control gate CG causes an inversion layer 13d to be formed in the surface of the top 13c of the projection 13c. The inversion layer 13d thus appearing causes the N type regions 17 to be electrically interconnected to each other. Because the N type regions 17 each are contiguous with one of the N type source/drain regions BL1 and BL2, the N type source/drain regions BL1 and BL2 themselves are electrically interconnected. Consequently, a carrier, electrons in the illustrative embodiment, flow through a path indicated by arrows 50 and 52.

Paying attention to electrons flowing along the top 13c, among others, the floating gate FG2 is positioned just at the right-hand side in the direction of the flow in the figure. These electrons can therefore be injected straightforward into the floating gate FG2 without being steered as in the conventional structure. This allows the gate voltage (write voltage) $V_G$ for attracting the electrons toward the floating gate FG2 to be made lower than the conventional gate voltage.

Further, the N type regions 17 formed on the side walls 13b of the projection 13a serve to lower the resistance of the side walls 13b for thereby obstructing voltage drop across the side walls 13b. Consequently, a higher voltage slightly lower than a voltage of, e.g., 6 V between the source/drain regions BL1 and BL2 is applied to the opposite ends of the top 13c, causing the top 13c to forcibly accelerate the electrons. As a result, the electrons are efficiently injected into the floating gate FG2, as indicated by the arrow 52 in FIG. 3. In this manner, the N type regions 17 also serve to lower the write voltage $V_G$.

While electrons are injected only into the right floating gate FG2 in FIG. 3, electrons can be injected into the left floating gate FG1 only if the voltages applied to the source/drain regions BL1 and BL2 are replaced with each other. The illustrative embodiment therefore implements four different states shown in FIGS. 4A through 4D. FIG. 4A shows a stored-bit state (1, 1) in which electrons are not injected into either one of the floating gates FG1 and FG2. FIGS. 4B and 4C respectively show storage stages (1, 0) and (0, 1) in each of which electrons are injected into either one of the floating gates FG1 and FG2. FIG. 4D shows a state (0, 0) in which electrons are injected into both of the floating gates FG1 and FG2; for example, electrons may be injected into the right floating gate FG2 and then injected into the left floating ate FG2. In this manner, the illustrative embodiment allows two bits of data (1, 1) through (0, 0) to be selectively written to a single cell transistor TC.

The illustrative embodiment includes two floating gates FG1 and FG2 and allows electrons to exist in the gates FG1 and FG2 separately from each other, as stated above. Therefore, even in an application in which the cell size is reduced, it is definitely distinguishable which of the floating gate FG1 and FG2 includes significant electrons, compared to the prior art structure.

Figure 5A:
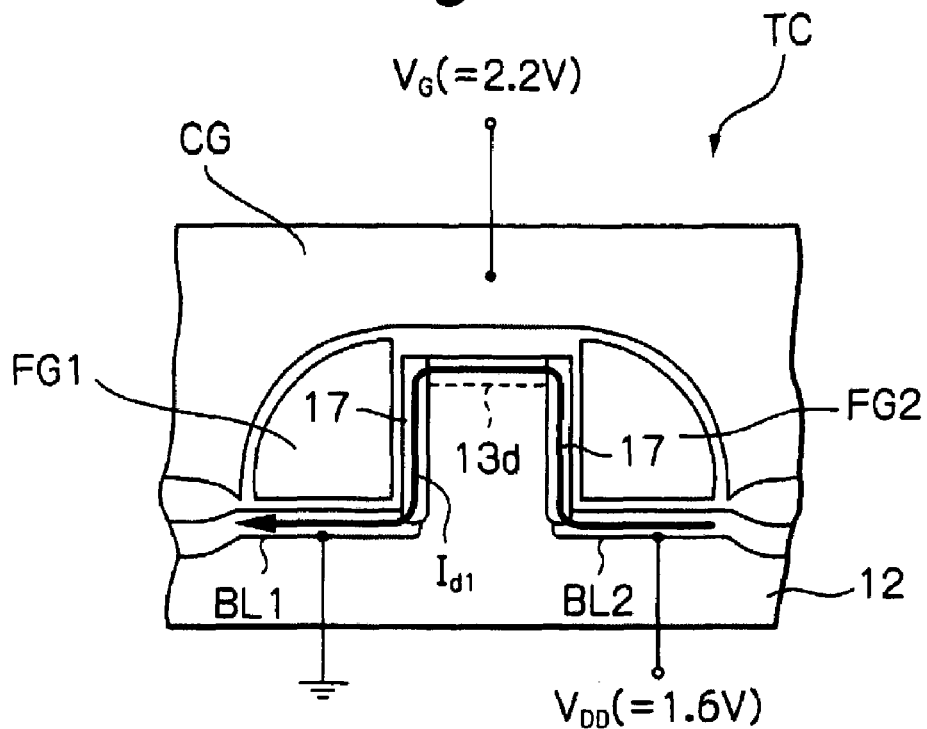
FIGS. 5A and 5B show sections showing a read mode for reading out data from the cell transistor of the illustrative embodiment.
Figure 5B:
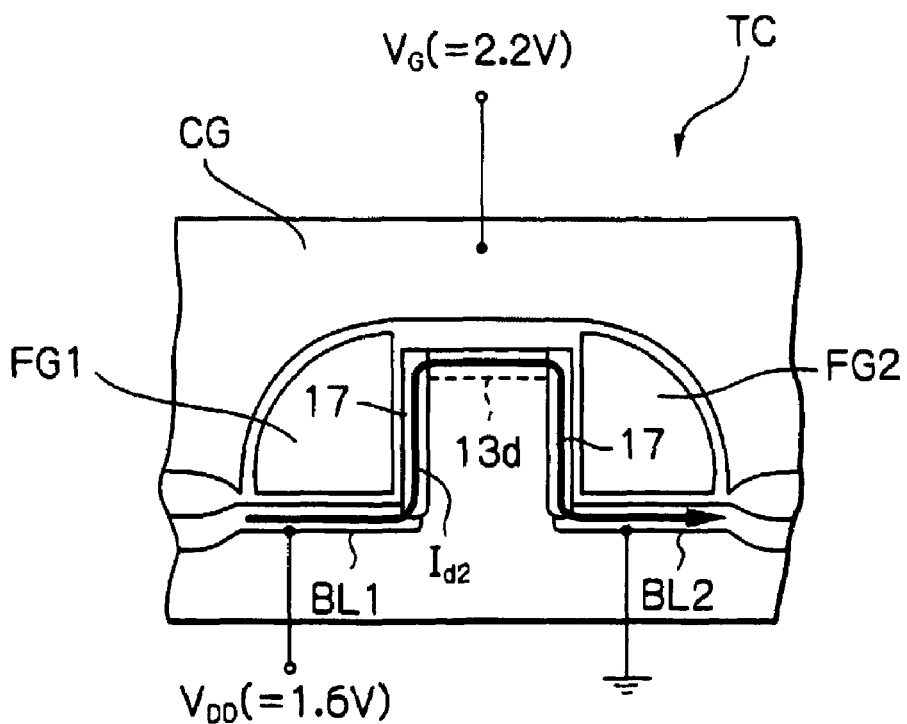

Reference will be made to FIGS. 5A and 5B for describing how two-bit data are read out from the cell transistor TC. First, as shown in FIG. 5A, the gate voltage $V_G$ of, e.g., 2.2 V is applied to the control gate CG Subsequently, the voltage $V_{DD}$ of, e.g., 1.6 V is applied to one source/drain region BL2 while the other source/drain region BL1 and substrate 12 are connected to ground. Consequently, a potential difference for read-out, i.e., 1.6 V is applied between the source/drain regions BL1 and BL2. In the resulting potential distribution, the potential of the control gate CG is positive with the result that the inversion layer 13d is formed on the top 13c of the projection 13a. As a result, a drain current $I_{d1}$ flows in a direction indicated by an arrow in FIG. 5A.

Subsequently, as shown in FIG. 5B, the voltages applied to the source/drain regions BL1 and BL2 are replaced with each other with the gate voltage $V_G$ of 2.2 V being maintained the same. As a result, the potential difference between the source/drain regions BL1 and BL2 is inverted, causing a second drain current $I_{d2}$ to flow in a direction indicated by an arrow in FIG. 5B.

In the illustrative embodiment, the drain currents $I_{d1}$ and $I_{d2}$ are measured which flow one after the other due to the replacement of the voltages applied to the source/drain regions BL1 and BL2. The values of the drain currents $I_{d1}$ and $I_{d2}$ are different in accordance with the states, as will be described specifically later. It is therefore possible to compare the current sets ($I_{d1}$, $I_{d2}$) with the states one-to-one to determine in which of the states the cell is. Drain currents to flow at the different states (1, 1) through (0, 0) will be described in detail hereinafter.

Figure 6A:
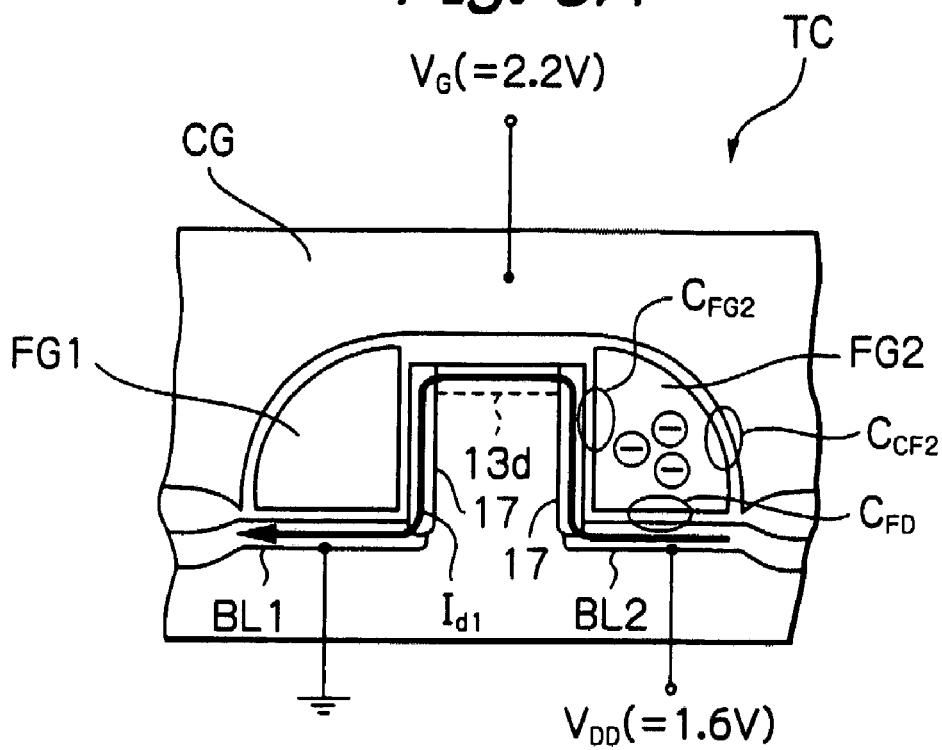
FIGS. 6A and 6B show sections useful for understanding how a state (1, 0) is sensed from the cell transistor of the illustrative embodiment.
Figure 6B:
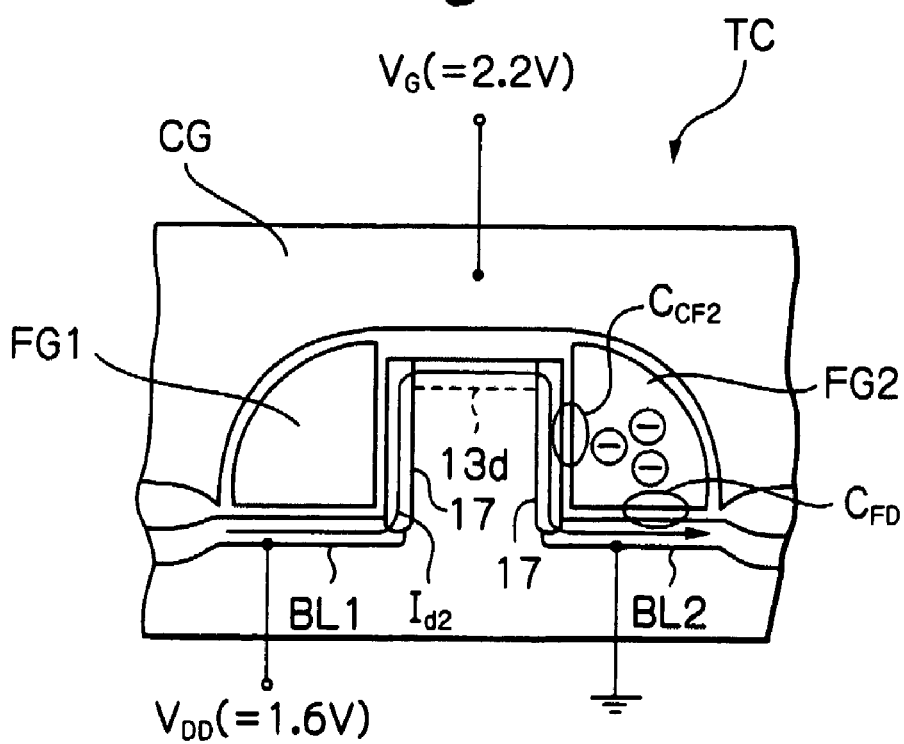

FIGS. 6A and 6B demonstrate how the state (1, 0) is sensed from the cell transistor TC. As shown in FIG. 6A, voltages are applied to the structural members of the cell transistor TC in the same manner as in FIG. 5A, causing the drain current $I_{d1}$ to flow. In this condition, although the potential of the right floating gate FG2 is lowered due to electron injection, it is raised by the capacities $C_{CF2}$ and $C_{FD}$ toward the positive potential of the control gate CG (2.2 V) and that of the source/drain BL2 (1.6 V). Consequently, the potential drop of the floating gate FG2 is limited, so that channel resistance around the gate FG2 is not so high. The drain current $I_{d1}$ therefore has a relatively great value.

Particularly, the N type region 17 contacting the source/drain region BL2 has a potential substantially equal to the potential of the source/drain region BL2. The potential of the floating gate FG2 is therefore raised toward the source/drain BL side by the capacitance $C_{FG2}$ as well, further lowering channel resistance around the gate FG2. As a result, the value of the drain current $I_{d1}$ further increases.

Subsequently, as shown in FIG. 6B, the voltages applied to the source/drain regions BL1 and BL2 are replaced with each other to cause the drain current $I_{d2}$ to flow. In this case, the potential of the right floating gate FG2 is lowered due to electron injection. Further, because the right source/drain region BL2 is connected to the ground, the potential of the floating gate FG2 is lowered toward the ground through the capacitance $F_D$ between the gate FG2 and the region BL2. Consequently, the potential of the floating gate FG2 is lower in FIG. 6B than in FIG. 6A and causes channel resistance around the gate FG2 to increase. The drain current $I_{d2}$ is therefore smaller than the previous drain current $I_{d1}$.

Particularly, the N type region 17 causes the potential of the right floating gate FG2 to be lowered toward the ground side by the capacitance $C_{FG2}$ as well, so that the value of the drain current $I_{d2}$ is further reduced. As stated above, the state (1, 0) can be identified on the basis of ($I_{d1}$, $I_{d2}$)=(large, small). To identify greater one of the drain currents $I_{d1}$ and $I_{d2}$, a sense amplifier, which will be described later, compares each of them with a reference current.

To sense the state (0, 1) from the cell transistor TC, electrons are injected into the left floating gate FG1 opposite to the right floating gate FG2. Therefore, the drain currents $I_{d1}$ and $I_{d2}$ are estimated in the same manner as in the above description, so that there holds ($I_{d1}$, $I_{d2}$)=(small, large).

As for the state (1, 1) to be sensed from the cell transistor TC, electrons are not injected into either one of the floating gates FG1 and FG2. In this case, the drain currents $I_{d1}$ and $I_{d2}$ are great because the potential of the floating gate FG1 or that of the floating gate FG2 is not lowered by the electrons. This condition is symmetrical in the right-and-left direction, i.e., the drain currents $I_{d1}$ and $I_{d2}$ are not different from each other; ($I_{d1}$, $I_{d2}$)=(large, large). Further, as for the state (0, 0), symmetry is set up in the right-and-left direction because electrons are injected into both of the floating gates FG1 and FG2. Therefore, ($I_{d1}$, $I_{d2}$)=(small, small) holds, meaning that the drain currents $I_{d1}$ and $I_{d2}$ are not different from each other.

Figure 7:
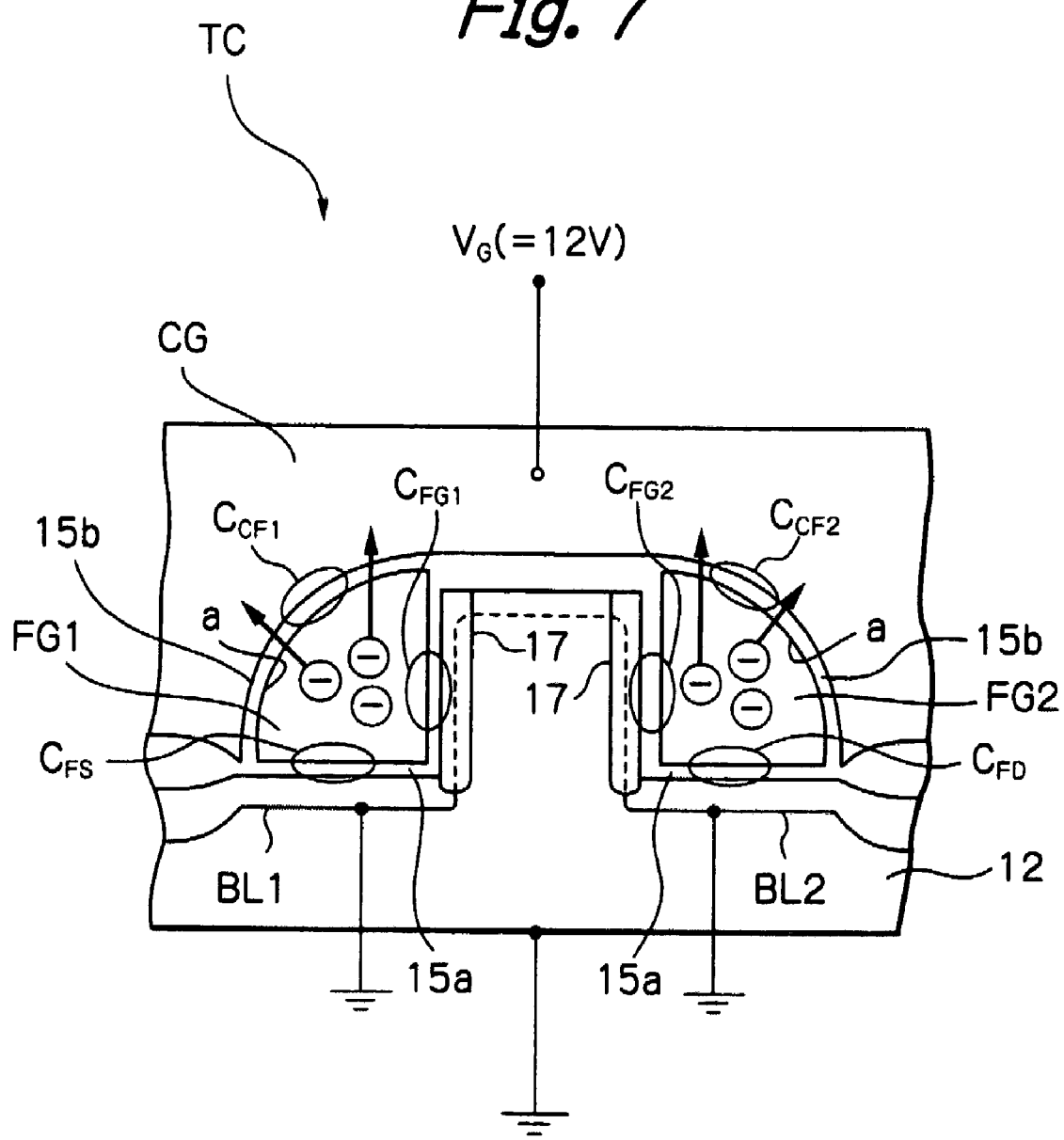
FIG. 7 is a section useful for understanding a specific method of discharging electrons implanted in floating gates that form part of the cell transistor.

A specific method of discharging the electrons, i.e., deleting the data stored, injected into the floating gates FG1 and FG2 available with the illustrative embodiment will be described hereinafter. As shown in FIG. 7, to withdraw electrons, a high potential $V_G$ of, e.g., 12 V is applied to the control gate CG while the substrate 12 and source/drain regions BL1 and BL2 are grounded. In this regard, the potential difference may be set up relatively between the control gate CG and the source/drain regions BL1 and BL2. For example, the control gate CG and the source/drain regions BL1 and BL2 may be supplied with voltages of 6 V and −6 V, respectively.

In the resulting potential distribution, the control gate CG is higher in potential, as seen from the floating gate FG1 (FG2), so that electrons are withdrawn to the control gate CG via the inter-polycrystalline insulation layer 15b. It is, of course, possible to withdraw electrons to the substrate 12 by making the substrate 12 higher in potential than the control gate CG.

The writing, reading and deleting operations of the illustrative embodiment have been shown and described on the assumption that the cell transistor TC is selected in the memory cell array. In practice, however, the cell transistor TC is sometimes not selected. Even when the cell transistor TC is not selected, the drive voltage $V_{DD}$ is applied to the bit line BL1 in order to select another cell transistor TC. In this case, the potential of the floating gate FG1 of the unselected cell transistor TC is pulled toward the potential of the bit line BL1 due to a great capacitance $C_{FS}$ between the gate FG1 and the bit line BL1. As a result, the potential difference between the floating gate FG1 and the source/drain region BL1 decreases, so that the tunnel insulation layer 15a between the gate FG1 and the region BL1 is prevented from being exposed to the strong electric field. Consequently, a tunnel current that would deteriorate the tunnel insulation layer 15a is successfully prevented from flowing through the layer 15a.

It is noteworthy that the capacitance $C_{FS}$ ($C_{FD}$) between the floating gate FG1 (FG2) and the source/drain region BL1 (BL2) plays an important role in achieving the advantages described in relation to write-in, read-out and deletion as well as the unselected condition. In the illustrative embodiment, the floating gate FG1 (FG2) is positioned above the source/drain region BL1 (BL2) in order to reduce the distance between the floating gates FGS1 and FG2, thereby reducing the device size and increasing the capacities $C_{FD}$ and $C_{FS}$. The area over which the floating gate FG1 (FG2) and source/drain region BL1 (BL2) face each other is open to choice. While the advantages described above are easier to achieve as the above area becomes larger, they are achievable even if the area is small.

Figure 8:
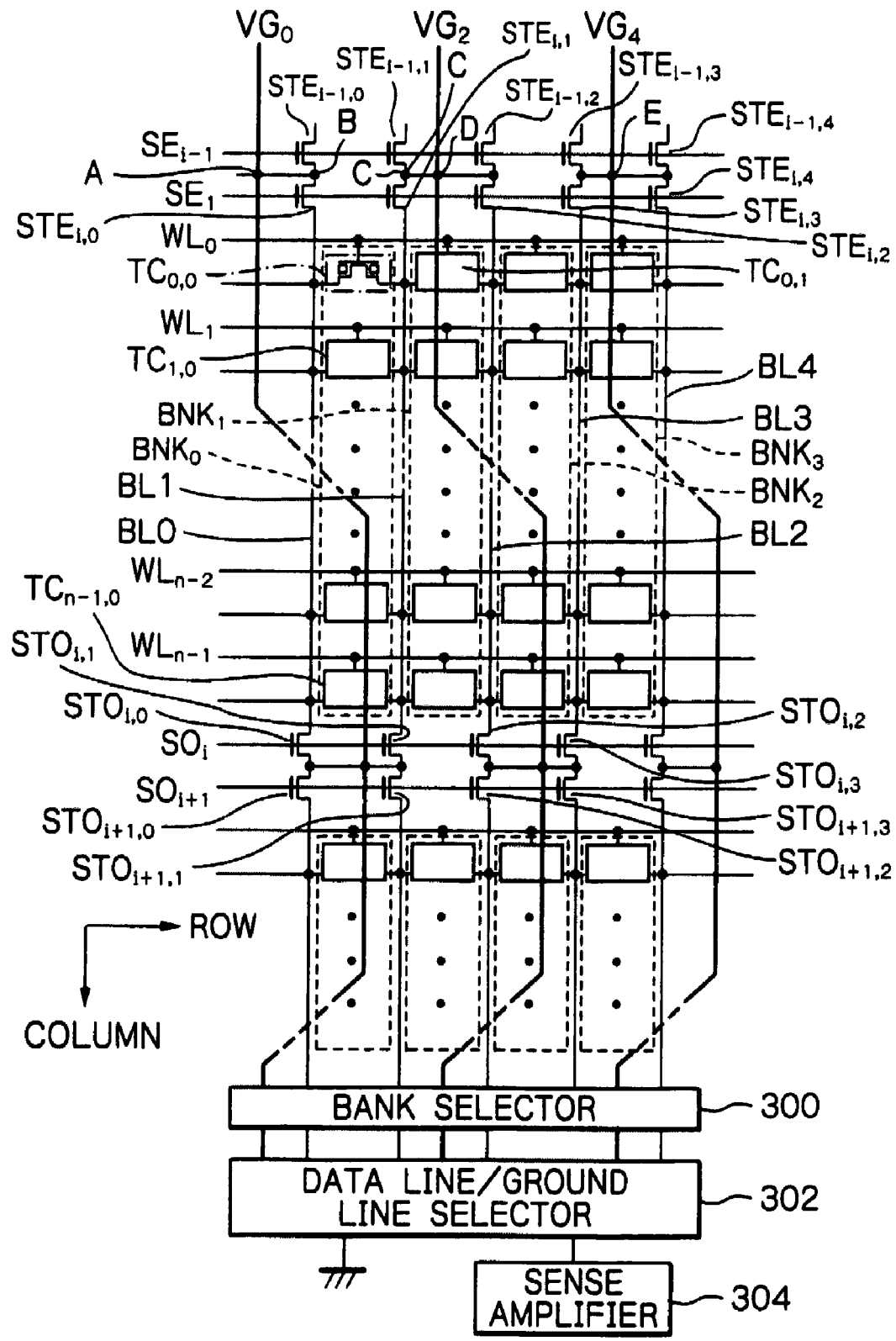
FIG. 8 is a block diagram schematically showing the general configuration of a semiconductor memory of the illustrative embodiment.

Reference will be made to FIG. 8 for describing the general circuit arrangement of a semiconductor memory in accordance with the illustrative embodiment. In FIG. 8, a cell transistor $TC_{i,j}$ is a cell transistor positioned on the i-th row and j-th column and configured and operated in the previously stated manner. The cell transistors $TC_{i,j}$ each belong to a particular (1 column)×(n rows) bank $BNK_j$ (j=0, 1, 2, . . . ); n of (n rows) denotes a natural number open to choice while j of $BNK_j$ denotes a column number shared by all of the cell transistors $T_{i,j}$ belonging to the bank $BNK_j$.

Select transistors $STE_{i,j}$ and $STO_{i,j}$ each are connected to a particular bank $BNK_j$ (j=0, 1, 2, . . . ) for selecting the bank $BNK_j$. More specifically, the select transistors $STE_{i,j}$ are used to select even banks $BNK_j$ (j=0, 2, 4, . . . ) and will sometimes be referred to as even-bank select transistors hereinafter. The other select transistors $STO_{i,j}$ are used to select odd banks $BNK_j$ (j=1, 3, 5, . . . ) and will sometimes be referred to as odd-bank select transistors hereinafter.

The even-bank select transistors $STE_{i,m}$ on every other column have one of their source/drain regions interconnected, as illustrated. Virtual ground lines $VG_i$ (i=0, 2, 4, . . . ) each are connected to one of nodes A, D and E where the above source/drain regions are interconnected. This is also true with the odd-band select transistors $STO_{i,j}$ except that nodes where their source/drain regions are interconnected are shifted from the nodes of the even-bank select transistors $STE_{i,j}$ by one column each, as illustrated.

Labeled $STE_{i-1,j}$ (j=0, 1, 2, 3 . . . ) are even-bank select transistors each for selecting, among the (i−1)-th banks as counted in the direction of column, an even bank. Also, labeled $STO_{i+1,j}$ (j=0, 1, 2, 3, . . . ) are odd-bank select transistors each for selecting, among the (i+1)-th banks as counted in the direction of column, an odd bank.

The virtual ground lines $VG_i$ (i=0, 2, 4, . . . ) are formed of aluminum or similar metal so as to have their electric resistance lowered. On the other hand, bit lines $BL_i$ (i=0, 1, 2, . . . ) are implemented as diffusion layers far higher in electric resistance than the virtual ground lines $VG_i$.

The operation of the semiconductor memory shown in FIG. 8 will be described hereinafter. The semiconductor memory does not select a cell transistor by combining a word line and a bit line, but first selects either one of a group of even banks $BNK_j$ (j=0, 2, 4, . . . ) and a group of odd banks $BNK_j$ (j=1, 3, 5, . . . ) and then selects one of the cell transistors $TC_{i,j}$ belonging to the even or odd bank $BNK_j$ selected.

For example, assume that the cell transistor $TC_{0,0}$ belonging to the even bank $BNK_0$ should be selected. Then, an even-bank select line $SE_i$ is caused to go high for selecting a group of even banks $BNK_j$ (j=0, 1, 2 . . . ), thereby turning on the even-bank select transistors $STE_{i,j}$ (j=0, 2, 4 . . . ). At the same time, the other select lines $SE_{i-1}$, $SO_i$ and $SO_{i+1}$ are caused to go low for thereby turning off all of the transistors whose gates are connected to such select lines. In the resulting voltage distribution, the even-bank select transistors $STE_{i,0}$ and $STE_{i,1}$ in an ON state select the bit lines BL0 and BL1, respectively, and electrically connect them to the virtual ground lines $VG_0$ and $VG_2$, respectively. Likewise, the bit lines connected to the other even banks $BNK_2$ and $BNK_4$ are brought into electrical connection with the virtual ground lines. In this manner, a group of even banks $BNK_j$ (j=0, 2, 4, . . . ) are selected.

Subsequently, to select the cell transistor $TC_{0,0}$ in the read mode, the bit line BL0 connected to the cell transistor $TC_{0,0}$ is brought to the ground level while 1.6 V is applied to the bit line BL1 as the voltage $V_{DD}$. Thereafter, 2.2 V is applied to the word line $WL_0$ as the read voltage VG. It is to be noted that such voltages are output from a data line/ground line selector 302 via a bank selector 300.

The voltages stated above cause a first drain current $I_{d1}$ to flow through the cell transistor $TC_{00}$, as described previously with reference to FIG. 5A. The first drain current $I_{d1}$ sequentially flows from a sense amplifier 304 via data line/ground line selector 302, bank selector 300, virtual ground line $VG_2$, node D, node C, even-bank select transistor $STE_{i,1}$, bit line BL1, cell transistor $TC_{0,0}$, bit line BL0, even-bank select transistor $STE_{i,0}$, node B, node A, virtual ground line $VG_0$, bank selector 300 and data line/ground line selector 302 in this order. At this instant, the bank selector 300 does not select the transistors of the even banks ($BNK_2$, $BNK_4$, . . . ) other than the target even bank $BNK_0$, preventing the drain current from flowing through the cell transistors of the unnecessary even banks.

Thereafter, the potential difference between the bit lines BL0 and BL1 is replaced with each other while the other voltages are maintained the same. As a result, a second drain current $I_{d2}$ flows through the cell transistor $TC_{0,0}$, as stated with reference to FIG. 5B. The second drain current $I_{d2}$ flows through a route opposite to the route of the first drain current $I_{d1}$.

The procedure described above allows the sense amplifier 304 to measure the first and second drain currents $I_{d1}$ and $I_{d2}$ flown through the cell transistor $TC_{0,0}$ and thereby determine which of the four states "(1, 1)" through "(0, 0)" is stored in the cell transistor $TC_{0,0}$.

In the circuitry shown in FIG. 8, the first drain current $I_{d1}$ does not constantly flow through the high-resistance bit lines BL0 and BL1 implemented as diffusion layers, but flows through the virtual ground line $VG_2$, which is formed of aluminum and therefore low in resistance, up to the target bank $BNK_0$ and then flows through the bit line BL1. Subsequently, the drain current $I_{d1}$ flown through the cell transistor $TC_{0,0}$ flows through the virtual ground line $VG_0$ via the bit line BL0.

The resistance is therefore lower when the first drain current $I_{d1}$ flows through the above route than when it constantly flows through the bit lines BL0 and BL1. The illustrative embodiment can therefore sense the first drain current $I_{d1}$ as well as the second drain current $I_{d2}$ at high speed.

In the specific procedure described above, the cell transistor $TC_{0,0}$ belonging to the even bank $BNK_0$ is selected. On the other hand, to select the transistor $TC_{i,j}$ belonging to the odd bank group $BNK_j$ (j=1, 3, 5, ...), the odd-bank select line $SO_i$ is caused to go high for thereby turning on the odd-bank select transistors $STO_{i,j}$ (i=0, 1, 2, ...). The other select lines $SE_i$, $SE_{i-1}$ and $SO_{i+1}$ are caused to go low, so that the transistors whose gates are connected to those select lines all are turned off. The rest of the procedure is identical with the procedure described in relation to the selection of the even bank and will not be described specifically in order to avoid redundancy. The method of selecting a cell transistor described above is sometimes referred to as a virtual grounding system and is taught in Japanese patent laid-open publication No. 3-179775 specifically.

Figure 9:
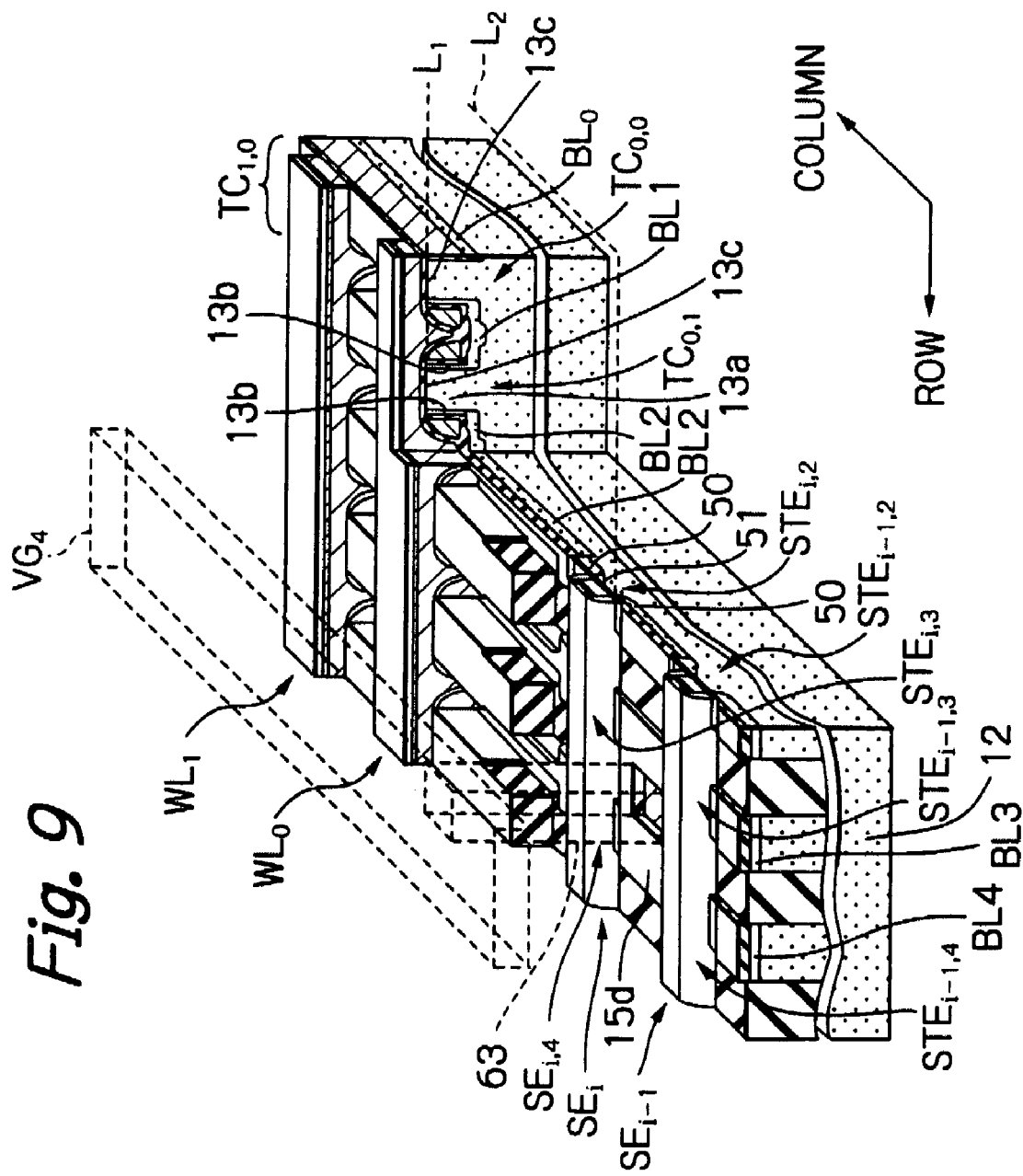
FIG. 9 is a partly sectioned, fragmentary perspective view showing the semiconductor memory of the illustrative embodiment.

FIG. 9 is a partly sectioned perspective view showing the semiconductor memory of the illustrative embodiment. In FIG. 9, structural elements identical with the structural elements described above are designated by identical reference numerals. As shown, a conductive plug 63 is buried in an interlayer insulation film not shown. The virtual ground line $VG_4$ is formed on the interlayer insulation film and electrically connected to the conductive plug 63. Corresponding to the node E, FIG. 8, the conductive plug 63 is electrically connected to the point where the source/drains of the even-bank select transistors $STE_{i,2}$ and $SET_{i,4}$ are interconnected. Word lines $WL_0$ and $WL_1$ each are implemented by the control gate CG, FIG. 1, extending in the direction of row.

The cell transistor $TC_{0,1}$ has its channel region formed by the opposite side walls 13b and top 13c of one projection 13a and has its source/drain region BL2 positioned below part of the channel region formed by the top 13c. On the other hand, the even-bank select transistor $STE_{i,2}$ is a conventional MOS transistor having source/drain regions 50 and a channel region 51 that lie in substantially the same plane.

As shown in FIG. 9, the even-bank select transistor $SET_{i,2}$ is not located at a conventional level $L_1$ where the surface of the silicon substrate 12 is positioned, but is located at a level $L_2$ lower than the level $L_1$. The level $L_2$ is substantially coincident with the level of the source/drain region BL2 of the cell transistor $TC_{0,1}$. It follows that the source/drain regions 50 and BL2 of the two transistors $STE_{i,2}$ and $TC_{0,1}$, respectively, lie in substantially the same plane and can therefore be electrically easily interconnected in the horizontal direction. This successfully overcomes the technical difficulty stated previously in relation to the interconnection of source/drain regions.

Figure 10:
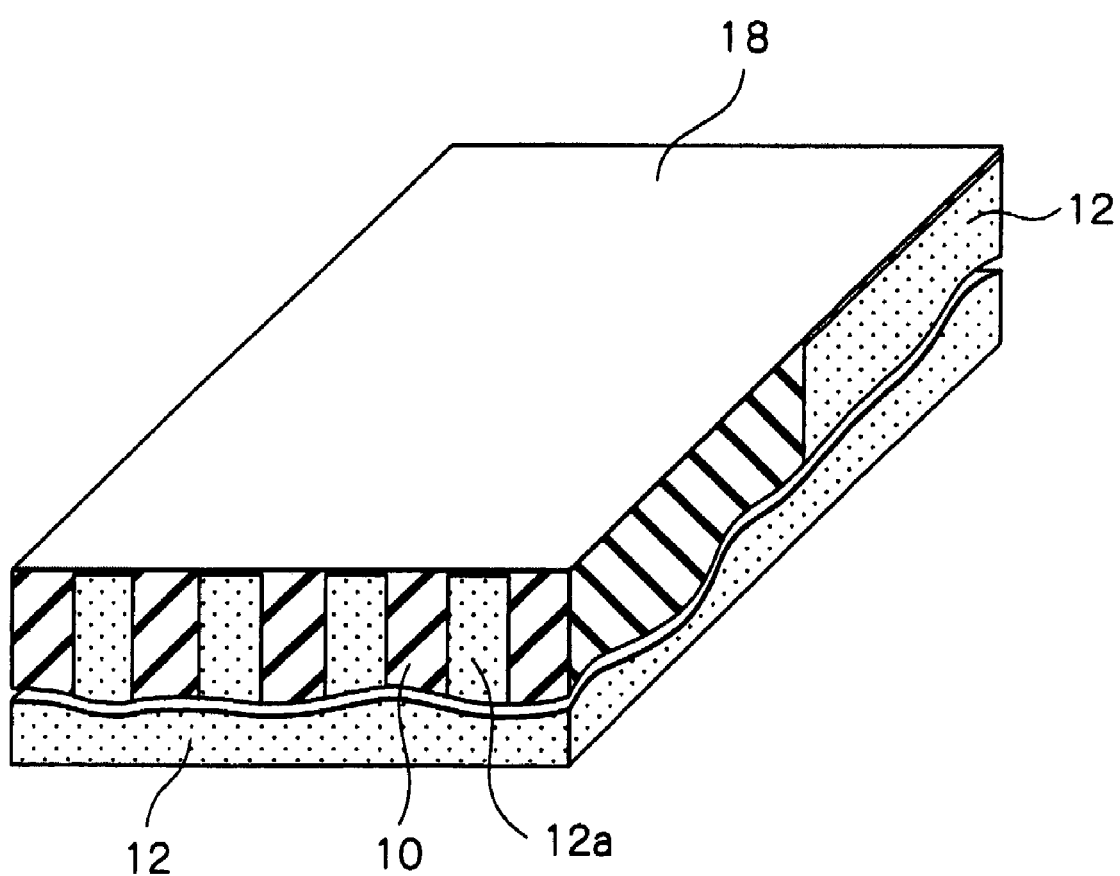
FIGS. 10 through 35 are partly sectioned, fragmentary perspective views demonstrating a series of steps of manufacturing the semiconductor memory of the illustrative embodiment.

Referring to FIGS. 10 through 35, a method of manufacturing the semiconductor memory of the illustrative embodiment will be described. First, as shown in FIG. 10, trenches 12a for isolation (STI (Shallow Trench Isolation) in the illustrative embodiment) are formed in the primary surface of the P type silicon substrate 12 by a conventional method. Subsequently, silicon oxide layers or similar insulators 10 are buried in the trenches 12a. The surface of the substrate 12 is then subject to thermal oxidation to thereby form a silicon oxide film 18. To prepare the P type silicon substrate 12, a P type epitaxial layer with a boron concentration of about $1.0 \times 10^{15}$ cm$^{-3}$ may be formed on a P$^+$ type substrate with a boron concentration of about $4.0 \times 10^{18}$ cm$^{-3}$.

Figure 11:
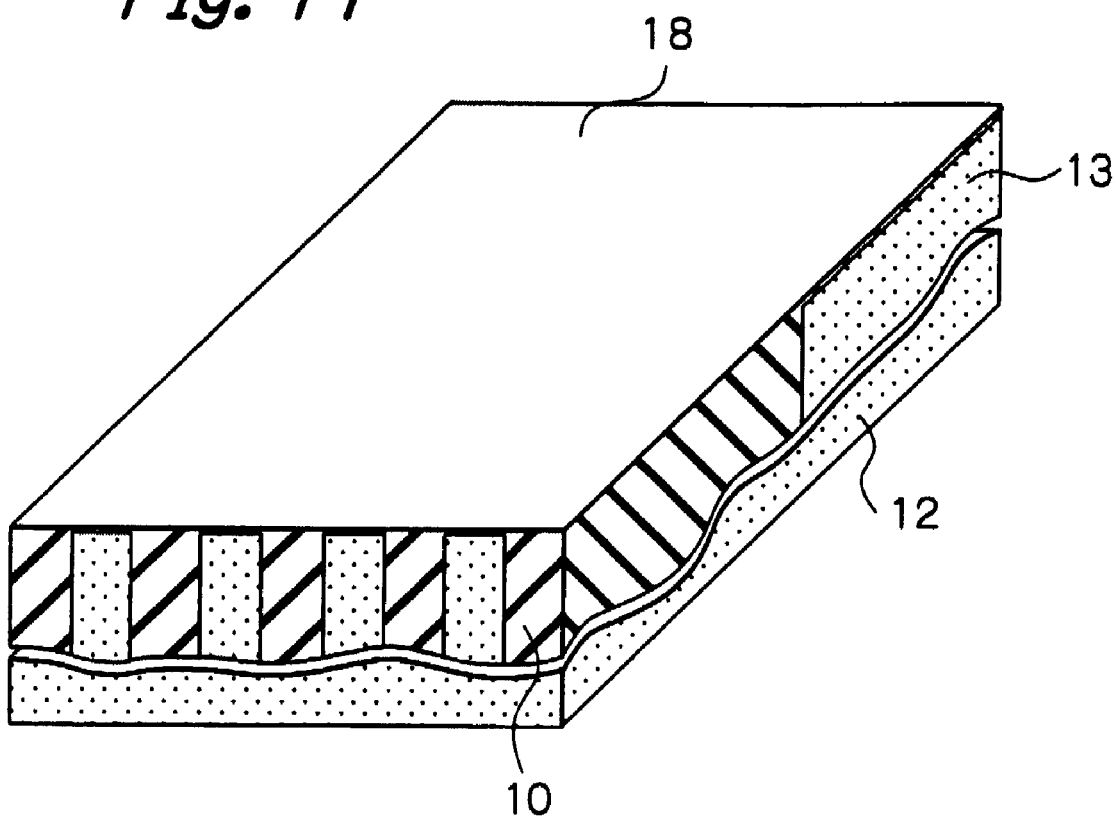

As shown in FIG. 11, after the step of FIG. 10, ions are implanted in the silicon substrate 12 to form the P well 13 in the substrate 12. More specifically, ions are implanted four consecutive times under the following conditions. An ion seed is $BF_2$ (boron fluoride) for the first and second ion implantation and is B (boron) for the third and fourth ion implantation. Acceleration energy is 15 keV for the first ion implantation, 45 keV for the second ion implantation, 20 keV for the third ion implantation, and 40 keV for the fourth ion implantation. Further, a dose is $5.0 \times 10^{11}$ cm$^{-2}$ for the first ion implantation, $5.0 \times 10^{11}$ cm$^{-2}$ for the second ion implantation, $6.0 \times 10^{12}$ cm$^{-2}$ for the third ion implantation, and $5.0 \times 10^{12}$ cm$^{-2}$ for the fourth ion implantation.

Figure 12:
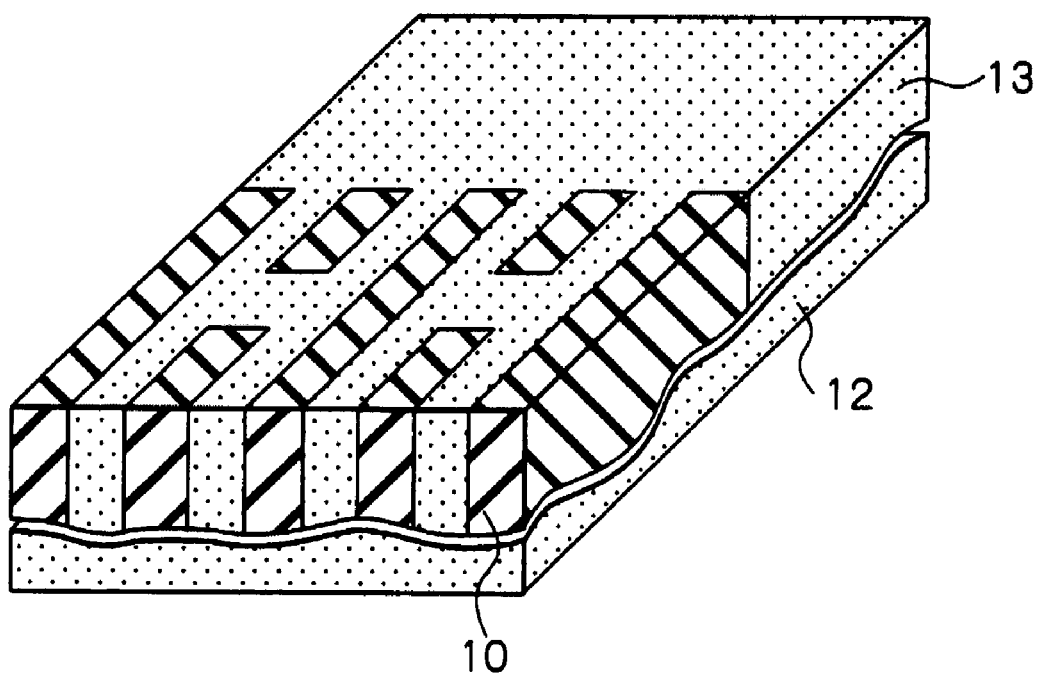
Figure 13:
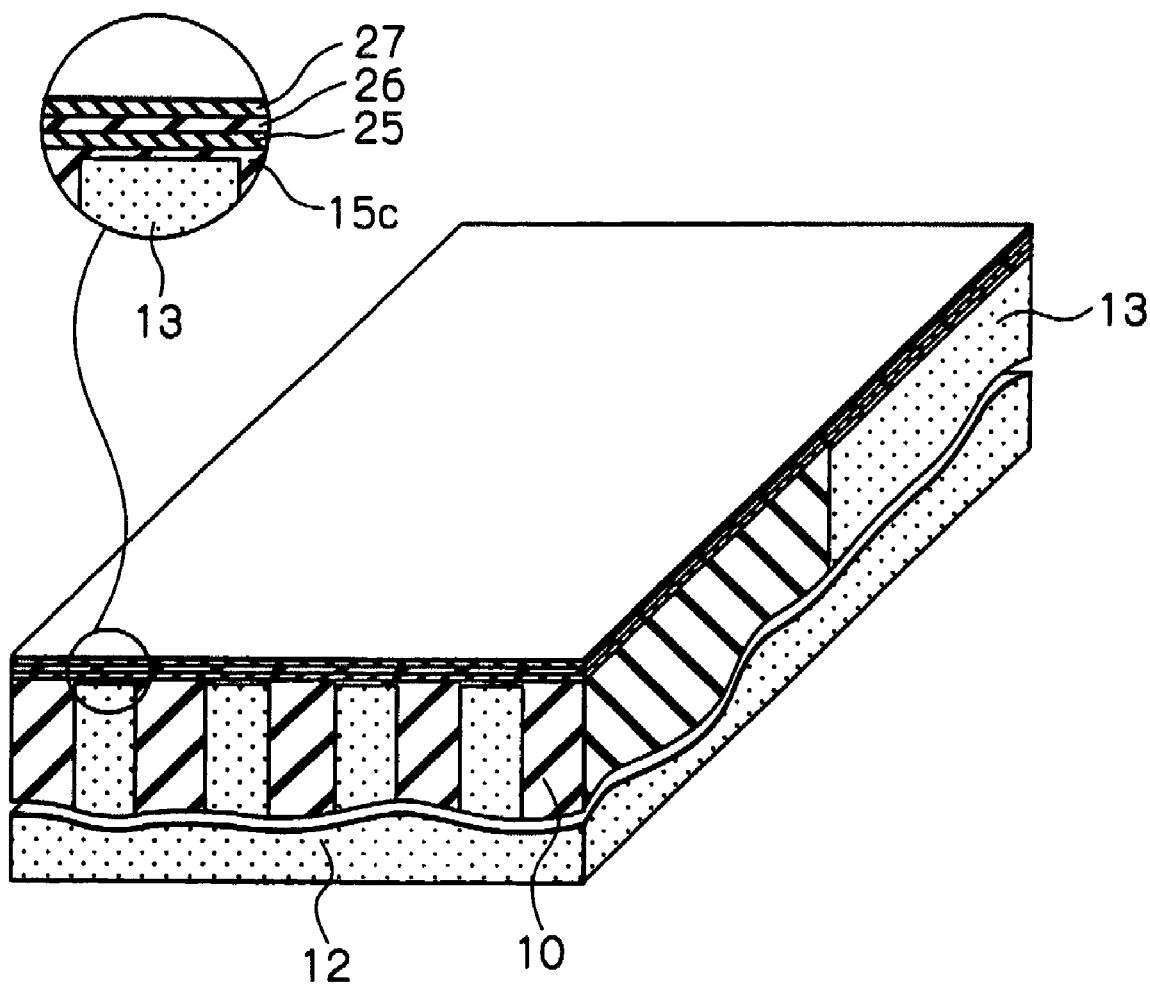

Subsequently, as shown in FIG. 12, the entire silicon oxide film 18 is removed by etching. As shown in FIG. 13, the surface of the substrate 12 is again subject to thermal oxidation to form the gate insulation layer 15c, which is a silicon oxide layer. The gate insulation layer 15c is about 10 nm thick. Thereafter, an about 10 nm thick, silicon nitride layer 25, a 4 nm thick, silicon oxide layer 26 and a 50 nm thick silicon nitride layer 27 are sequentially formed on the gate insulation layer 15c in this order. These layers are formed by CVD (Chemical Vapor Deposition). The functions of such layers stacked on the substrate 12 will become apparent from the description of consecutive steps to follow.

Figure 14:
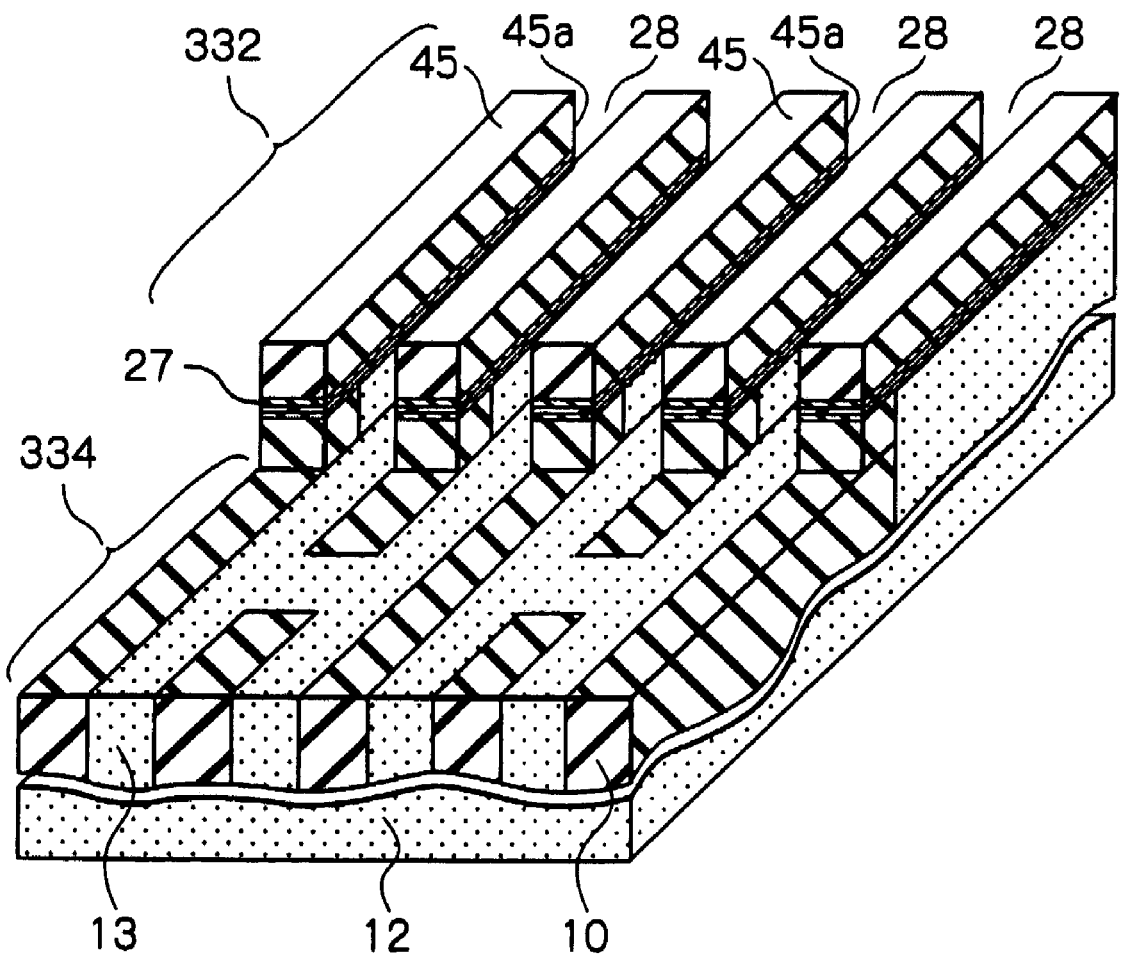

As shown in FIG. 14, a photoresist layer 45 is coated on the silicon nitride layer 27 positioned on the top of the laminate shown in FIG. 13. The photoresist layer 45 is then patterned in stripes by photolithography. Subsequently, the gate insulation layer 15c, silicon nitride layer 25, silicon oxide layer 26, silicon nitride layer 27, insulators 10 and P type well 13 are etched over the patterned photoresist or mask 45. As a result, trenches 28 are formed at positions where cell transistors will be formed later (memory cell portions 332 hereinafter). While the depth of each trench 28 is open to choice, it is about 380 nm in the illustrative embodiment. The distance between nearby trenches 28 is about 160 nm.

Further, the above etching is effected such that at positions where select transistors will be formed later (select transistor portions 334 hereinafter), the P type well 13 and insulators 10 are exposed to the outside in substantially the same plane as each other. After the etching, the photoresist layer 45 is removed by ashing.

Figure 15:
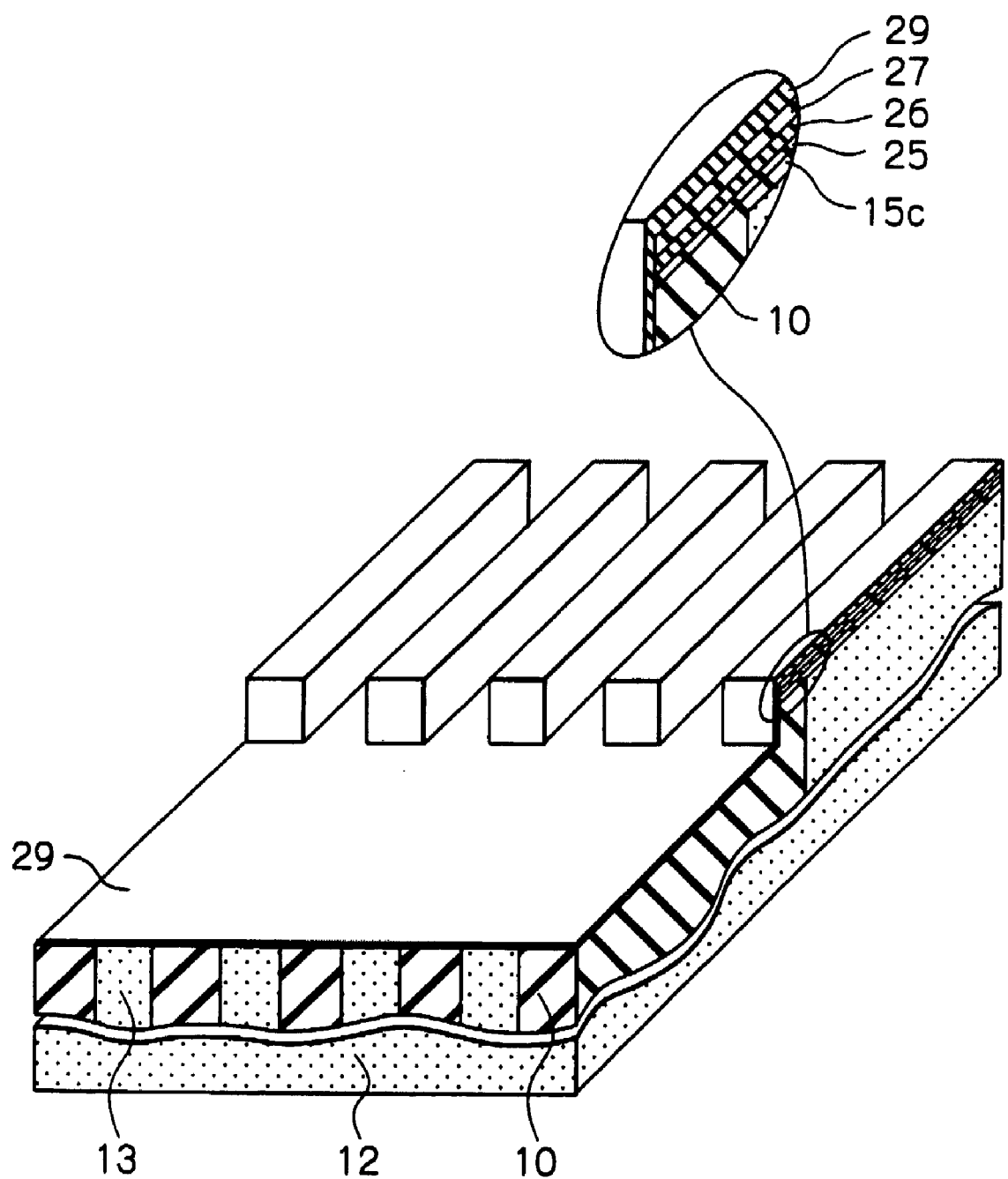
Figure 16:
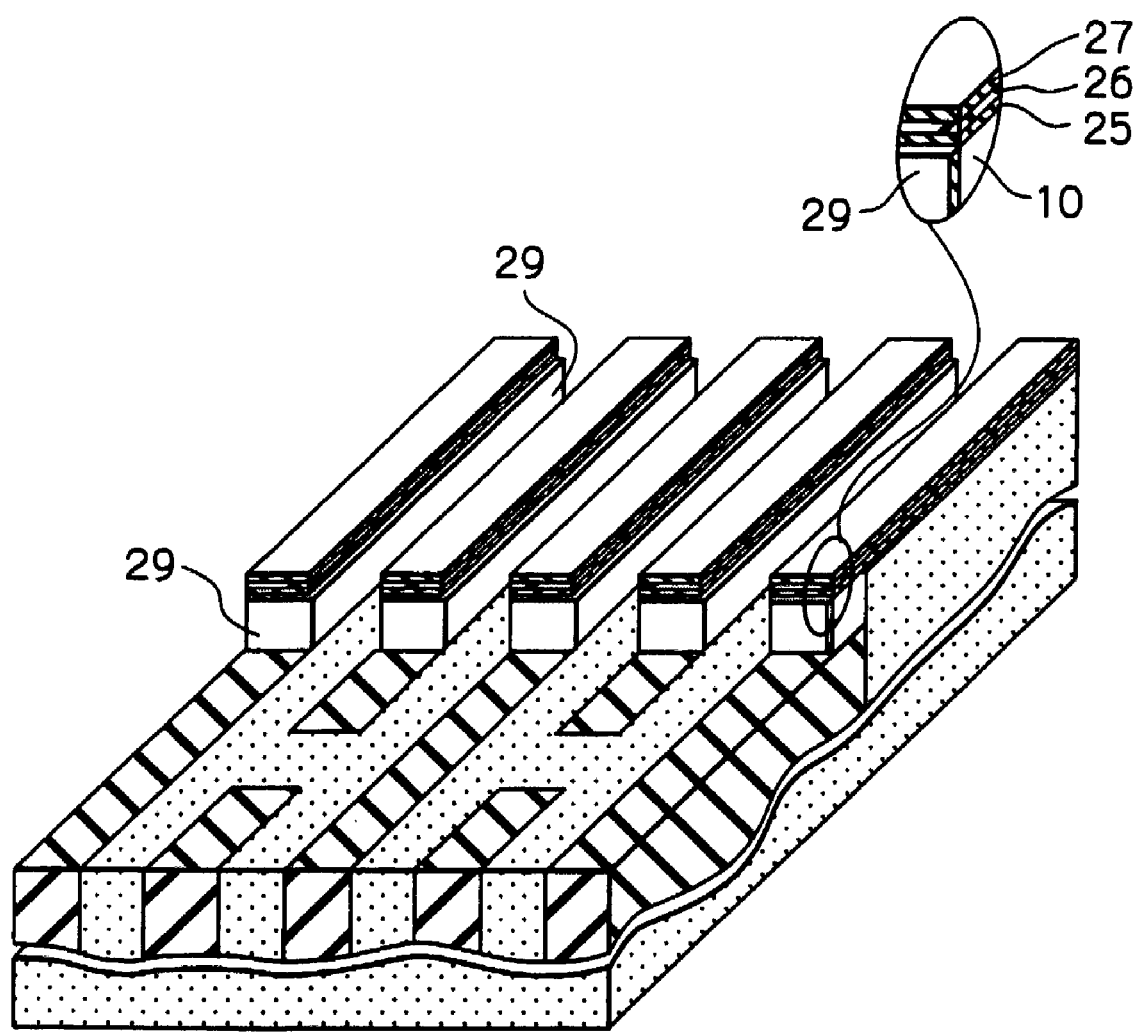
Figure 17:
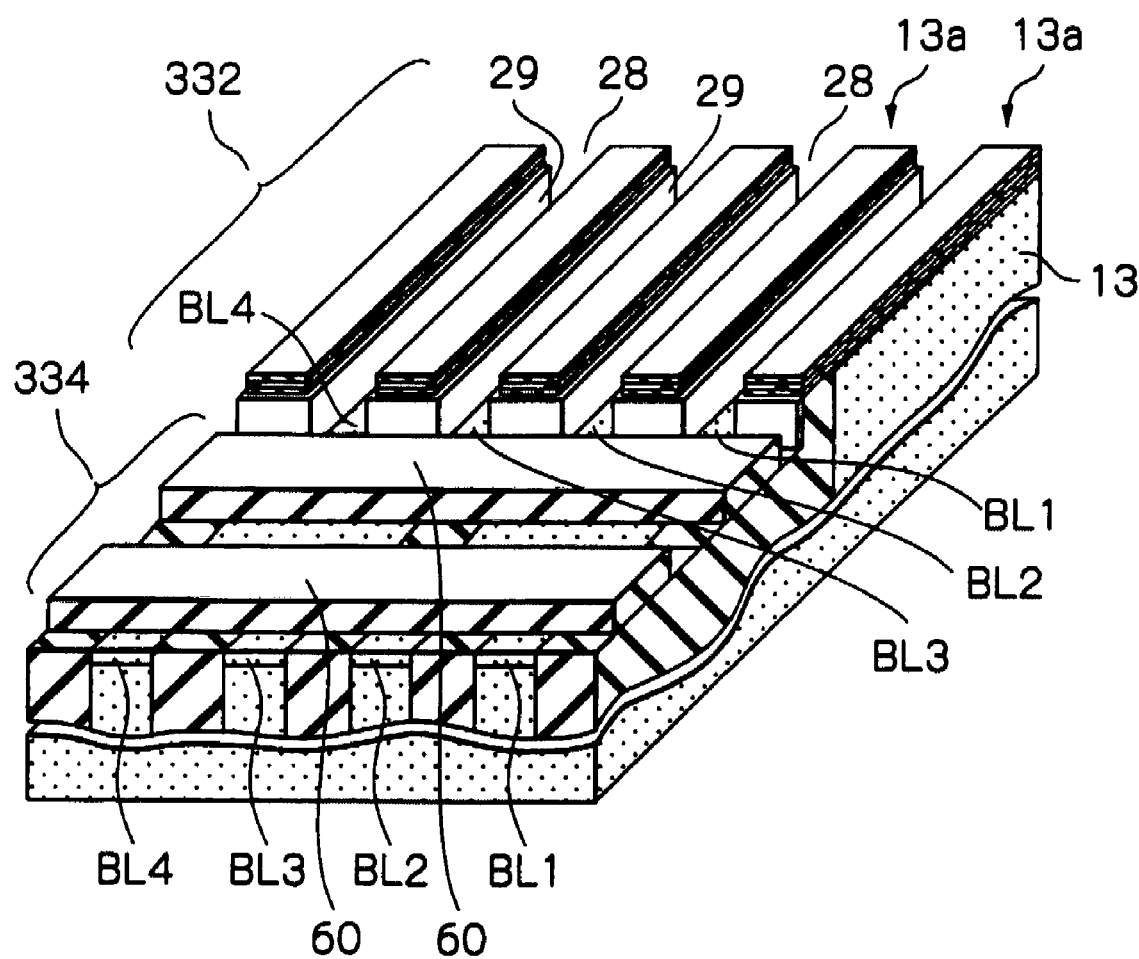

Subsequently, as shown in FIG. 15, an about 20 nm thick, silicon oxide layer 29 is formed on the entire exposed surface of the laminate shown in FIG. 14 by CVD. As shown in FIG. 16, the silicon oxide layer 29 is then anisotropically etched in the direction of thickness while being left on the side walls of each trench 28. The anisotropic etching may be effected by, e.g., RIE (Reactive Ion Etching).

After the step of FIG. 16, a photoresist layer 60 is formed in the selective transistor portions 334 in the form of stripes. Subsequently, arsenic ions are implanted over the photoresist stripes or mask 60 to thereby form the bit lines BL1 through BL4 in the P type well 13. At this instant, the silicon oxide layers 29 left on the side walls of each trench 28 prevent arsenic ions from being implanted. Also, the projections 13a, serving as masks, allow the bit lines BL1 through BL4 to be formed on the bottoms of the trenches 28 in a self-alignment fashion. An ion seed for the above ion implantation is AS (arsenic). The ion implantation is effected with acceleration energy of 15 keV and a dose of $2.0 \times 10^{14}$ cm$^{-2}$.

Figure 18:
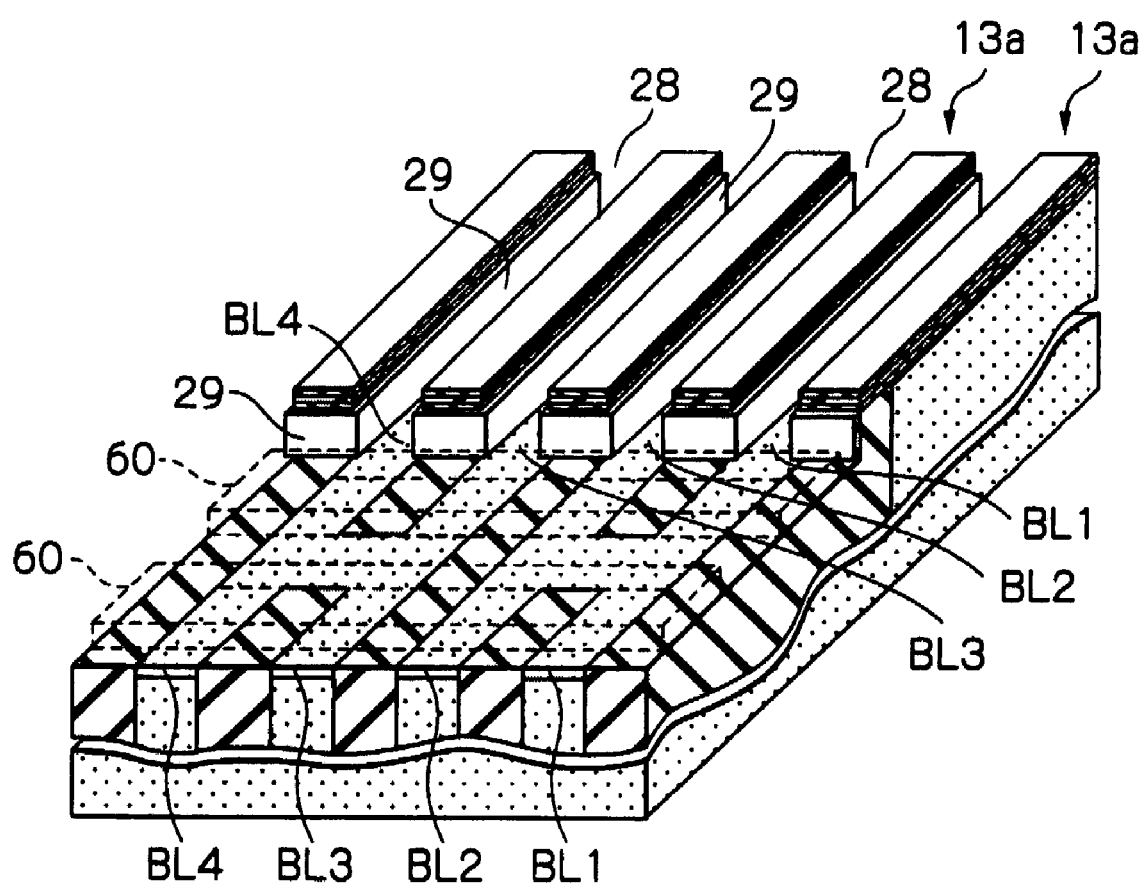

In FIG. 18, the photoresist stripes 60 are indicated by dotted lines in order to clearly indicate the configuration of the bit lines BL1 through BL4 as seen in a plan view.

Figure 19:
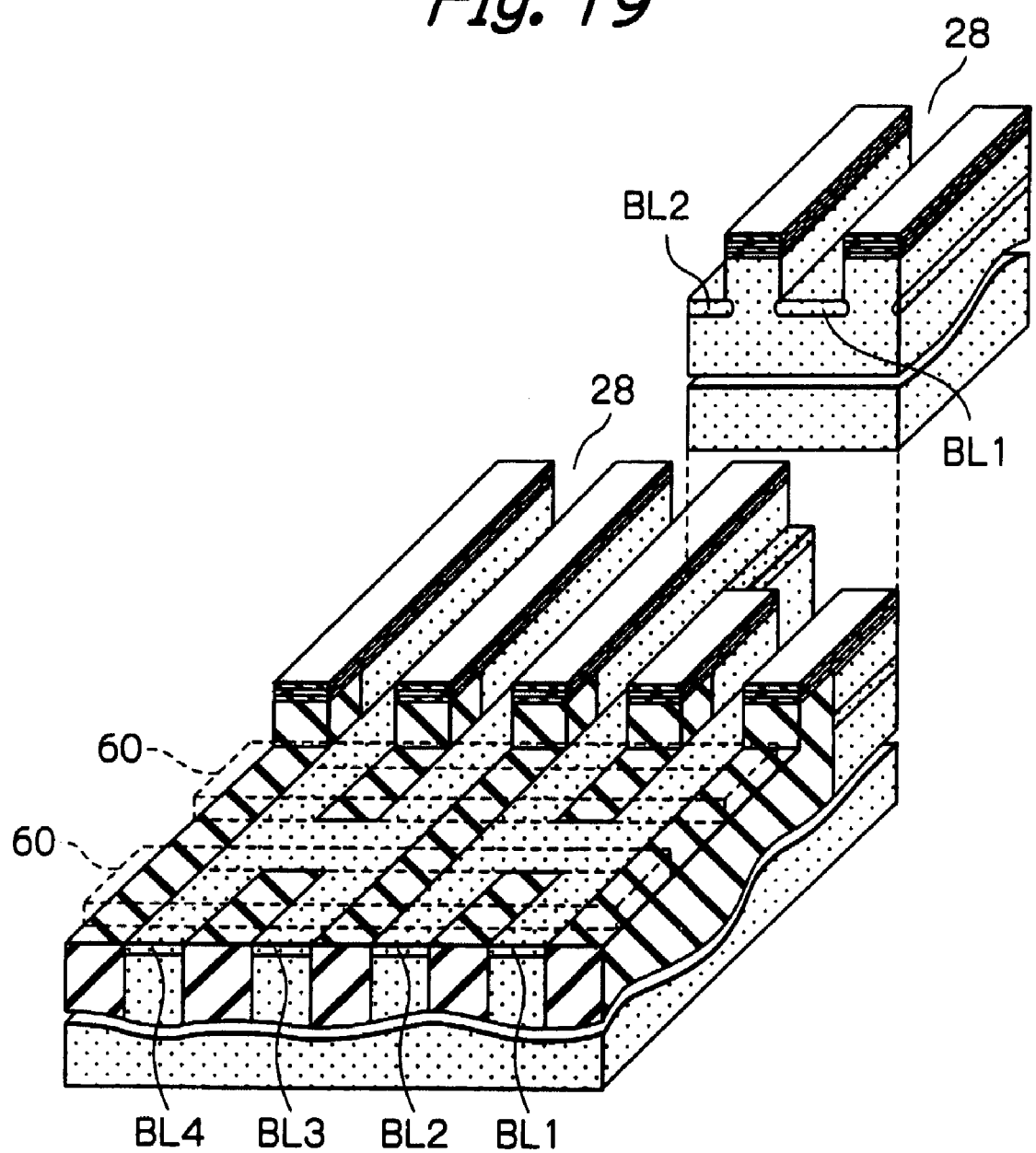
Figure 20:
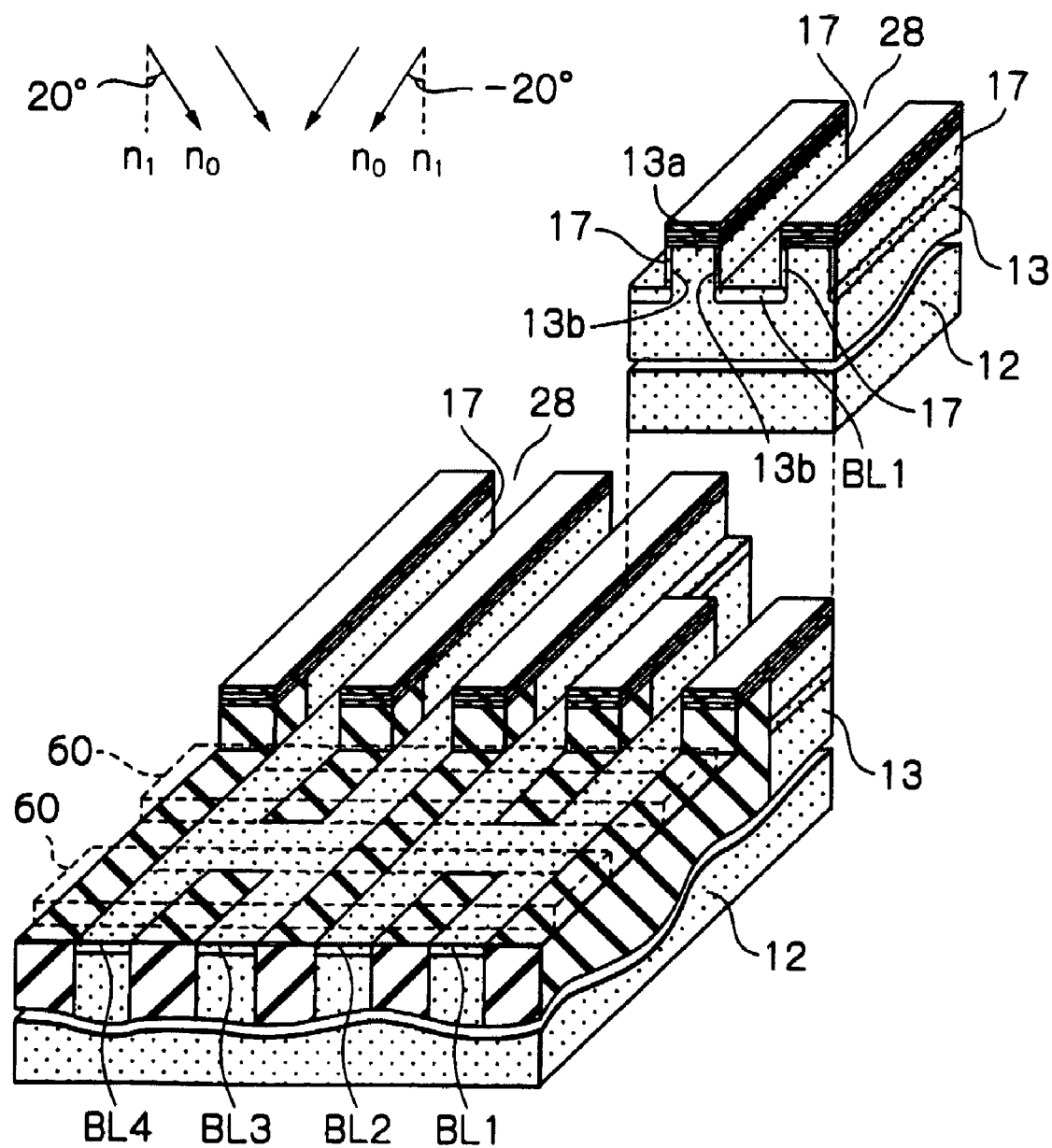

As shown in FIG. 19, the silicon oxide layers 29 on the side walls of each trench 28 are etched by about 10 nm to form extremely thin films although such thin films are not shown. Subsequently, as shown in FIG. 20, arsenic ions are implanted in the side walls 13b of each projection 13a for thereby forming N type regions 17. To implant arsenic ions in the side walls 13b, the P type silicon substrate 12 should only be tilted relative to the direction of implantation. In the illustrative embodiment, a line $n_1$ normal to the substrate 12 is tilted by about +/−20° relative to the direction of ion implantation $n_0$.

The ion implantation in FIG. 20 is effected with an ion seed of As, acceleration energy of 10 keV, and a dose of $5.0 \times 10^{11}$ cm$^{-2}$. Again, the silicon oxide layers 29 left on the side walls 13b of each projection 13a prevent arsenic ions from being excessively implanted in the side walls 13b. After this ion implantation, the photoresist layer 60 is removed by ashing.

Figure 21:
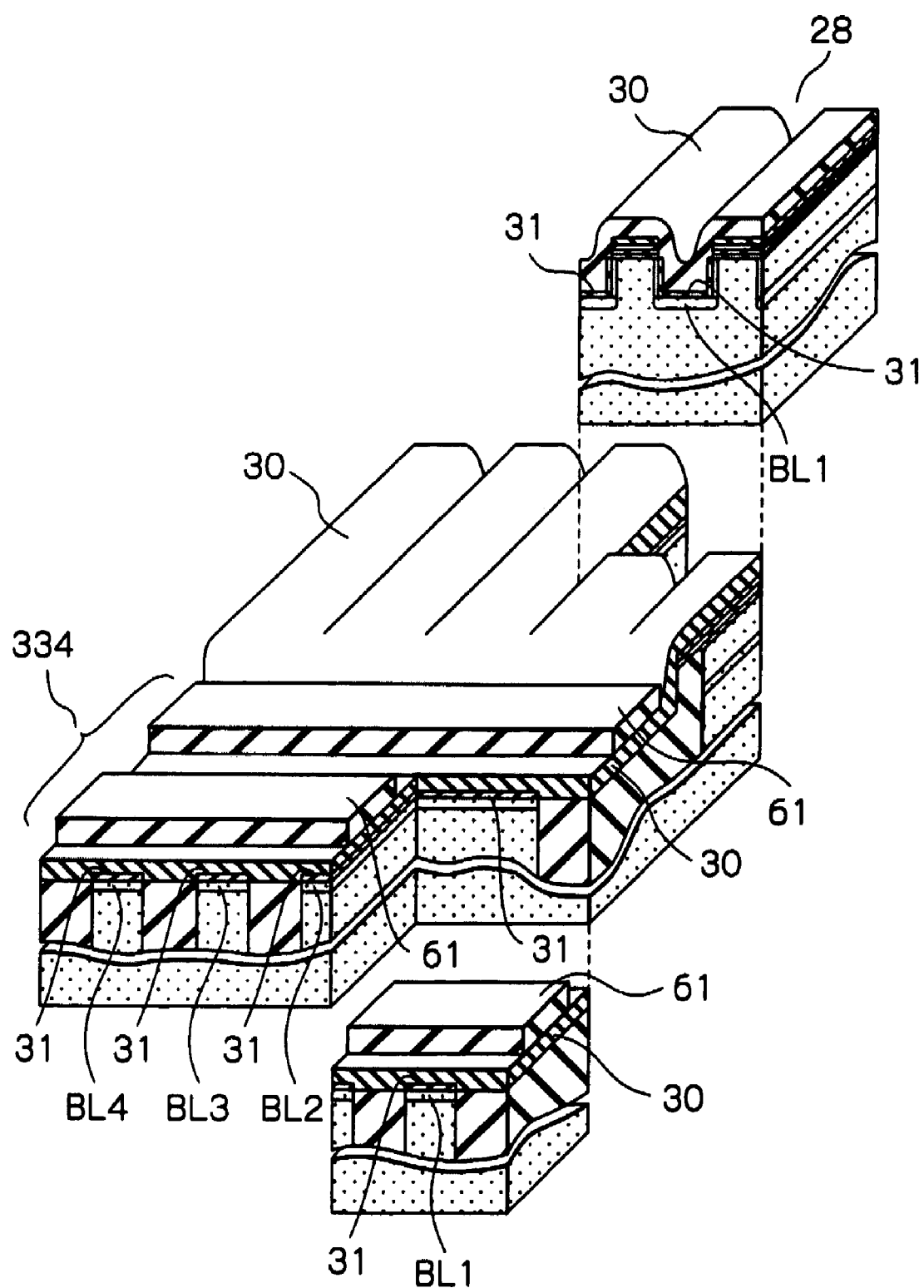

The surface layers of the trenches 28 are expected to implement the channel of the device, so that the property of the surface layers has critical influence on the device characteristics. It is therefore necessary to protect the surfaces of the trenches 28 from contamination in the steps to follow. For this purpose, as shown in FIG. 21, the illustrative embodiment forms an about 4 nm thick, sacrifice silicon oxide layer 31 on the sides and bottoms of the trenches 28 by thermal oxidation. The sacrifice silicon oxide layer 31 successfully protects the surfaces of the trenches 28 from contamination. Moreover, this layer 31 serves to remove a lattice defect particular to the surface layers of the trenches 28, thereby preventing the device characteristics from being degraded. It is to be noted that the sacrifice silicon oxide layer 31 is formed in the select transistor portions 334 on the portions of the bit lines BL1 through BL4 not covered with the photoresist stripes 60 as well.

Subsequently, an about 60 nm thick, silicon nitride layer 30 is formed on the entire exposed surface of the laminate inclusive of the trenches 28 by CVD. This is followed by coating a photoresist layer 61 on the portions of the silicon nitride layer 30 corresponding to the select transistor portions 334 in the form of stripes.

Figure 22:
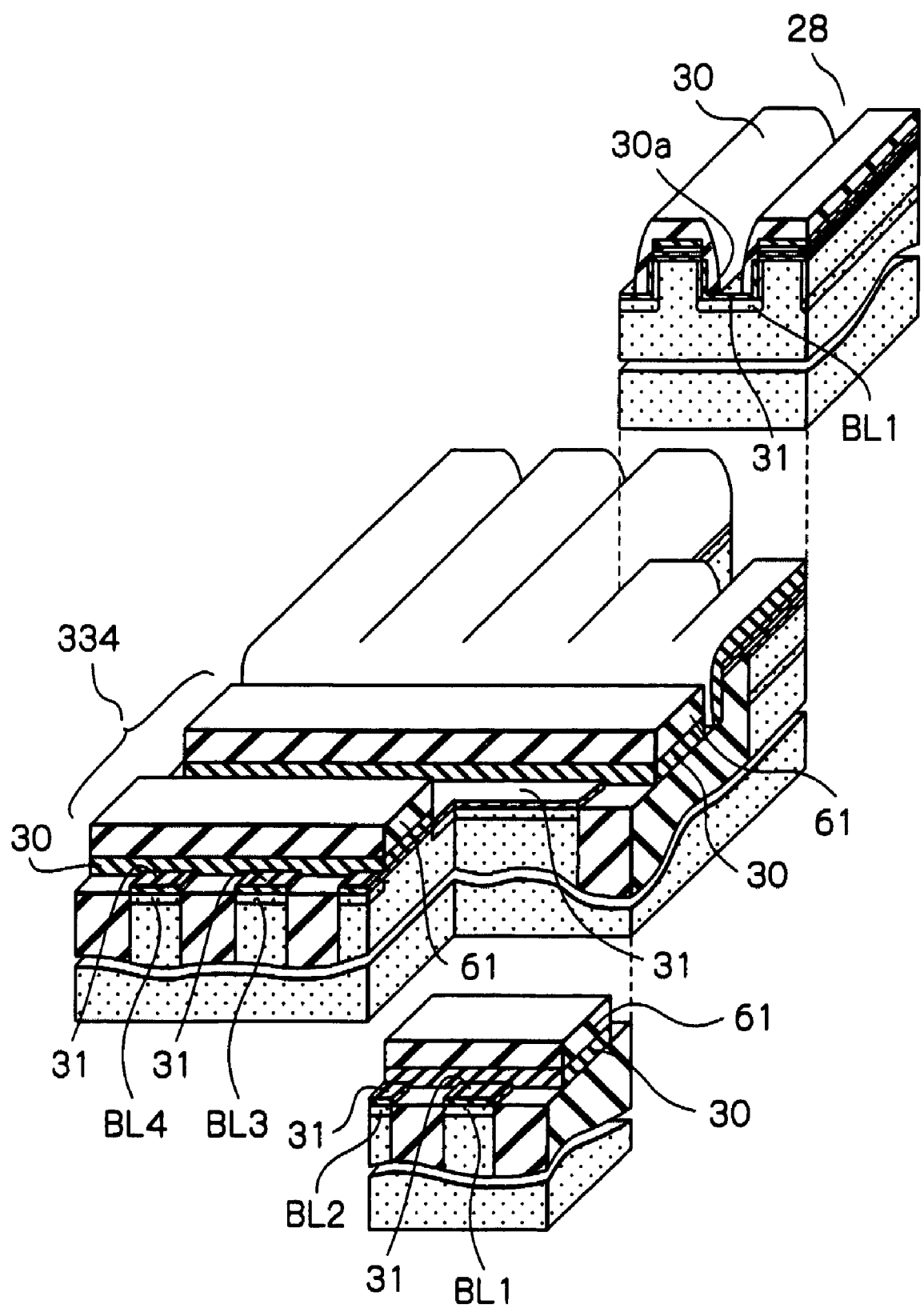

As shown in FIG. 22, the silicon nitride layer 30 is anisotropically etched in the direction of thickness such that slots 30a are formed in the layer 30 in the trenches 28. On the other hand, in the select transistor portions 334, the pattern of the photoresist layer 61, serving as a mask, is transferred to the silicon nitride layer 30.

Figure 23:
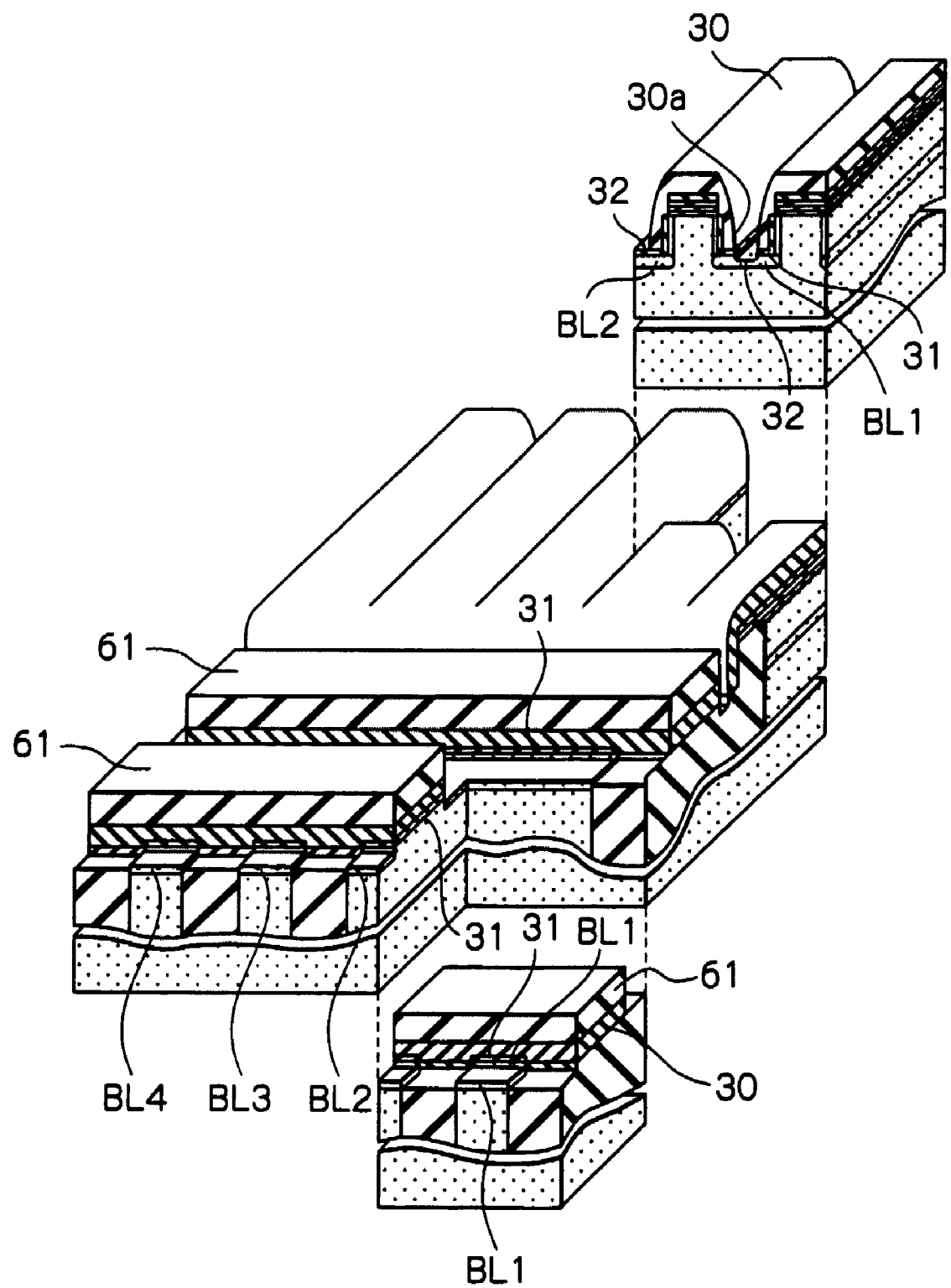

After the step of FIG. 23, the sacrifice silicon oxide layer 31 and part of each of the bit lines BL1 through BL4 are selectively etched with the silicon nitride layer 30 serving as a mask. As a result, an about 10 nm deep recess 32 is formed in each of the bit lines BL1 through BL4.

Figure 24:
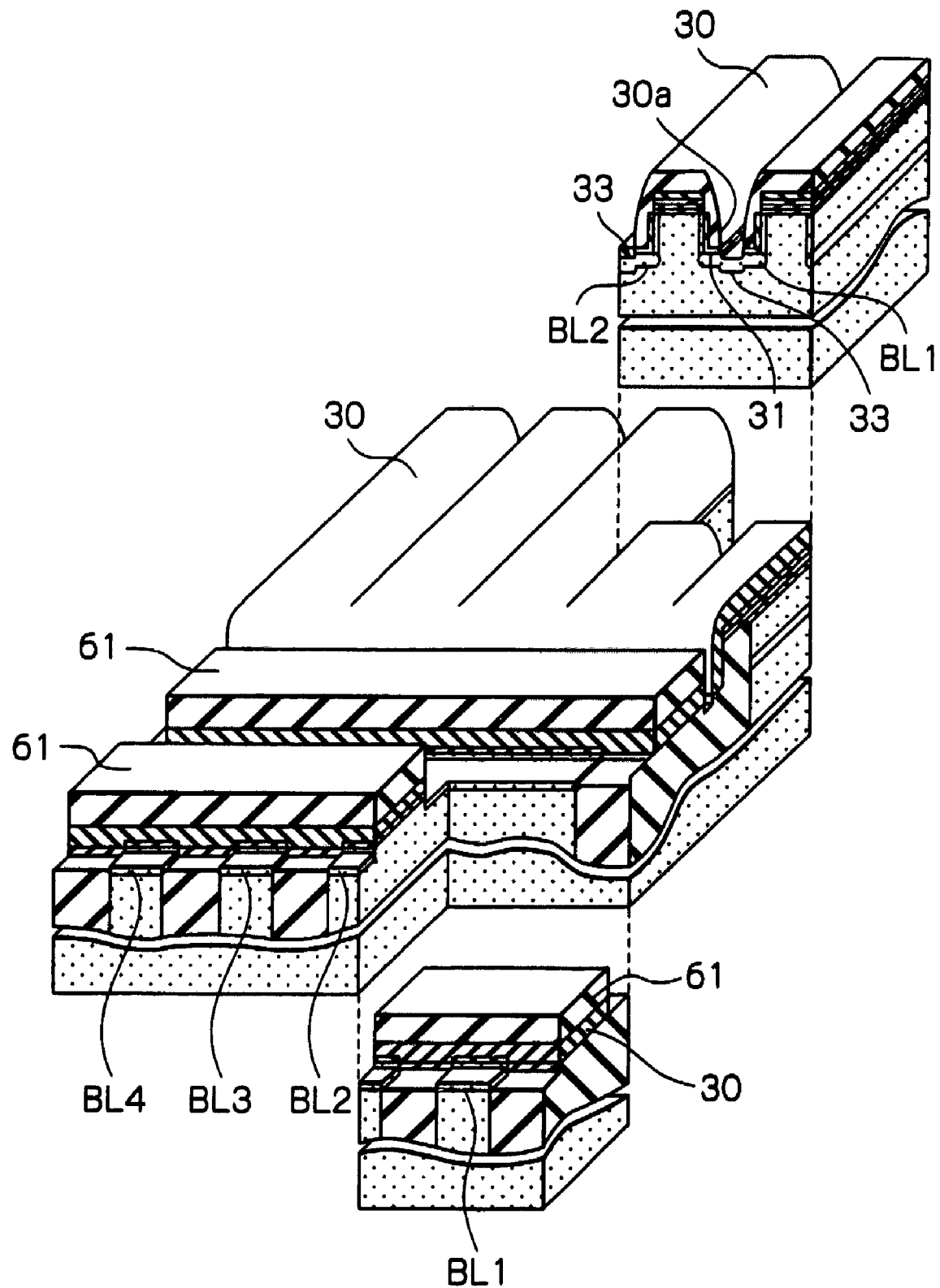

Subsequently, as shown in FIG. 24, arsenic ions are implanted in the bit lines BL1 through BL4 via the slots 30a in order to lower the resistance of the bit lines BL1 through BL4. Portions 33 where arsenic ions are so implanted constitute high-concentration regions, i.e., n$^+$ regions that lower the resistance of the bit lines BL1 through BL4 in the direction of column. This implantation is effected with an ion seed of As, acceleration energy of 30 keV, and a dose of $3.0 \times 10^{15}$ cm$^{-2}$.

Figure 25:
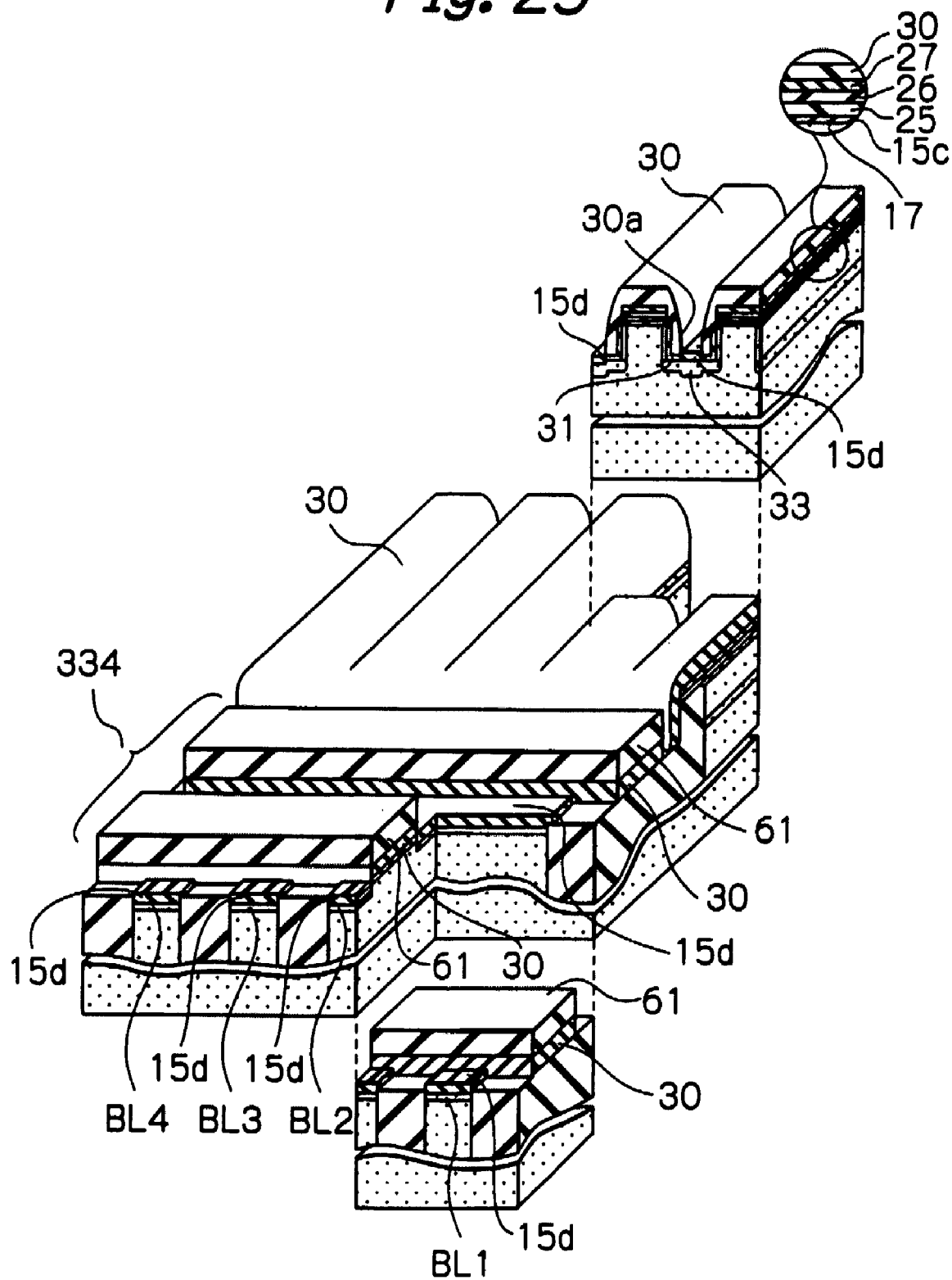

As shown in FIG. 25, the recesses 32 are subject to selective thermal oxidation over the silicon nitride layer or mask 30 to thereby form selective oxide layers 15d. In the select transistor portions 334, the portions of the bit lines BL1 through BL4 not covered with the silicon nitride layer 30 are also oxidized, so that the selective oxide layers 15d are formed there.

Figure 26:
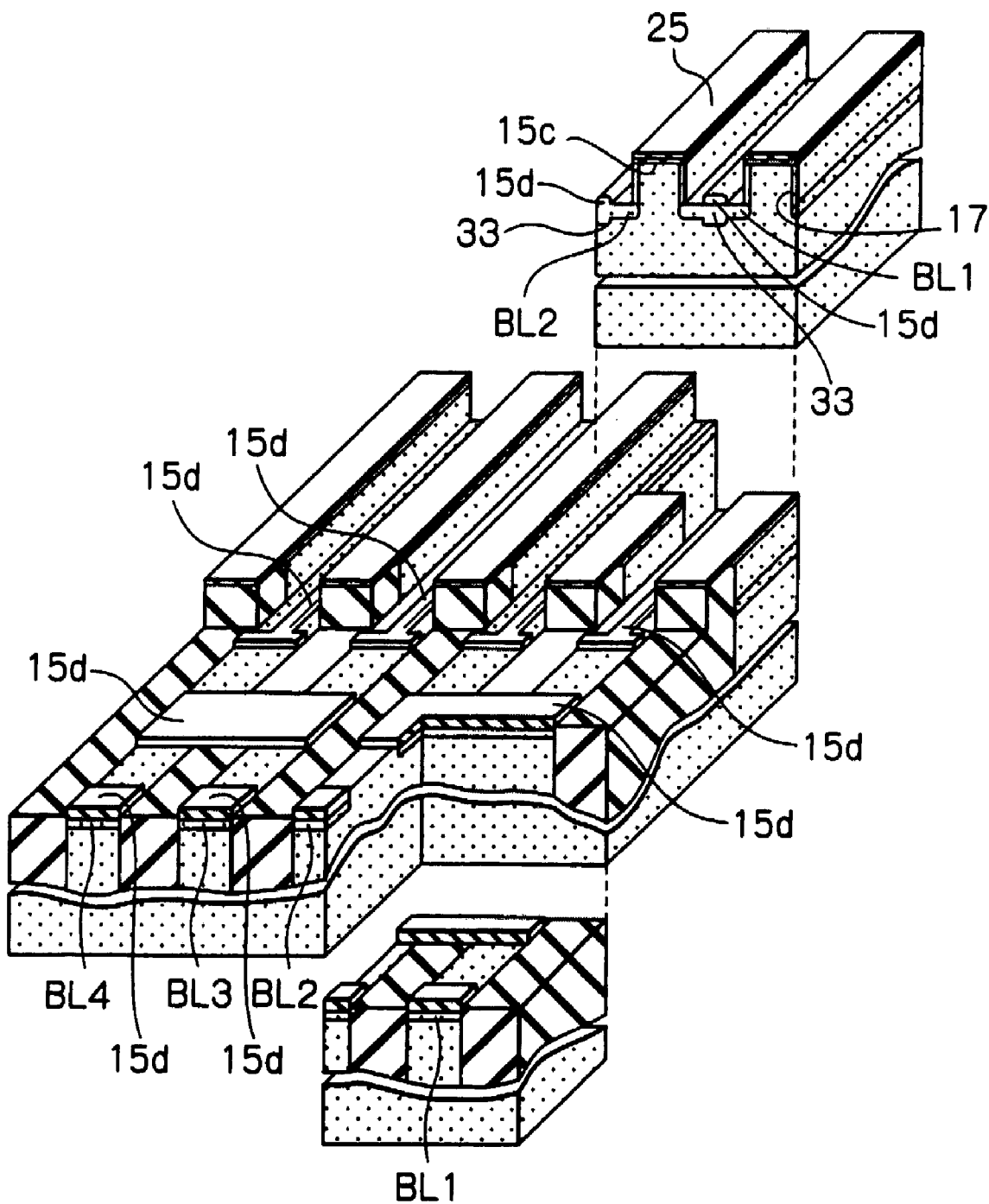

After the selective oxide layers 15d have been formed, the photoresist layer 61 is removed by ashing, and then the silicon nitride layers 27 and 30 are removed by etching. During this etching, the silicon oxide layer 26 and sacrifice oxide layer 31 play the role of an etching stopper. Subsequently, the silicon oxide layer 26 is removed by etching to such a degree that the layer 26 is fully removed, but the selective oxide layers 15d are left. During this etching, the silicon nitride layer 25 plays the role of an etching stopper. FIG. 26 shows the resulting configuration of the stack.

Figure 27:
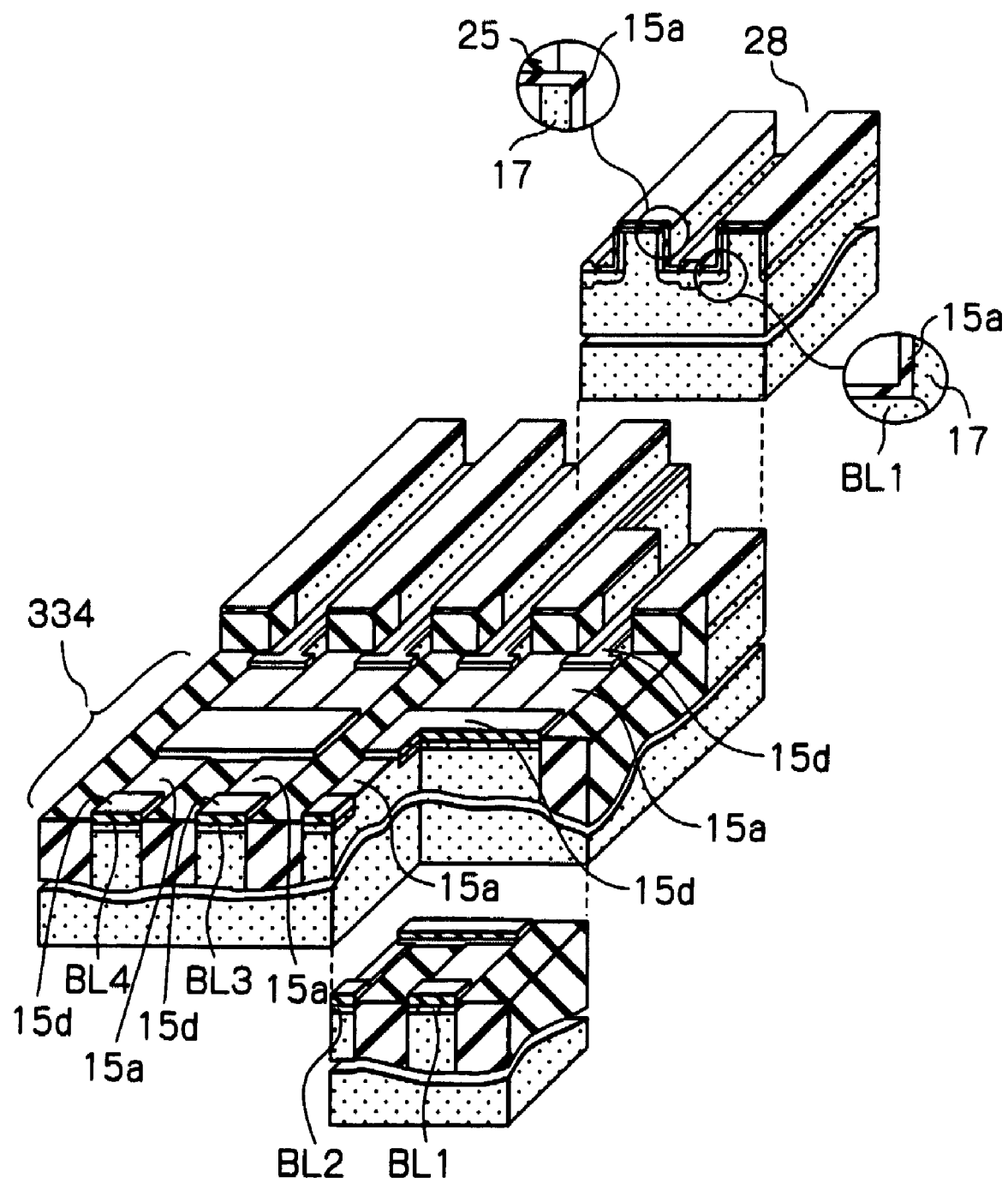

As shown in FIG. 27, in the condition shown in FIG. 26, the bottoms and sides of the trenches 28 are again subject to thermal oxidation to thereby form the about 5 nm thick, tunnel insulation layers 15a. The tunnel insulation layers 15a should preferably be provided with excellent property because their property has critical influence on the device operation. For this purpose, the illustrative embodiment forms the tunnel insulation layers 15a by using plasma oxidation, which is implemented by a microwave excited, high density plasma device using a radial line slot antenna, and introducing a krypton (Kr) and oxygen (O$_2$) mixture gas in the plasma device.

In the plasma device mentioned above, Kr excited by a microwave hits against O$_2$ for thereby generating a great amount of atomic state oxygen O*. The atomic state oxygen O* easily enters the surface layers of the trenches 28 and oxidize the bottoms and sides of the trenches 28 at substantially the same rate without regard to the plane direction. Consequently, the tunnel insulation layers 15 having uniform thickness are formed in the corner portions of the trenches 28, as indicated in an enlarged view in circles. For details of the plasma oxidation, reference may be made to, e.g., Paper No. 29p-YC-4, The 48th Joint Meeting of Engineers of Applied Physics of Japan and Japanese patent laid-open publication No. 2001-160555. It is to be noted that the tunnel insulation layers 15a are formed on the portions of the bit lines BL1 through BL4 not covered with the selective oxide layers 15d in the select transistor portions 334 as well.

Figure 28:
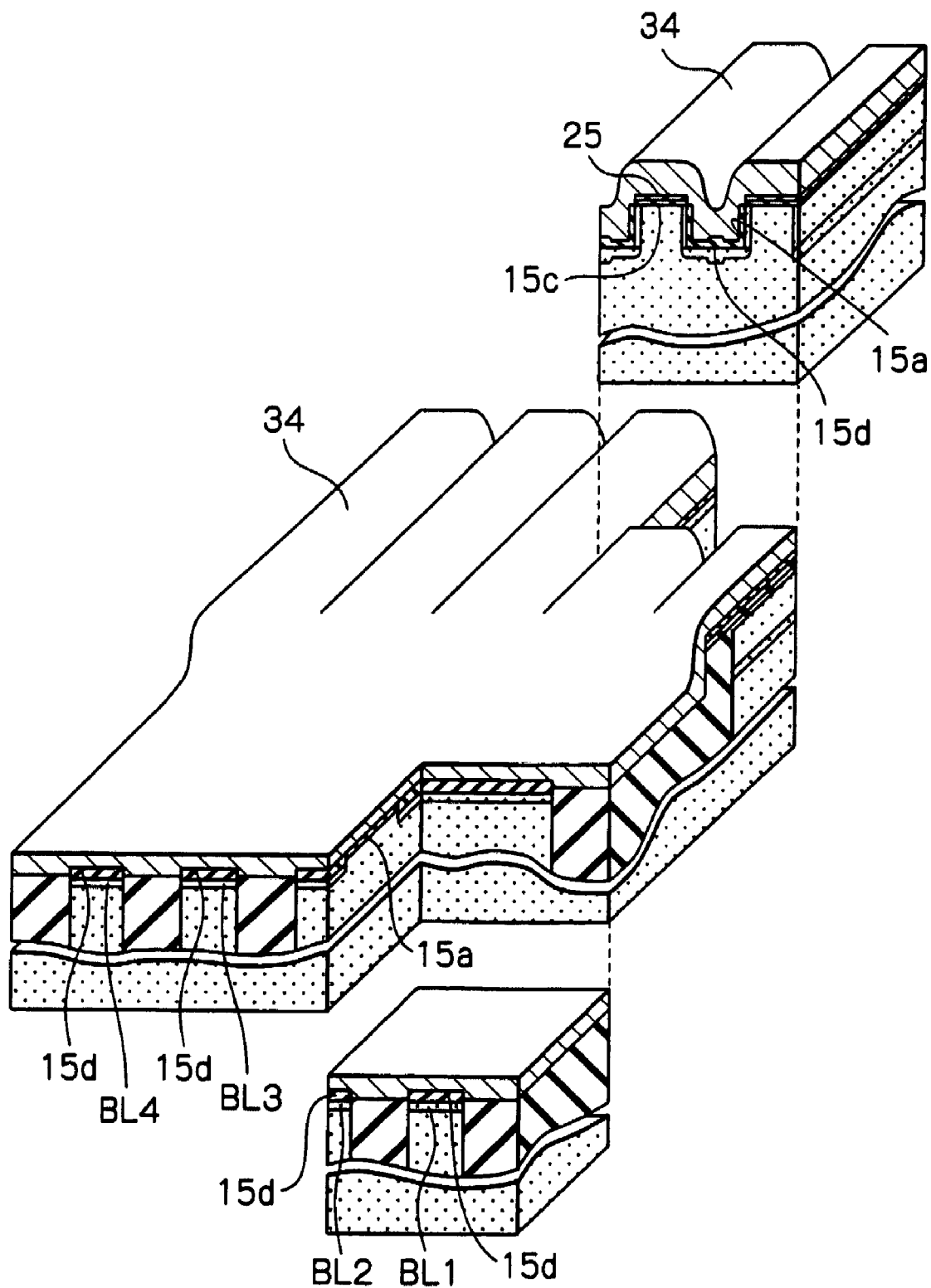

FIG. 28 shows a step to follow the step of FIG. 27. As shown, a polycrystalline silicon layer 34 is formed on the tunnel insulation layers 15a and silicon nitride layer 25. The polycrystalline silicon layer 34 is about 50 nm thick and doped with phosphor (P) beforehand by an in-situ process.

Figure 29:
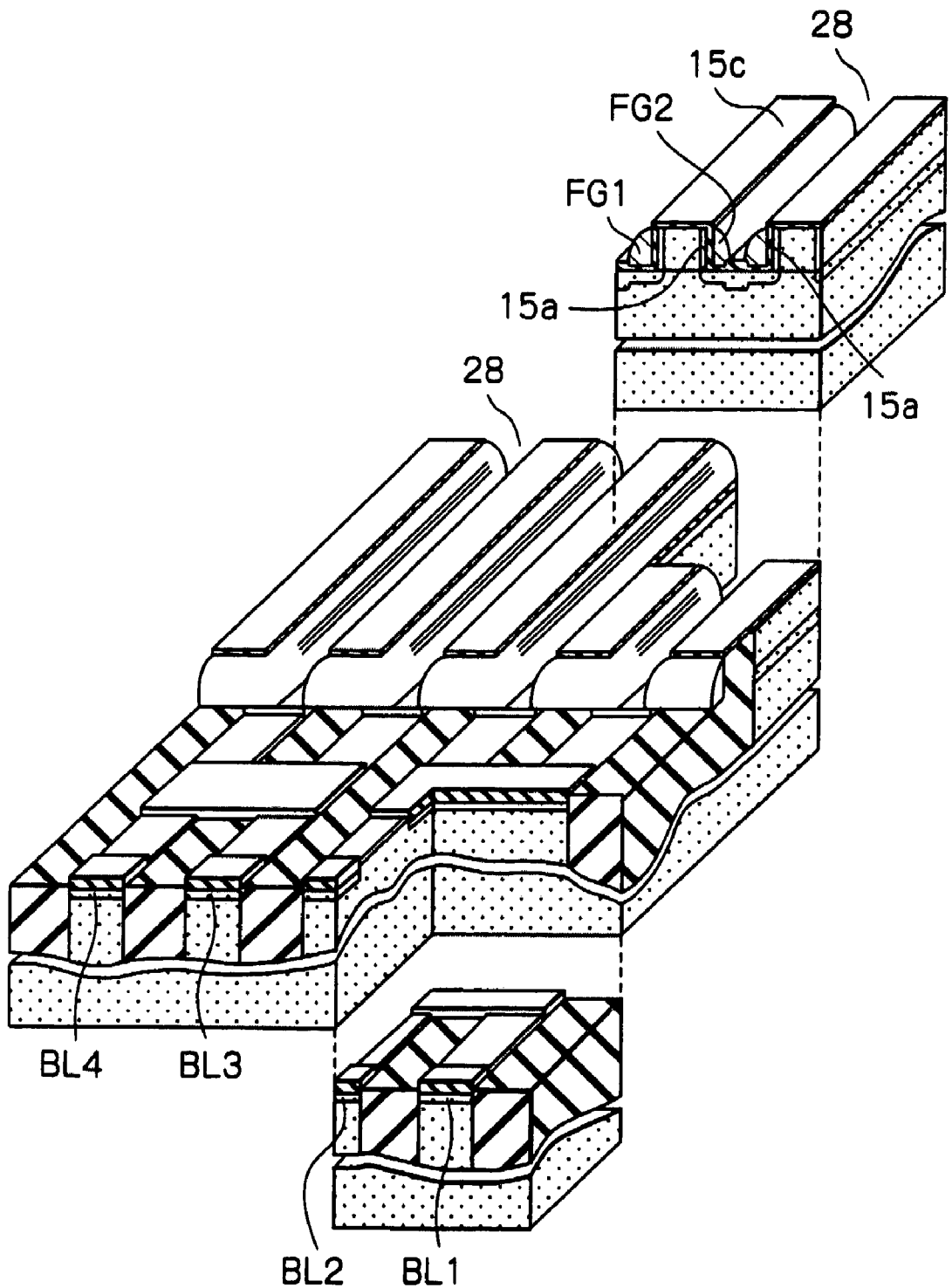

Subsequently, as shown in FIG. 29, the polycrystalline silicon layer 34 is anisotropically etched in the direction of thickness or depth. As a result, the polycrystalline silicon layer 34 on the silicon nitride layer 25, FIG. 27, is removed, but is left on the tunnel insulation layers 15a on the sides of the trenches 28. The polycrystalline silicon layers 34 left on the sides of the trenches 28 constitute the floating gates FG1 and FG2. Thereafter, the silicon nitride layer 25, FIG. 28, is removed by etching.

Attention should be paid to the role that the silicon nitride layer 25 has played up to this stage of production. The silicon nitride layer 25 has been formed on the gate insulation layers 15$c$ and has protected the gate insulation layers 15$c$ up to the step of FIG. 29.

Figure 30:
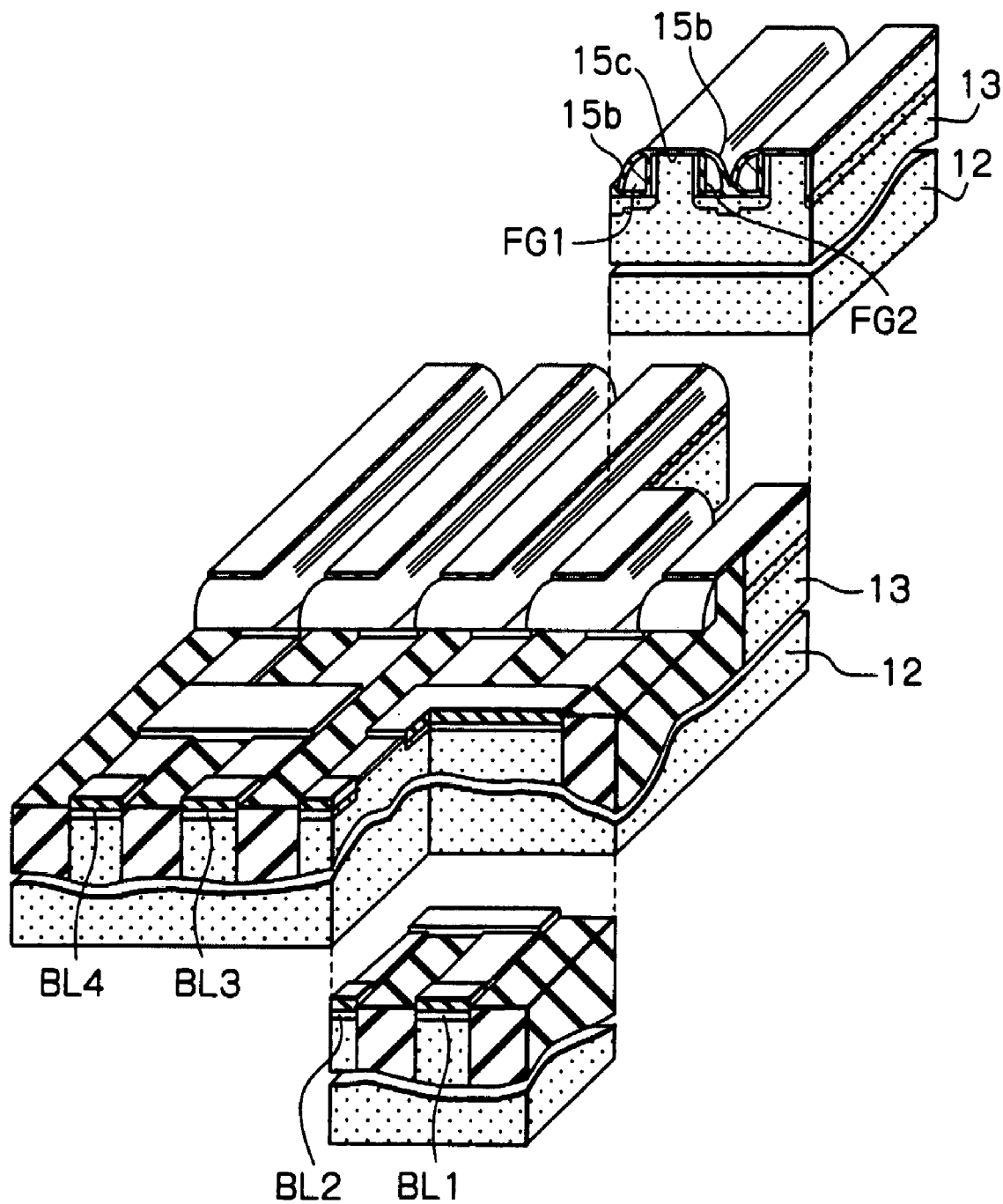

As shown in FIG. 30, after the step of FIG. 29, the entire exposed surface of the laminate is oxidized by plasma oxidation mentioned earlier. As a result, silicon beneath the gate insulation layers 15$c$ is oxidized, increasing the thickness of the layers 15$c$. At the same time, the surfaces of the floating gates FG1 and FG2 are oxidized with the result that the inter-polycrystalline insulation layers 15$b$ are formed and have a thickness of about 8 nm each.

The floating gates FG1 and FG2 are formed of polycrystalline silicone, so that numerous crystal particles different in plane direction are formed on the surfaces of the floating gates FG1 and FG2. However, plasma oxidation allows a silicon oxide layer to be uniformly formed without regard to the plane direction. This obviates an occurrence that the inter-polycrystalline insulation layer 15$b$ is locally thinned and has its insulation characteristic deteriorated at thinned portions. This advantage is achievable even when polycrystalline silicone is doped with phosphor.

Figure 31:
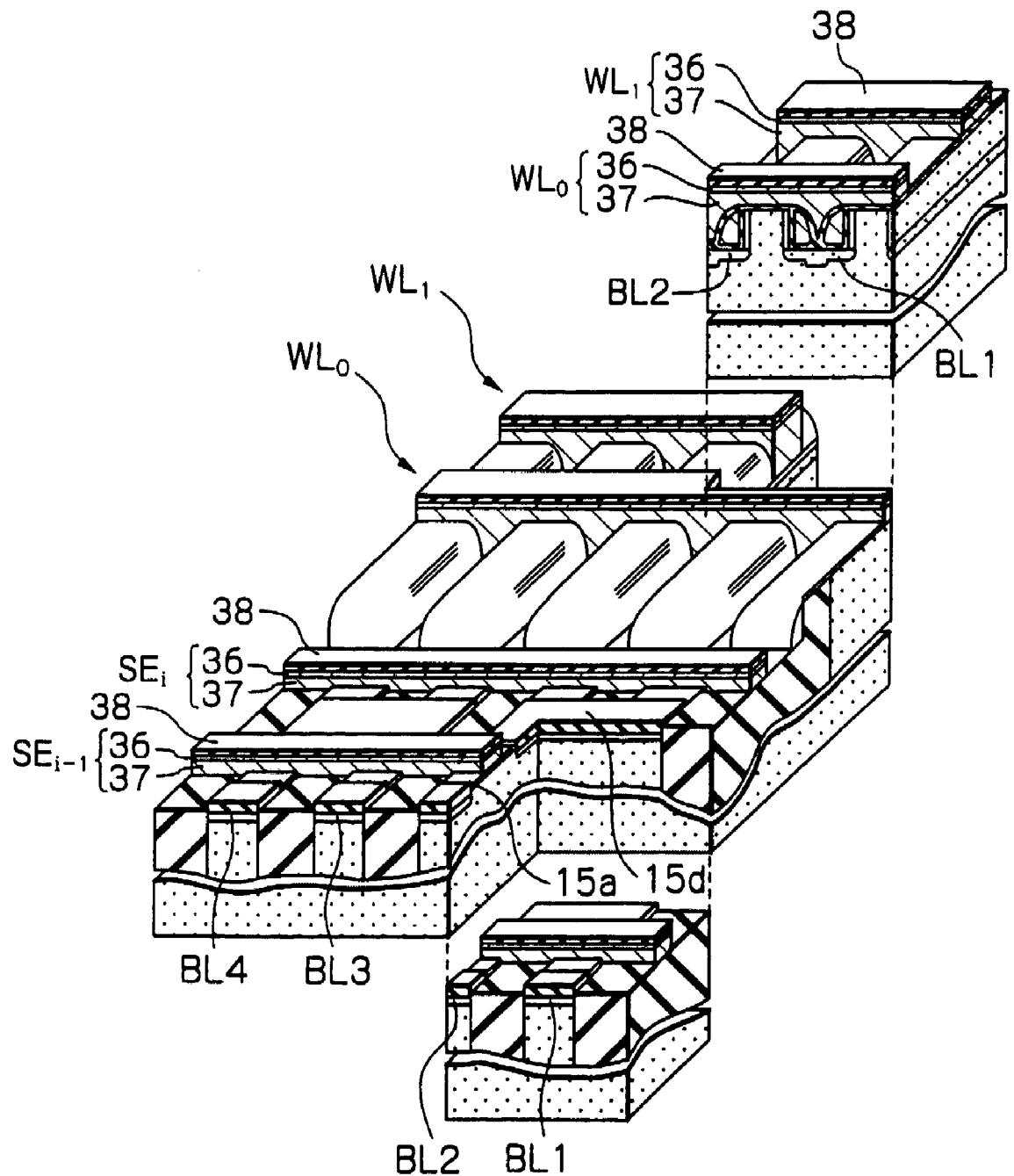

As shown in FIG. 31, after the step of FIG. 30, a polycrystalline silicon layer 37 is formed on the entire exposed surface of the laminate. Subsequently, WSi (tungsten silicide) layer 36 and a cap layer 38, which is implemented as a silicon oxide layer, are sequentially formed on the polycrystalline silicon layer 37 in this order. Thereafter, such layers lying one above the other are patterned to form the word lines $WL_0$ and $WL_1$ and even-bank select lines $SE_i$ and $SE_{i-1}$. The WSi layer 36 serves to lower the resistance of the above lines $WL_0$, $WL_1$, $SE_i$ and $SE_{i-1}$.

Figure 32:
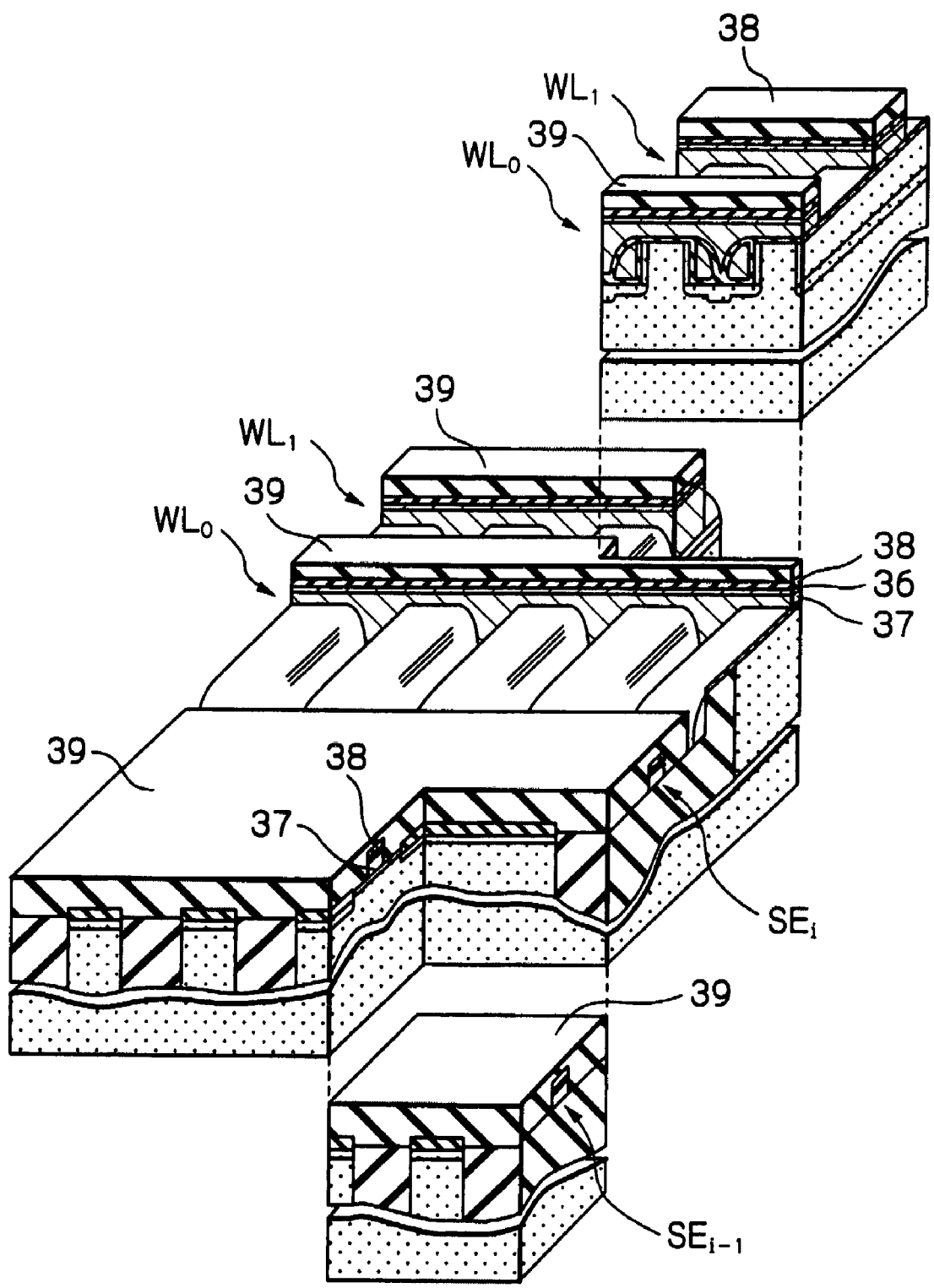

As shown in FIG. 32, after the step of FIG. 31, a photoresist layer 39 is coated on the entire surface of the laminate and then subject to photolithography to remain only on the word lines $WL_0$ and $WL_1$ and select transistor portions 334.

Figure 33:
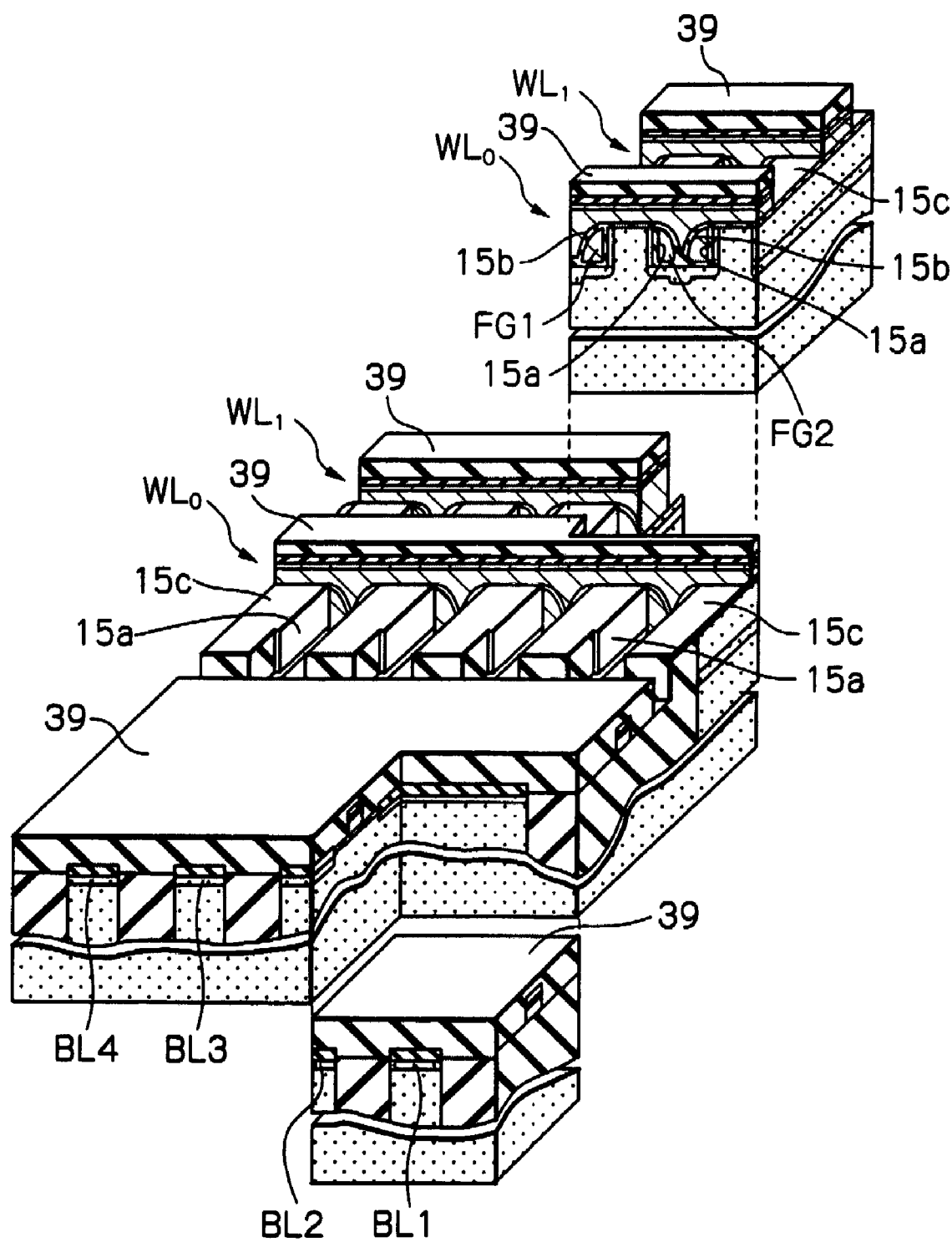

Subsequently, as shown in FIG. 33, the portions of the inter-polycrystalline insulation layers 15$b$ not covered with the word lines $WL_0$ and $WL_1$ are removed by etching with the photoresist layer 39 serving as a mask. At this instant, the gate insulation layers 15$c$ between the word lines $WL_0$ and $WL_1$ are slightly etched as well. Further, the portions of the floating gates FG1 and FG2 not covered with the word lines $WL_0$ and $WL_1$ are removed by etching by use of a different etchant.

Figure 34:
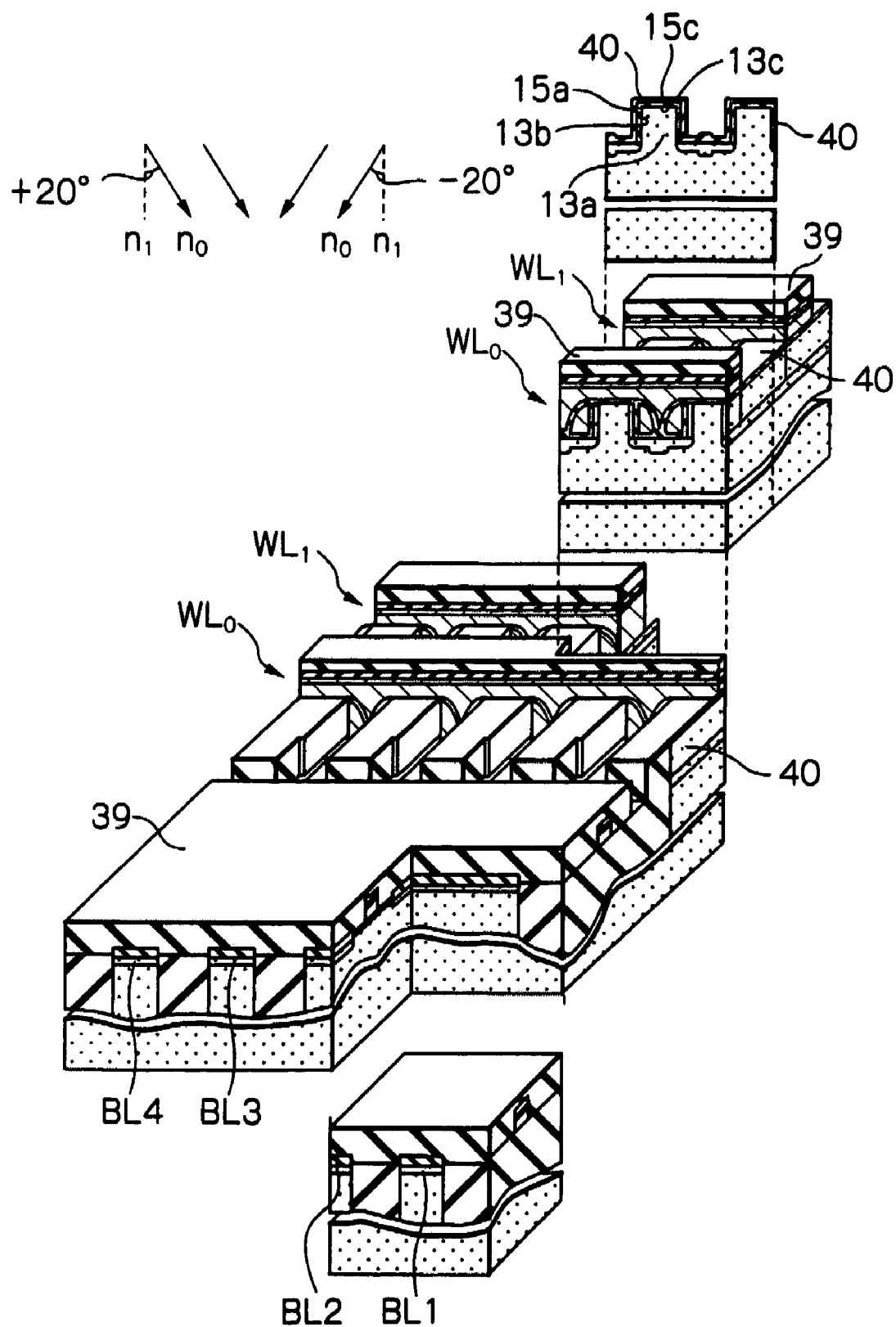

As shown in FIG. 34, after the step of FIG. 33, an isolation region 40 is formed on the side walls 13$b$ and top 13$c$ of each projection 13$a$, which are not covered with the word lines $WL_0$ and $WL_1$. While the side walls 13$b$ and top 13$c$ form a channel region below the associated word line $WL_0$ or $WL_1$, the isolation region 40 electrically isolates such channels below nearby word lines $WL_0$ and $WL_1$. To form the isolation regions 40, boron ions are implanted over the photoresist layer or mask 39. At this instant, the substrate 12 is tilted relative to the direction of implantation such that the isolation regions 40 are formed on the side walls 13$b$ of the projections 13$a$. In the illustrative embodiment, the line $n_1$ normal to the P type silicon substrate 12 is tilted by about +/−20° relative to the direction of implantation $n_0$, as stated earlier. More specifically, $BF_2$, which is a seed, is implanted with acceleration energy of 20 keV in a dose of $1.0 \times 10^{13}$ cm$^{-2}$.

Figure 35:
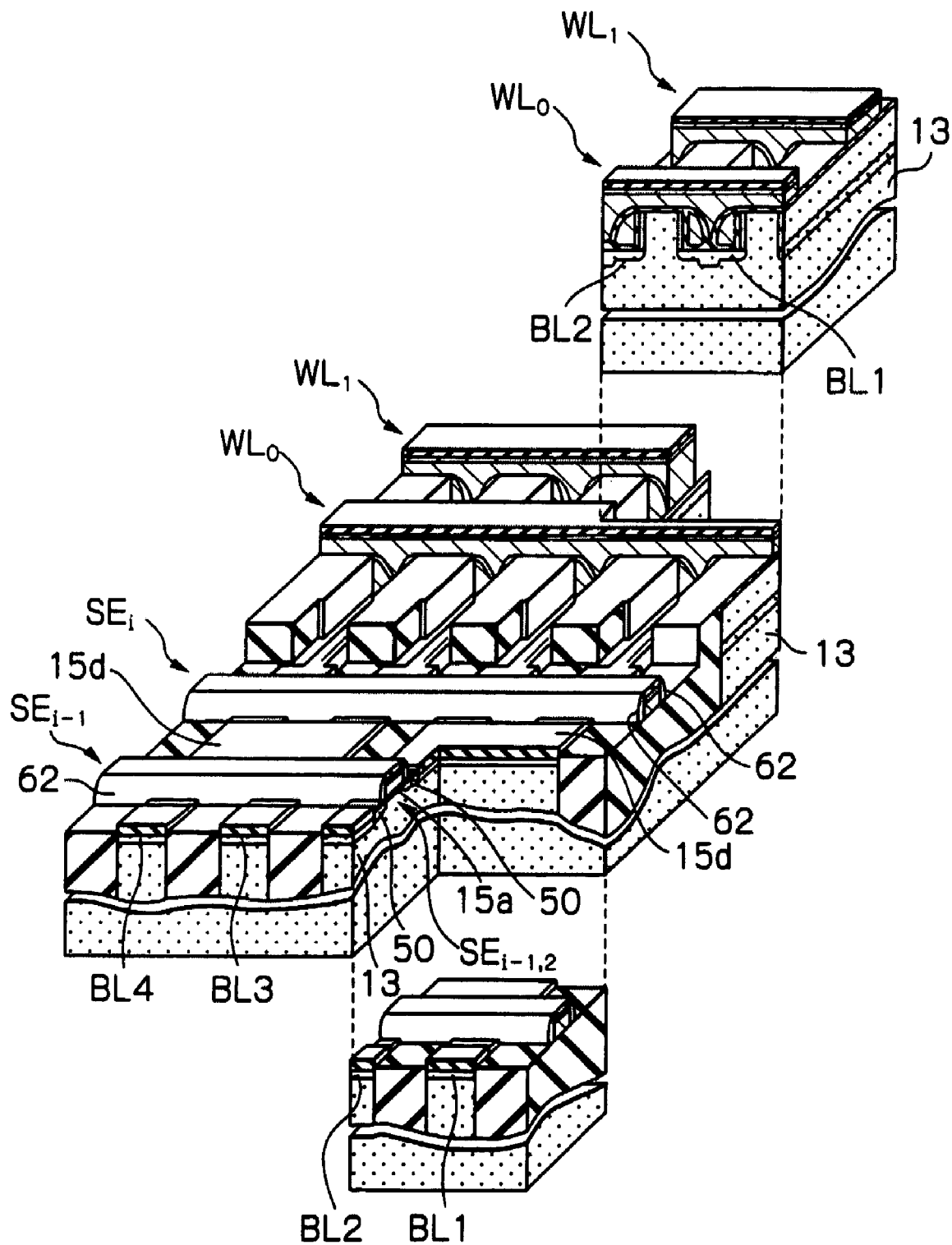

As shown in FIG. 35, after the step of FIG. 34, the photoresist layer 39 is removed by ashing. Subsequently, arsenic ions with low concentration are implanted in the P type well 13 at both sides of each of the even-bank select lines $SE_i$ and $SE_{i-1}$. This is followed by a step of forming side wall insulation layers 62, which may be silicon oxide layers, on the sides of each of the even-bank select lines $SE_i$ and $SE_{i-1}$ by a conventional method. Thereafter, arsenic ions with high concentration are implanted with the side wall insulation layers 62 serving as a mask, thereby forming the even-bank select transistors $STE_{i,j}$ each having source/drain regions 50 provided with an LDD (Lightly Doped Drain) structure. In each even-bank select transistor $STE_{i,j}$, the tunnel insulation layer 15$a$ play the role of a gate insulation layers.

Referring again to FIG. 9, after the step of FIG. 35, a silicon oxide layer or similar interlayer insulation layer, not shown, is formed on the entire laminate. Subsequently, a contact hole is formed in the interlayer insulation layer and selective oxide layer 15$d$, and then the conductive plug 63 is buried in the contact hole. The conductive plug 63 may be provided with a TiN (titanium nitride) and W (tungsten) double-layer structure by way of example. Thereafter, an aluminum layer is formed on the interlayer insulation layer and then patterned to form the virtual ground line $VG_4$ electrically connected to the plug 63. By the sequence of steps described above, the semiconductor memory of the illustrative embodiment is completed.

An alternative embodiment of the present invention will be described hereinafter. In the alternative embodiment, structural elements identical with those of the previous embodiment are designated by identical reference numerals and will not be described specifically in order to avoid redundancy.

Generally, a semiconductor memory includes drive transistors for driving cell transistors. In the illustrative embodiment, despite that the drive transistors are positioned at a different level or height from the select transistors STE and STO, the former and latter are formed by the same step. Also, in the illustrative embodiment, insulation layers for protection are formed on the ends of the projections in the direction of column. These insulation layer are formed by the same step as the side wall insulation layers positioned on the LDD transistors included in the semiconductor memory, i.e., the drive transistors and select transistors STE and STO in the illustrative embodiment.

Further, in the illustrative embodiment, the cell transistors TC arranged in a plurality of arrays in the direction of row are divided into a plurality of blocks. A device isolation region STIa (see FIG. 36) is positioned between nearby cell transistor blocks. Further, metal wires (first metal wires hereinafter) each extend in the direction of row and is connected to the control gate CG in a plurality of device isolation regions STIa. In this configuration, data can be written to or read out of a plurality of cell transistors TC belonging to different blocks in parallel.

In the illustrative embodiment, as in the previous embodiment, the cell transistors belonging to each bank share a channel region. Device isolation regions STIb are positioned at the ends of each bank, so that nearby banks are isolated from each other. The illustrative embodiment also uses the virtual grounding system. More specifically, metal wires, i.e., virtual ground lines (sometimes referred to as second metal wires hereinafter) each extend in the direction of column and is connected to the source/drain regions at a plurality of connecting portions assigned to a bank.

The illustrative embodiment additionally includes metal wires or third metal wires 306 (see FIG. 37) each extending in the direction of column. The third metal wires 306 are connected to the source/drain regions between nearby control gates for thereby lowering the resistance of the source/drains in the direction of column in cooperation with the virtual ground lines. The third metal wires each are assigned to a particular bank.

Figure 36:
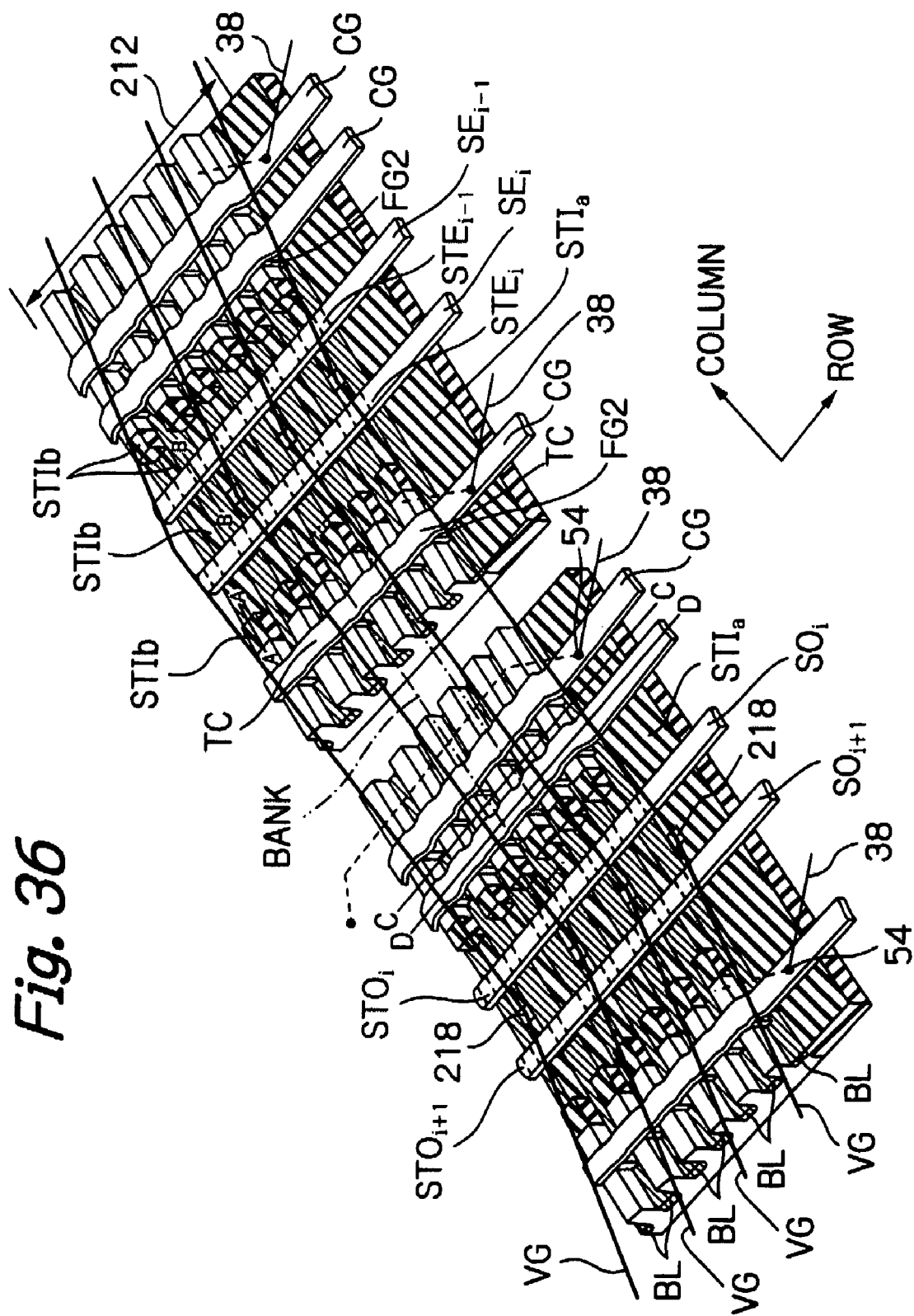
FIG. 36 is a perspective view showing an alternative embodiment of the semiconductor memory in accordance with the present invention.
Figure 37:
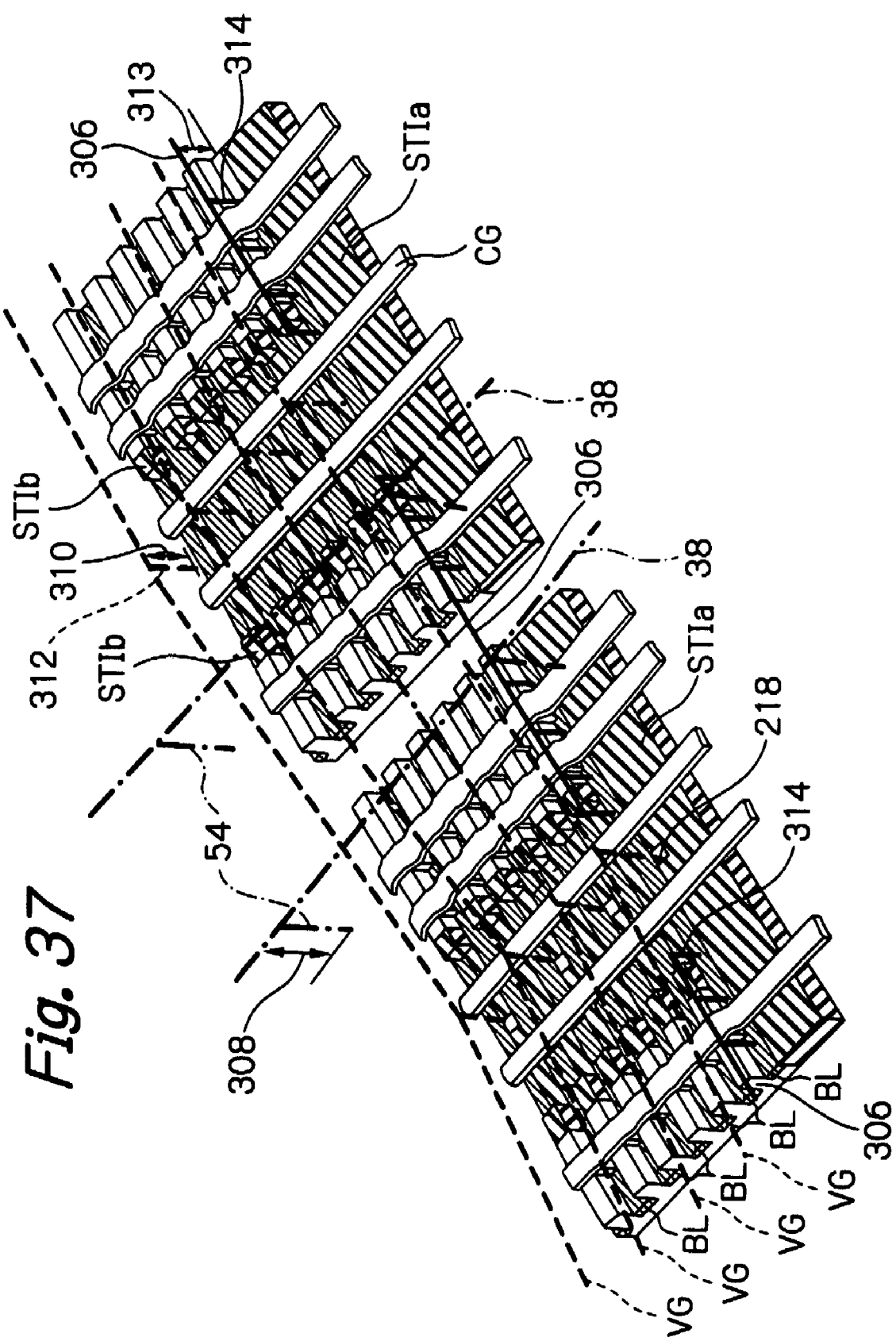
FIG. 37 is a perspective view showing three different kinds of metal wires included in the alternative embodiment.

Reference will be made to FIGS. 36 and 37 for describing the arrangement of the three different kinds of metal wires more specifically. FIG. 36 is a perspective view showing a semiconductor memory using the virtual grounding system of the illustrative embodiment and also having the circuit configuration of FIG. 8. FIG. 36 shows the device isolation region STIa and first metal wires 38 connected to the control gates CG in the regions STIa in addition to the cell transistors TC, which constitute the banks BNK shown in FIG. 8. In FIG. 36, the device isolation regions STIb on the ends of the projections in the direction of column are shown, but the insulation layers for protection on the ends of the regions STIb are not shown for the sake of simplicity of illustration. The side wall insulation films on the select transistors STE and STO are also not shown for the same reason. Such structural elements not shown in FIG. 36 will be described later in detail.

The device isolation region STIa is significant for the following reasons. The cell transistors TC should preferably be divided into a plurality of blocks 212 in order to promote rapid writing and reading. The device isolation region STIa is positioned between nearby ones of the blocks 212 each extending in the direction of row. Each block 212 includes, e.g., thirty-two or sixty-four cell transistors TC whose sources and drains BL are serially connected in the direction of row. In each block, the control gates CG of a plurality of cell transistors TC are interconnected.

The significance of the device isolation region STIa will be described more specifically hereinafter. Assume that the sources and drains BL of a plurality of cell transistors TC are connected in series. Then, when data are written to some of those transistors TC at the same time, it is likely that the data are written even to unexpected cell transistors. This problem can be solved if the cell transistors TC are divided into a plurality of blocks 212 by the device isolation regions STIa and if data are allowed to be written only to the cell transistors TC belonging to different blocks 212 at the same time. In addition, this configuration maintains the writing speed high. Further, if data are read out only of the cell transistors TC belonging to different blocks 212 at the same time, then there can be obviated an occurrence that a current flows to the cell transistors TC other than expected one.

The device isolation regions STIa should preferably be implemented as STI regions that occupy a minimum of area and therefore reduce the overall size of the semiconductor memory.

In the illustrative embodiment, the previously mentioned first metal wires or conductors 38 are formed of, e.g., aluminum, and each connects the control gates CG of a plurality of cell transistors TC to each other. Contacts 54 each connect one of the aluminum wires 38 to the associated control gate CG and may be positioned above the device isolation region STIa. The conductors 38 serve to lower the resistance of the control gates CG The device isolation regions STIb, which are also provided with the STI structure, are arranged in the direction of column, and each intervenes between nearby banks BNK. The virtual ground lines VG are connected to the bit lines BL at points 218.

FIG. 37 shows the three kinds of metal wires VQ 38 and 306 more specifically. The metal wires VHQ 38 and 306 all are formed of, e.g., aluminum. As shown, the second metal wires VG are arranged in a layer below the first metal wires 38 while the third metal wires 306 are arranged in a layer below the second metal wires VG Therefore, the first metal wires 38 and third metal wires 306 are respectively positioned at the highest level 308 and lowest level 313, as measured from the substrate surface, while the second metal wires 310 are positioned at the middle level 310.

The first metal wires 38 each are connected to a particular control gate CG via a plug 54 at opposite ends of each block 212. The second metal wires VG each are connected to particular select transistors STE and STO via plugs 312. The third metal wires 306 each are connected to particular source/drain regions BL via plugs 314, which are positioned between nearby control gates CG While the third metal wires 306 are shown as being positioned only above one bit line BL at the ends of the blocks 212, they are, of course positioned above the other bit lines BL as well.

The illustrative embodiment is identical with the previous embodiment in that the cell transistors CT adjoining each other in the direction of row share the same source/drain region intervening between them, and in that a high-concentration region of the same conductivity type as the source/drain regions intervenes between the source/drain regions and is shared by a plurality of cell transistors arranged in the direction of column.

A procedure for manufacturing the semiconductor memory of the illustrative embodiment will be described with reference to FIGS. 38A through 47B. In the illustrative embodiment, the cell transistors can be produced in parallel with CMOS transistors constituting the drive transistors. For this reason, a procedure for producing CMOS transistors will be described together with a procedure for producing the cell transistors. In the figures, a CMOS transistor portion CM refers to a position where a CMOS transistor is expected to be formed while a cell transistor portion CT refers to a portion where a cell transistor is expected to be formed. How the device isolation regions STIb are formed will be described together with the above procedures.

Figure 38A:
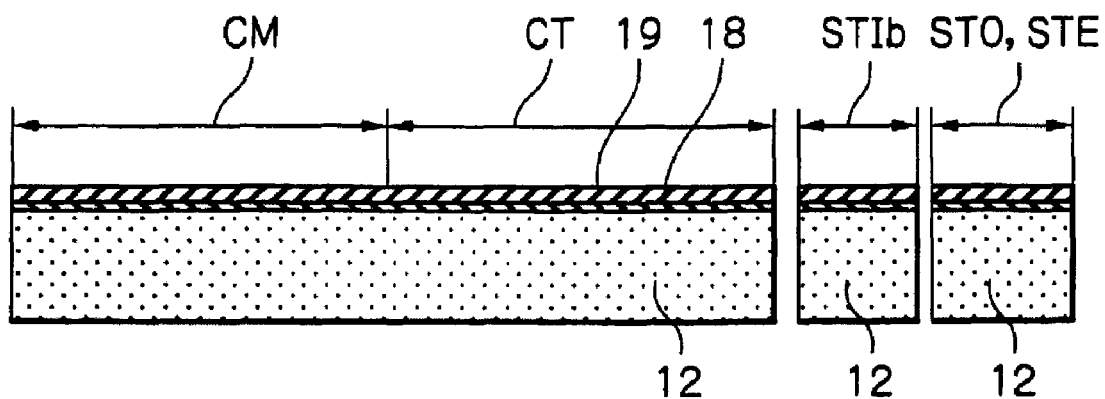
Figure 38B:
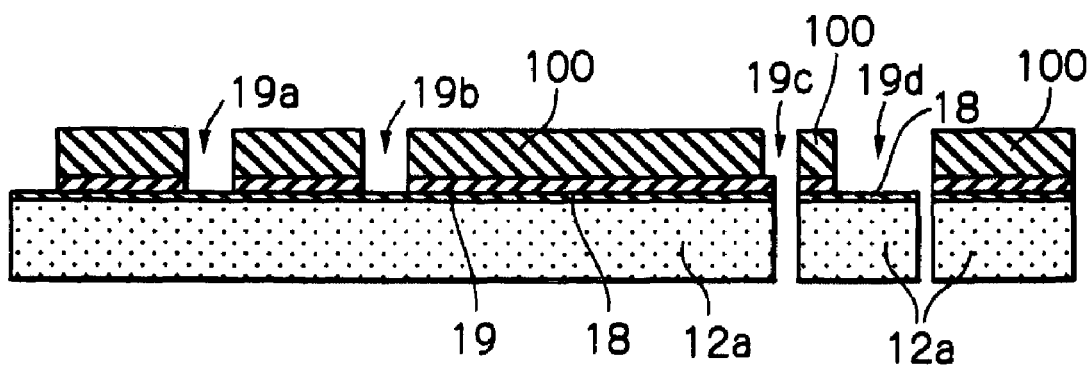

FIGS. 38A and 38B each show the following three sections. The left section is a section as seen in the direction of row, showing the cell transistor portion CT. The middle section is a section as seen in a direction AA of FIG. 36, showing the device isolation region STIb in the direction of column. The right section is a section as seen in a direction BB of FIG. 36, showing the bank select transistor STO or STE in the direction of column. FIGS. 39A through 57 also show the device isolation region STIb and bank select transistor STO or STE in sections together with the cell transistor portion CT.

First, as shown in FIG. 38A, a P⁻ type or one conductivity type silicone substrate 12 is prepared. In the illustrative embodiment, the boron concentration of the substrate 12 is $1.0 \times 10^{16}$ cm$^{-3}$. After a silicon thermal oxide layer 18 has been formed on the primary surface of the substrate 12, a silicon nitride film 19 is formed on the oxide layer 18. Steps shown in FIGS. 38A through 40B are effected to form the device isolation regions STIa and STIb in the directions of row and column, respectively.

Subsequently, as shown in FIG. 38B, a photoresist layer 100 is coated on the silicon nitride layer 19 and then patterned by development and exposure. The silicon nitride layer 19 is patterned via the resulting photoresist pattern to form openings 19a through 19d. The opening 19a is formed in the device isolation region between CMOS transistors in the CMOS transistor portion CM. The opening 19b is formed in the device isolation region between the CMOS transistor portion CM and the cell transistor portion CT. The opening 19c is formed in the device isolation region STIa extending in the direction of row in the cell transistor portion CT. Further, the opening 19d is formed in the device isolation region STIB extending in the direction of column in the cell transistor portion CT.

Figure 39A:
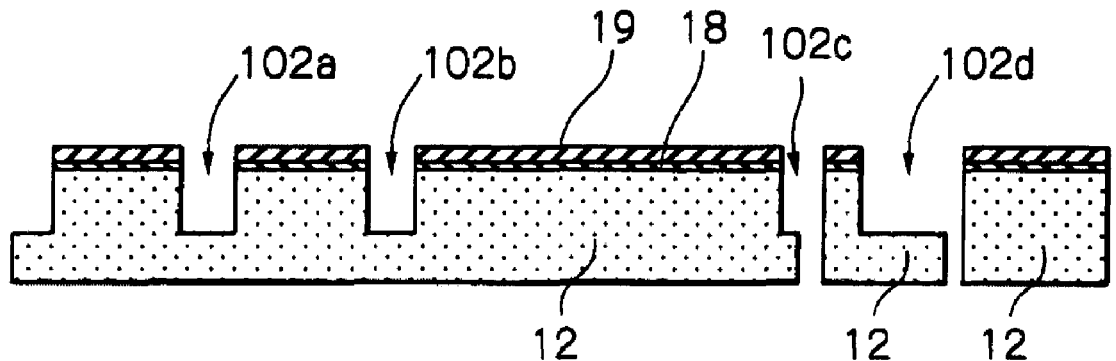

FIG. 39A shows a step to follow the step of FIG. 38B. As shown, after the resist pattern 100 has been removed, the silicon oxide layer 18 and silicon substrate 12 are etched with the pattern silicon nitride layer 19 serving as a mask, so that openings 102a through 102d are formed. Subsequently, as shown in FIG. 39b, silicon oxide 104 for device isolation is deposited to thickness of, e.g., 400 nm by CVD, burying the openings 102a through 102d.

Figure 39B:
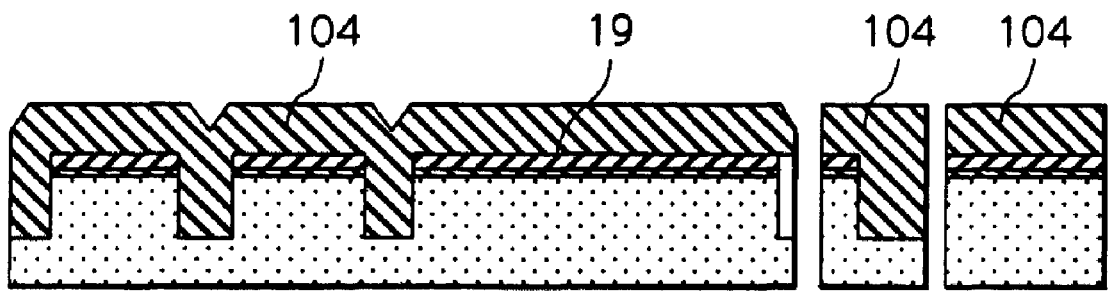
Figure 40A:
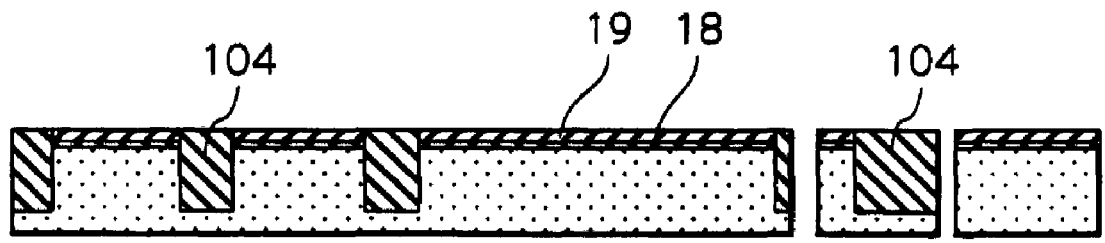
Figure 40B:
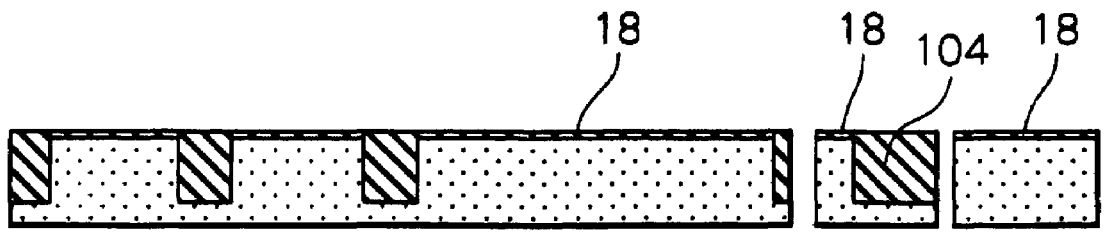

As shown in FIG. 40A, after the step of FIG. 39B, the silicon oxide layer 104 is polished by CMP (Chemical Mechanical Polishing) and flattened thereby. The polishing is stopped halfway in the nitride layer 19. Thereafter, as shown in FIG. 40B, the nitride layer 19 is removed, and the oxide layer 18 is flattened.

Figure 41A:
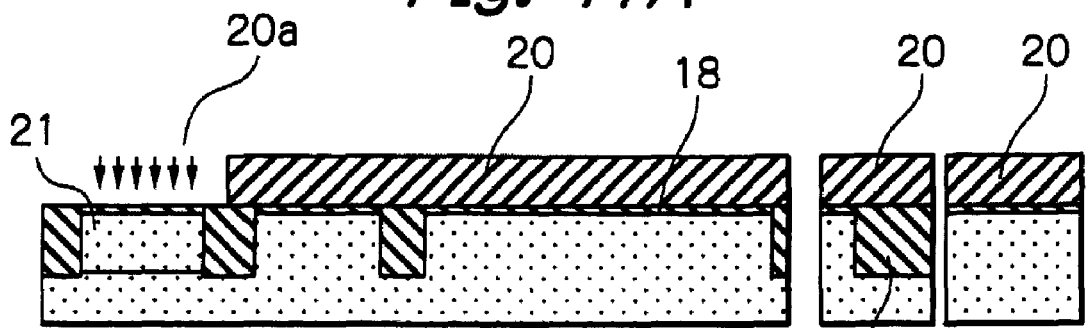

As shown in FIG. 41A, after the step of FIG. 39B, a photoresist layer 20 is coated on the entire surface of the laminate and then exposed and developed to form an opening 20a in the CMOS transistor portion CM. Subsequently, arsenic ions and phosphor ions are implanted independently of each other to form an N type well 21 beneath the opening 20a. At this instant, the arsenic ions and phosphor ions are implanted to a deep position and a shallow position, respectively.

Figure 41B:
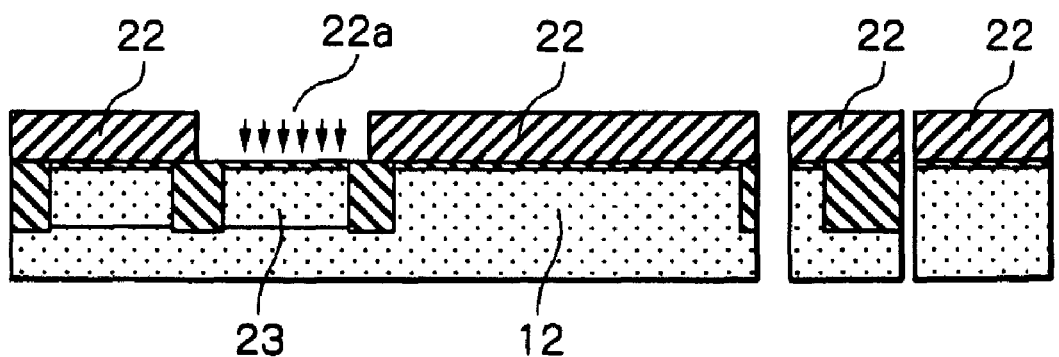

As shown in FIG. 41B, after the formation of the N type well 21, the photoresist layer 20 is removed. Subsequently, a new photoresist layer 22 is coated on the entire surface of the laminate and then exposed and developed to form an opening 22a in the CMOS transistor portion CM. Thereafter, $BF_2$ ions and boron ions are implanted over the photoresist layer or mask 22 independently of each other to thereby form a P type well 23 beneath the opening 22a. At this instant, the boron ions and $BF_2$ ions are implanted to a deep position and a shallow position, respectively. After the formation of the P type well 23, the photoresist layer 22 is removed.

Figure 42A:
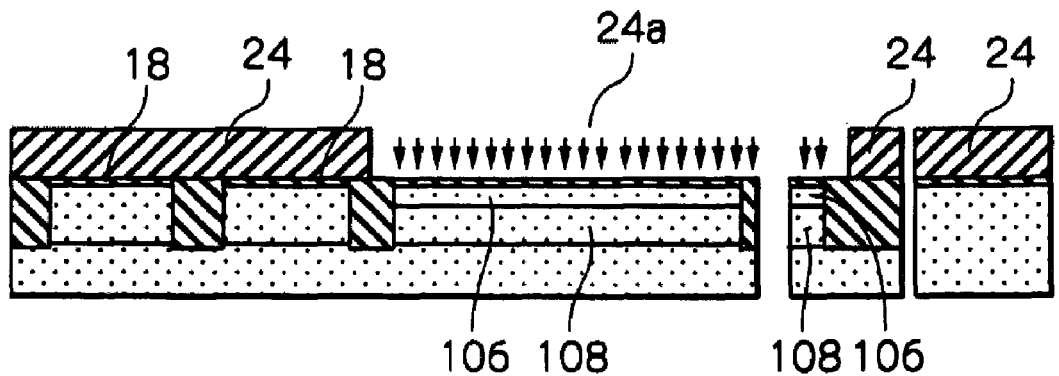

Subsequently, as shown in FIG. 42A, a photoresist layer 24 is coated on the entire surface of the laminate and then exposed and developed to form an opening 24a in the cell transistor portion CT. Thereafter, $BF_2$ ions and boron ions are implanted over the photoresist layer or mask 24 independently of each other, forming a P type layer 106 and a $P^+$ type layer 108 at a shallow position and a deep position, respectively. Boron ions and $BF_2$ ions are implanted to a deep position and a shallow position, respectively. More specifically, $BF_2$ ions, which is a seed, are implanted with acceleration energy of 35 keV in a dose of $4.0\times10^{11}$ $cm^{-2}$ while B (boron) ions, which is also a seed, are implanted with acceleration energy of 20 keV in a dose of $2.0\times10^{12}$ $cm^{-2}$. The P type layer 106 forms the channel of the transistor. The $P^+$ type layer serves to protect the cell transistor from punch-through.

Figure 42B:
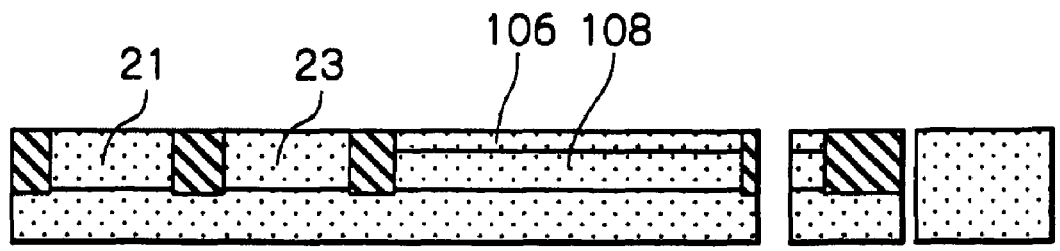

As shown in FIG. 42B, after the photoresist layer 24 has been removed, the silicon oxide layer 18 is removed by etching.

As shown in FIG. 43A, after the step of FIG. 42B, the surface of the substrate 12 is again thermally oxidized to form a gate insulation layer 15c, which is about 3 nm thick.

Subsequently, an about 20 nm thick, gate insulation layer 15e, which is a silicon nitride layer, an about 20 nm thick, silicon oxide layer 110a, an about 20 nm thick, silicon nitride layer 110b, an about 4 nm thick silicon oxide layer 110c, an about 100 nm thick, silicon nitride layer 110d and an about 50 nm silicon oxide layer 110e are sequentially stacked on the gate insulation layer 15c in this order. The functions of these layers will become apparent from the description of steps to follow. Such layers all are formed by CVD.

As shown in FIG. 43B, after the step of FIG. 43A, a photoresist layer, not shown, is coated on the silicon oxide layer 110e on the top of the laminate and then exposed and developed to form stripe-like openings not shown. Subsequently, the silicon oxide layer 110e is etched via the above openings to thereby form stripe-like openings 45a and 45b. The openings 45a are formed at positions where the source/drain regions of the cell transistor will be formed. The opening 45b is formed at a position where the device isolation region STIb and bank select transistor STO or STE will be formed.

As shown in FIG. 44A, after the photoresist layer used in the step of FIG. 43B has been removed, the silicon nitride layer 110d is removed by anisotropic etching via the openings 45a and 45b. This is followed by the steps of etching the silicon oxide layers 110e and 110c, removing the silicon nitride layer 110b by RIE, and then etching the silicon oxide layer 110a. Further, after the silicon nitride layer 15e has been removed by RIE, trenches 28 are formed in the P and $P^+$ type layers 106 and 108, which are silicon layers. While the size of each trench 28 is open to choice, it is about 40 nm deep in the illustrative embodiment. Also, the distance between nearby trenches 28, i.e., the width of each projection 13a is about 130 nm.

As shown in FIG. 44B, after the step of FIG. 44A, an about 20 nm thick, silicon oxide layer 29 is formed on the entire exposed surface of the laminate by CVD.

As shown in FIG. 45A, the silicon oxide layer 29 is anisotropically etched by RIE in the direction of thickness with the result that the silicon oxide film 29 is removed except for its portions covering the side walls 13b of the projections 13a. This is followed by thermal oxidation for forming 3 nm thick, silicon oxide layers 114 on the bottoms of the trenches 28.

Subsequently, as shown in FIG. 45B, a photoresist layer 112 is coated on the laminate and then exposed and developed by using a mask. As a result, the photoresist layer 112 is removed except for its portions present in the CMOS transistor portion and STI portion positioned at the right-hand side. Thereafter, arsenic ions are implanted two times over the photoresist layer or mask 112 to thereby form $N^+$ type layers, which constitute the bit lines BL1, BL2 and so forth, on the bottoms of the trenches 28. More specifically, arsenic ions are implanted with acceleration energy of 10 keV in a dose of $1.5\times10^{14}$ $cm^{-2}$ and then implanted with acceleration energy of 30 keV in a dose of $1.0\times10^{14}$ $cm^{-2}$. At this instant, the silicon oxide layers 29 left on the side walls 13b of the projection 13a prevent arsenic ions from being implanted in the side walls 13b. Further, the projections 13a, serving as a mask, allow the bit lines BL1, BL2 and so forth to be formed on the bottoms of the trenches 28 by self-alignment.

As shown in FIG. 46A, after the step of FIG. 45B, the silicon oxide layers 29 on the side walls 13b of the projections 13a and silicon oxide layers 114 on the bottoms are removed by etching. Subsequently, as shown in FIG. 46B, arsenic ions are implanted in the side walls 13b to thereby form N type regions 17 of counter conductivity type. Again, to implant arsenic ions in the side walls 13b, the substrate 12 should only be inclined relative to the direction of ion implantation. In the illustrative embodiment, the line $n_1$ normal to the P type silicon substrate 12 is inclined by about +/−20° relative to the direction of ion implantation $n_0$. More specifically, arsenic ions are implanted with acceleration energy of 15 keV in a dose of $2.0 \times 10^{12}$ cm$^{-2}$.

Figure 47A:
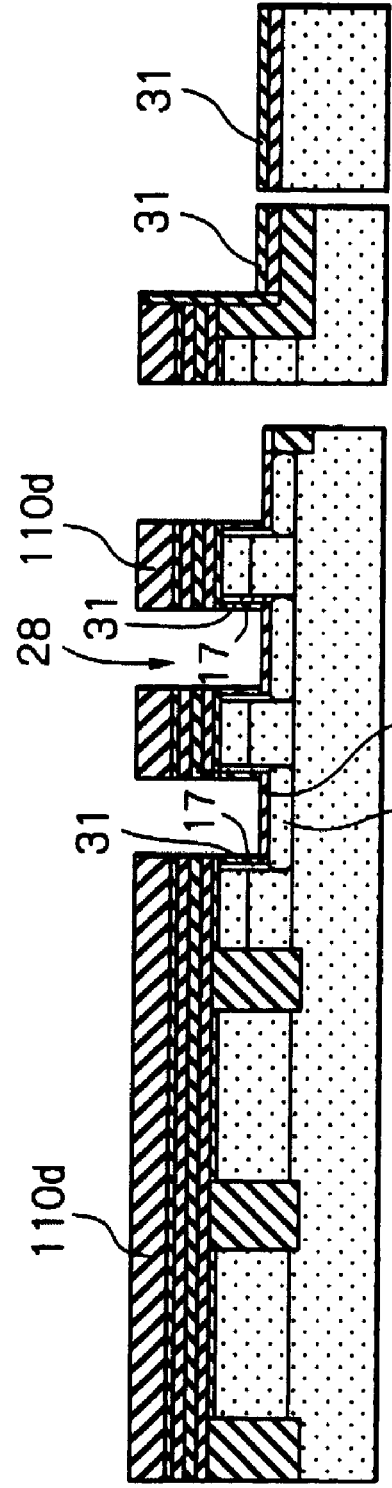

Again, the surface layers of the trenches 28 are expected to implement the channel of the device, so that the property of the surface layers has critical influence on the device characteristics. It is therefore necessary to protect the surfaces of the trenches 28 from contamination in the steps to follow. For this purpose, as shown in FIG. 47A, the illustrative embodiment forms an about 4 nm thick, sacrifice silicon oxide layer 31 on the sides and bottoms of the trenches 28 by thermal oxidation. The sacrifice silicon oxide layer 31 successfully protects the surfaces of the trenches 28 from contamination. Moreover, this layer 31 serves to remove a lattice defect particular to the surface layers of the trenches 28, thereby preventing the device characteristics from being degraded.

Figure 47B:
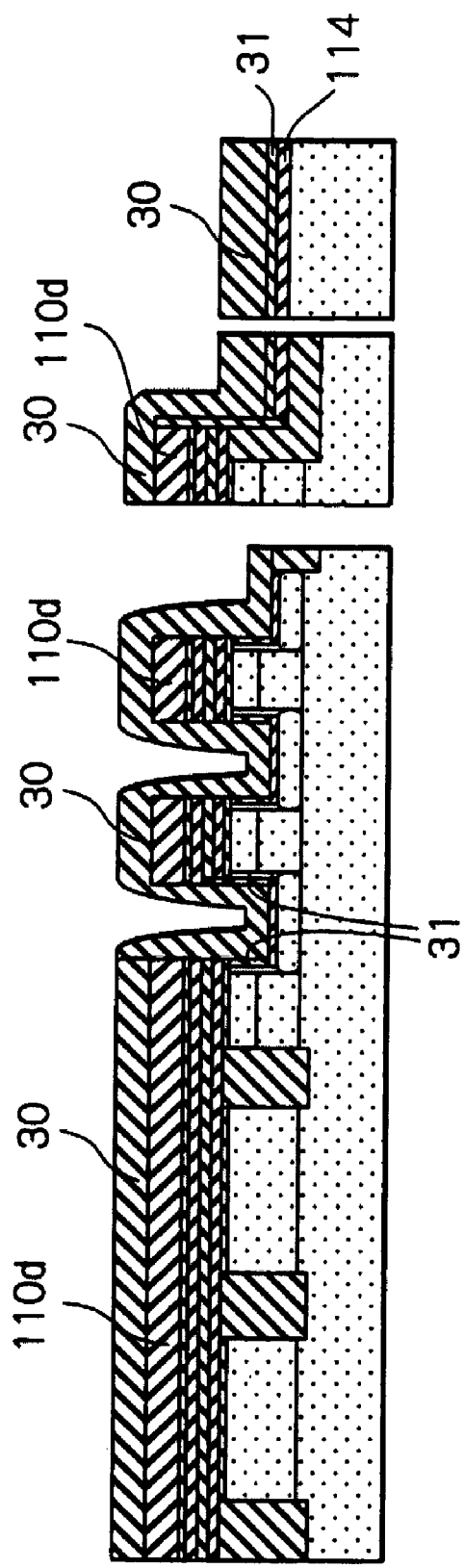

Subsequently, as shown in FIG. 47B, an about 60 nm thick, silicon nitride layer 30 is formed on the entire exposed surface of the laminate inclusive of the inside of the trenches 28 by CVD. Thereafter, as shown in FIG. 48A, a photoresist layer 116 is coated and then has its portions corresponding to the source/drain regions of the cell transistor portion CT removed. This is followed by a step of anisotropically etching the silicon nitride film 30 over the photoresist layer or mask 116 to thereby form elongate openings 30a extending in the direction of column. It should be noted that the elongate openings 30a are smaller in width than the trenches 28. After the formation of the openings 30a, the sacrifice silicon oxide layer 31 and part of the bit lines BL1, BL2 and so forth are selectively etched by using the silicon nitride film 30 serving as an etching mask, to form recesses 32 in the bit lines BL1, BL2 and so forth. The recesses 32 are about 10 nm deep each.

After the above selective etching, arsenic ions are implanted in the bit lines BL1, BL2 and so forth via the elongate openings 30a. In FIG. 48A, the portions where arsenic ions are implanted, i.e., N$^+$ type regions are labeled 33. More specifically, As, which is a seed, is implanted with an acceleration energy of 40 keV in a dose of $5.0 \times 10^{15}$ cm$^{-2}$.

As shown in FIG. 48B, after the As implantation, the photoresist layer 116 is removed. Subsequently, the recesses 32 are subject to selective thermal oxidation by using the silicon nitride film 30 serving as a mask, to form selective oxide layers 234. Why the oxide layers 234 are swelled and thickened by such oxidation is that the breakdown voltage of the oxide layers 234 should be increased because the control gate CG and source/drain regions BL are closest to each other there.

As shown in FIG. 49A, after the step of FIG. 48B, the silicon nitride layers 30 and 110d are removed by etching. At this instant, the silicon oxide layer 110c and sacrifice silicon oxide layer 31 play the role of an etching stopper. Subsequently, as shown in FIG. 49B, the silicon oxide layer 110c and sacrifice silicon oxide layer 31 are removed by etching. At this time, the silicon nitride layer 110b plays the role of an etching stopper. This etching is effected to such a degree that the silicon oxide layer 110c and sacrifice silicon oxide layer 31 are fully removed, but the selective oxide layers 234 remain.

As shown in FIG. 50A, after the step of FIG. 49B, about 3 nm thick, tunnel insulation layers or plasma oxide layers 15a and about 3 nm thick, tunnel insulation layers or plasma nitride layers 15d are formed on the bottoms and sides of the trenches 28. The tunnel insulation layers should preferably be provided with desirable property because they have critical influence on the device operation. This is why the two plasma oxide layers 15a and 15d are stacked. To form the plasma oxide layers 15a, use may be made of the microwave excited, high density plasma device using a radial line slot antenna.

In the plasma device mentioned above, a Kr and O$_2$ mixture gas is introduced into the device. Krypton is excited by a microwave issuing from the radial line slot antenna and hits against O$_2$ for thereby generating a great amount of atomic state oxygen O*. The atomic state oxygen O* easily enters the surface layers of the trenches 28 and oxidize the bottoms and sides of the trenches 28 at substantially the same rate without regard to the plane direction. After the oxide layers have been formed, the feed of the mixture gas and the emission of the microwave are stopped, and then the device is exhausted.

Subsequently, the plasma nitride layers 15d are formed on the plasma oxide layers 15a by use of, e.g., the microwave excited, high density plasma device using a radial line slot antenna. In this case, a Kr and ammonia (NH$_3$) mixture gas is introduced into the device. Kr is excited by a microwave issuing from the radial line slot antenna and hits against NH$_3$ for thereby generating ammonia radials NH*. The ammonia radicals NH* form plasma nitride layers on the surfaces of the trenches 28 without regard to the plane direction of silicon.

As shown in FIG. 50B, after the formation of the tunnel insulation layers 15d, a polycrystalline layer or conductive layer 34 is formed on the tunnel insulation layers 15d and silicon nitride layers 110b. The polycrystalline silicon layer 34 is doped with phosphor (P) beforehand by an in-situ process. Why the polycrystalline silicon layer 34 is doped with P is that it is expected to constitute the floating gates FG1 and FG2 and should preferably be lowered in resistance. The polycrystalline silicon layer 34 is about 60 nm thick.

Subsequently, the polycrystalline silicon layer 34 is anisotropically etched in the direction of thickness such that it disappears on the silicon nitride layers 110b, but remains on the tunnel insulation layers 15d on the sides of the trenches 28. The tops of the polycrystalline silicon layers 34 on the sides of the trenches 28 are positioned at a higher level than the tops of the projections 13a. The polycrystalline silicon layers 34 left on the sides of the trenches 28 constitute the floating gates FG1 and FG2.

As shown in FIG. 51A, after the floating gates FG1 and FG2 have been formed, the silicon nitride layers 110b and silicon oxide layers 110a are removed by etching. Attention should be paid to the role that the silicon nitride layers 110b and silicon oxide layers 110a, FIG. 50B, have played up to this stage of production. The silicon nitride layers 110b and silicon oxide layers 110a have been formed on the gate insulation layer 15e in the step of FIG. 43A and have protected the gate insulation layers 15e up to the step of FIG. 50B.

The gate insulation layer 15e has critical influence on the device operation. In this respect, the silicon nitride layers 110b and silicon oxide layers 110a protect the gate insulation film 15e from being deteriorated during various processes including ion implantation, etching, and stacking of different kinds of layers.

Subsequently, as shown in FIG. 51B, the entire exposed surface of the laminate is oxidized by plasma oxidation stated earlier. As a result, the surfaces of the floating gates FG1 and FG2 are oxidized to become inter-polycrystalline insulation layers 15b. At this instant, a small amount of nitrogen is mixed with the oxide layers for thereby forming nitrogen layers as well. These nitrogen layers make the inter-polycrystalline insulation layers 15b thicker and thereby prevent boron from leaking. Further, an oxide layer 108 is formed on the device isolation region STIb extending in the direction of column and the bank select transistor STO or STE. The inter-polycrystalline insulation layers 15b are about 12 nm thick each.

As shown in FIG. 52A, after the step of FIG. 51B, a photoresist layer 35 is coated on the entire surface of the laminate and then exposed and developed to thereby form an opening 35a on the CMOS transistor portion CM. Subsequently, the gate insulation layers 15e and 15c on the CMOS transistor portion CM are etched over the photoresist layer or mask 35, so that the surfaces of the N type well 21 and P type well 23 of the CMOS transistor are exposed to the outside. Why the gate insulation layers 15e and 15c are so etched is that the gate insulation layers 15c have been disfigured by the preceding steps.

As shown in FIG. 52B, after the photoresist layer 35 has been removed, about 3 nm thick, gate insulation layers 120 are formed on the surfaces of the N type well 21 and P type well 23 of the CMOS transistor by plasma oxidation. At this instant, plasma oxidation additionally serves to transform carbon (C) present in the photoresist layer 35, which may be left on the surface of the inter-polycrystalline layer 15b, to $CO_2$ for thereby removing the photoresist layer 35.

Figure 53A:
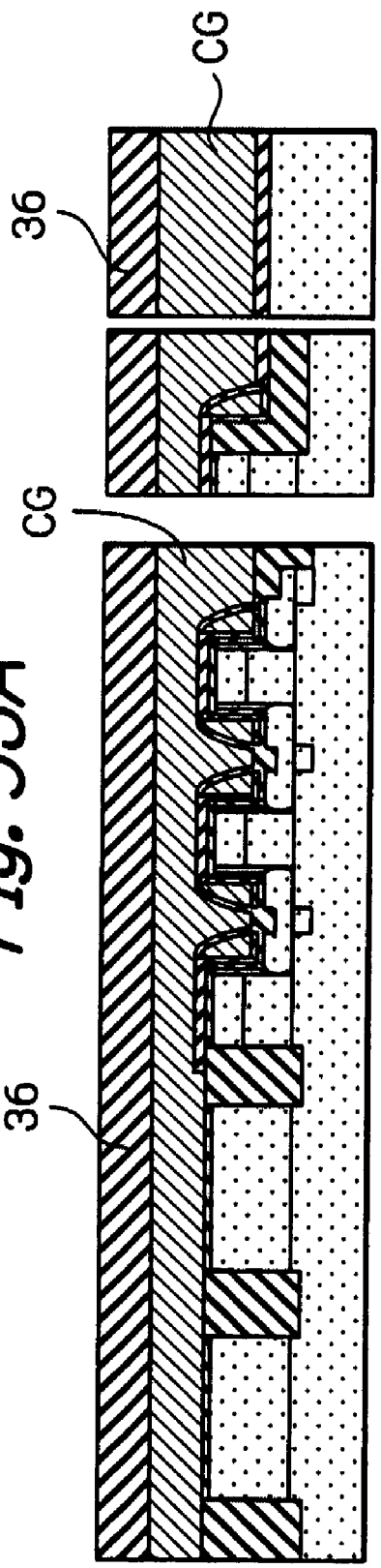

As shown in FIG. 53A, after the step of FIG. 52B, a polycrystalline silicon layer CG is formed by CVD and then has its surface polished by CMP and flattened thereby. After a WSi layer has been formed, a silicon oxide layer 36 is formed on the WSi layer. In FIG. 53A, the polycrystalline silicon layer CG and WSi layers overlying it are collectively labeled CG. By the step of FIG. 53A, a plurality of control gates CG each extending in the direction of row are formed. At the same time, gate electrodes 41 are formed on the P type well 23 and N type well 21 of the CMOS transistor portion. The gate electrodes 41 are mainly constituted by the polycrystalline silicone layer 37 and lowered in resistance by the WSi layer. The WSi layer is formed on the control gate CG also and therefore lowers the resistance of the control gate CG as well.

The silicon oxide layer 36 is formed on the polycrystalline silicon layer CG, as stated above, in order to pattern the polycrystalline silicon layer CG by using the silicon oxide layer 36 as a mask. This is more preferable than patterning the polycrystalline silicon layer CG by using a photoresist layer as a mask. The polycrystalline silicon layer CG is patterned by the following procedure.

Figure 53B:
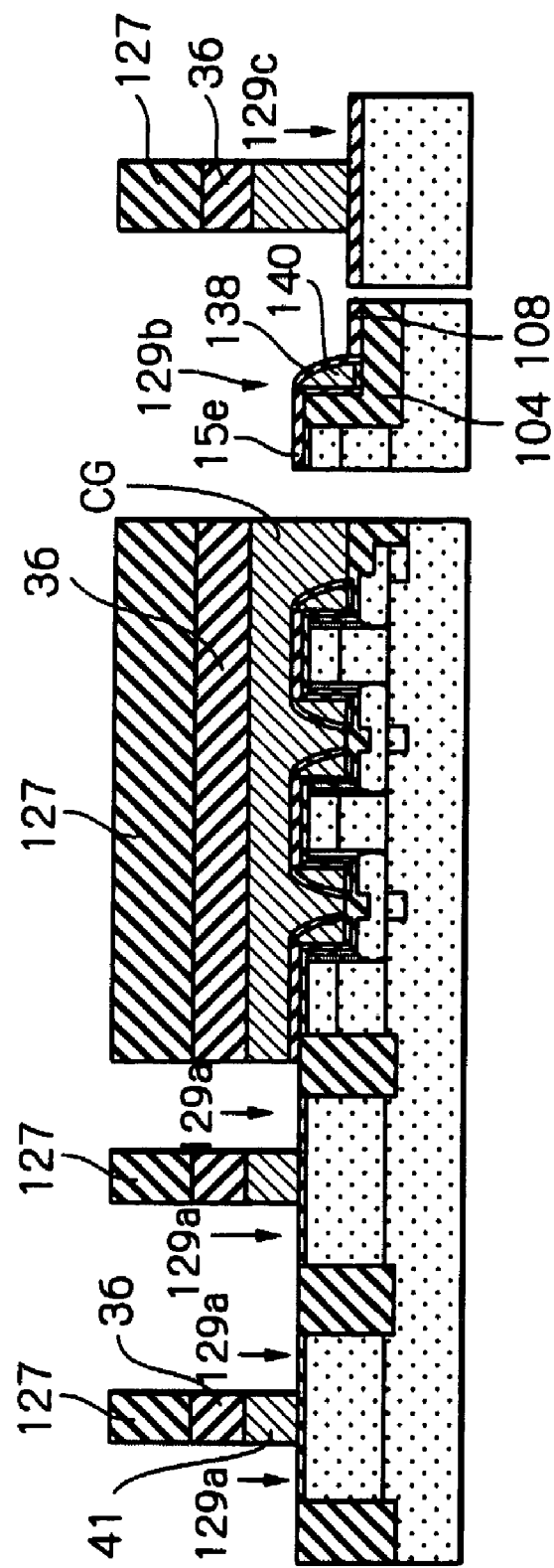

As shown in FIG. 53B, after a photoresist layer 127 has been coated and then exposed and developed in a preselected pattern, the silicon oxide layer 36 is patterned with the patterned photoresist layer 127 serving as a mask. Subsequently, the polycrystalline silicon layer CG is patterned with the patterned silicon oxide layer 36 serving as a mask. As shown in the figure, the polycrystalline silicon layer CG, i.e., the control gate CG is removed in portions 129a assigned to the source/drain regions of the CMOS transistor portion CM, a portion 129b assigned to the device isolation region STIb of the cell transistor portion CT, which extends in the direction of column, a portion 129c assigned to the source/drain region of the bank select transistor STO or STE, and the region 40, FIG. 34, between the control gates CG each extending in the direction of row.

Figures 54A, 54B:
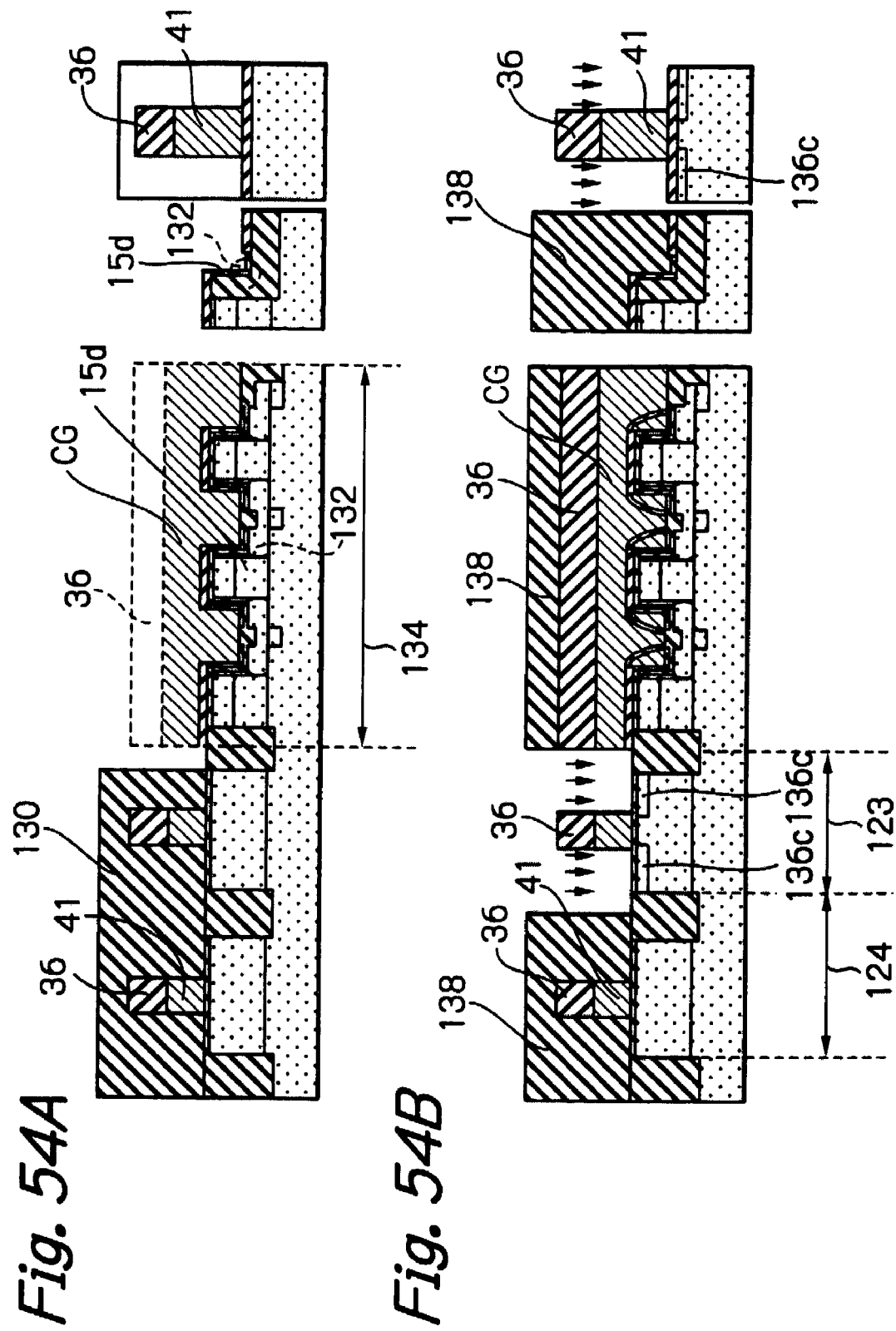

Subsequently, the inter-polycrystalline insulation layers 138 and polycrystalline silicon layers 140 left on the portions not covered with the control gates CG, i.e., the sides of the projections 13a present in the device isolation regions STIb and the sides of the projections 13a present in the device isolation region 40, FIG. 34, are removed. More specifically, as shown in FIG. 54A, after the photoresist layer 127 has been removed, a mask 130 is formed and then used as a mask for removing the inter-polycrystalline insulation layers 138 and polycrystalline silicon layers 140. A particular etchant is used for each of the inter-polycrystalline silicon layer 138 and polycrystalline silicon layer 140. In this manner, the floating gates FG1 and FG2 are removed from the portions not covered with the control gates CG As a result, the tunnel insulation layer 15d is exposed to the outside between nearby control gates CG After the removal of the polycrystalline silicone layer 140, the corners 132 of the silicon nitride layers 15d thus exposed are rounded by oxidation, i.e., an oxide is formed on the corners 132.

As for a region 134, only FIG. 54A shows the device isolation region 40 in a section in the direction of row, i.e., along line CC of FIG. 36 while FIGS. 38 through 47 show the region assigned to the source/drain regions of the cell transistor portion CT in sections in the direction of row, i.e., along line DD of FIG. 36.

FIG. 54B shows a step to follow the step of FIG. 54A and effected to form an N type MOS 123 and a P type MOS 124 of the CMOS transistor portion CM and bank select transistor STO or STE at the same time. By this step, there are additionally formed the protection insulation films 318 on the ends of the projections 13a and side wall insulation films 136b on the N type MOS 123 and P type MOS 124.

More specifically, as shown in FIG. 54B, after the photoresist layer 130 has been removed, a photoresist layer 138 is coated and then exposed and developed such that the portions of the layer 138 corresponding to the N type MOS 123 and bank select transistor STO or STE are opened. Subsequently, arsenic ions are implanted via the resulting openings of the photoresist layer 138 to thereby form LDDs 136c. At this instant, the silicon oxide layers 36 also serve as a mask.

Subsequently, as shown in FIG. 55A, LDDs 136c are formed in the P type MOS 124 in the same manner as in FIG. 54B. Thereafter, the side wall insulation layers 136b, which are implemented as silicon nitride layers, are formed on the projections 13a present in the P type MOS 124, N type MOS 123, bank select transistor STO or STE, and device isolation region STIb.

As shown in FIG. 55B, after the step of FIG. 55A, a photoresist layer 140 is coated on the laminate and then exposed and developed such that the portions of the layer 140 corresponding to the N type MOS 123 and bank select transistor STO or STE are open. Subsequently, arsenic ions are implanted via the resulting openings of the photoresist layer 140 to thereby form the source/drain regions 136a. The silicon oxide layer 36 plays the role of a mask during this step as well. Likewise, the source/drain regions 136a are formed in the P type MOS 124. In this manner, the N type MOS 123 and P type MOS 124 of the CMOS transistor portion CM and bank select transistor STO or STE are formed.

As shown in FIG. 56A, after the step of FIG. 55B, a BPSG (Boro-Phospho Silicate Glass) layer 36 is formed on the entire surface of the laminate and used to flatten the surface for aluminum wires. More specifically, after the BPSG layer 36 has been heated at high temperature to reduce the irregularity of the surface, the surface of the BPSG layer 36 is flattened by CMP.

Subsequently, as shown in FIG. 56B, holes are formed in the BPSG or silicon oxide layer 36 by use of a mask not shown. After tungsten plugs or contacts 54, 320 and 322 have been buried in the holes, the surface of the laminate is flattened by CMP. The tungsten plugs 54, 320 and 322 connect the control gate CG and Al layer 38 in the cell transistor portion CT and connect the source/drain regions and Al layers 324 and 326 in the CMOS transistor portion CM and bank select transistor STO or STE.

More specifically, as shown in FIG. 57, after the Al layers 38, 324 and 326 have been deposited by evaporation and then patterned, a silicon oxide layer 56 and a protection layer 58 are sequentially formed in this order. The second and third metal wires VG and 306 are formed before the projection layer 58, although not shown in FIG. 57. This is the end of the procedure for manufacturing the semiconductor memory of the illustrative embodiment.

As stated above, in the illustrative embodiment, the drive transistors are formed in the same step as the select transistors despite that the former and latter are different in level or height, reducing the number of steps.

Protection insulation layers are formed on the ends of the projections 13 in the direction of column at the same time as the LDD side wall insulation layers are formed on the transistor, i.e., without resorting to an additional step.

The cell transistors are divided into blocks in the direction of row while the control gates are connected to the metal wires extending in the direction of row in each STI region between nearby blocks. This substantially lowers the resistance of the control gates in the direction of row. Further, the cell transistors share a channel region in each bank while the banks are separated by the device isolation region STIB positioned at the end of each bank, as stated earlier. This configuration makes it possible to control the cell transistors bank by bank.

The virtual ground lines VG are connected to the source/drain regions in the connecting portions 218 associated with the banks, as stated earlier, so that the resistance of the source/drain regions is substantially lowered in the direction of column.

Writing or reading data to or out of a plurality of cell transistors belonging to different blocks at the same time is successful to increase the writing or the reading speed of the entire semiconductor memory.

Further, the third metal wires extending in the direction of column each are connected to the source/drain regions between the control gates adjoining each other in the direction of column. This configuration substantially lowers the resistance of the source/drain regions in the direction of column.

Moreover, the cell transistors adjoining each other in the direction of row share the source/drain region between them. The high concentration region 33 of the same conductivity type as the source/drain region exists in the intermediate portion of the source/drain region and is shared by a plurality of cell transistors arranged in the direction of column. The high concentration region 33 itself has low resistance and therefore substantially lowers the resistance of the source/drain region in the direction of column.

While the floating gates FG1 and FG2 each are provided with a sectorial shape in the illustrative embodiments shown and described, such a shape is only illustrative. Other alternative embodiments of the present invention in which the floating gates FG1 and FG2 are not sectorial will be described hereinafter.

Figure 58:
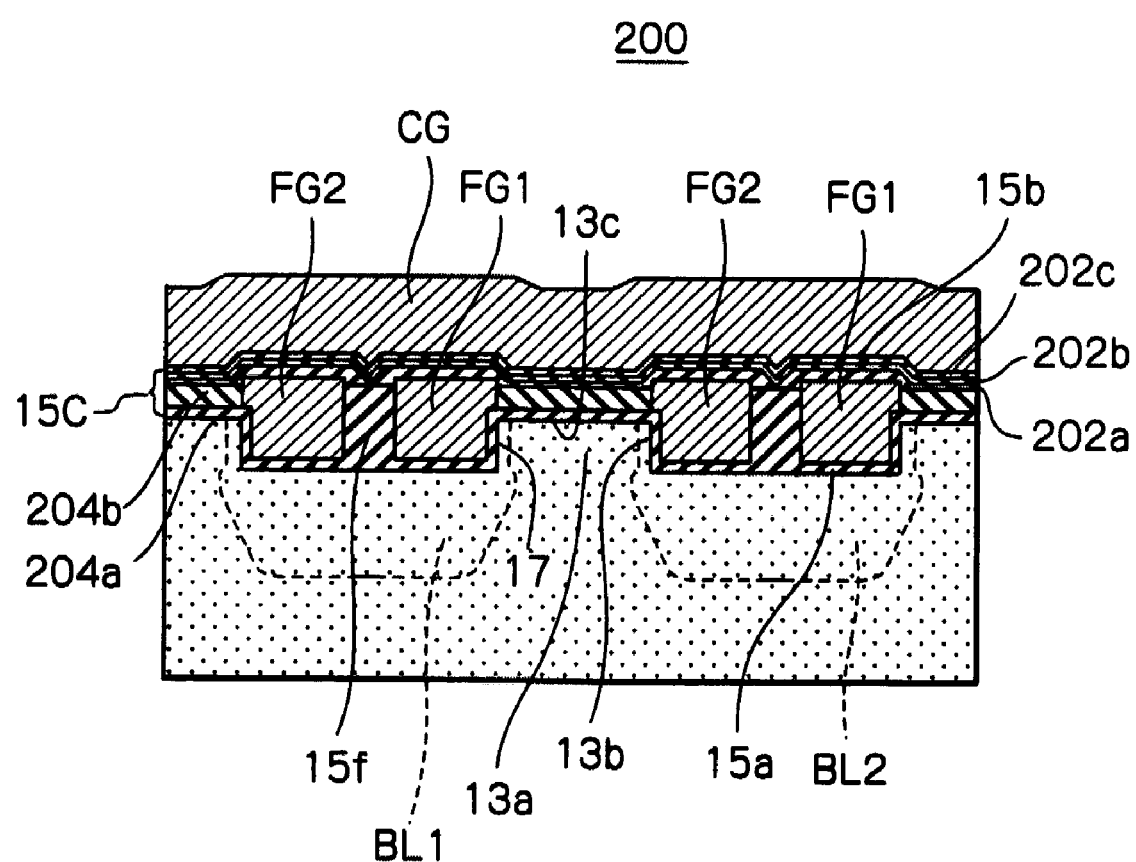
FIG. 58 is a section showing a specific configuration of an S type memory representative of another alternative embodiment of the present invention.

FIG. 58 shows another alternative embodiment of the present invention implemented as a flash memory 200. As shown, the flash memory 200 includes the P type semiconductor substrate formed with the projection 13a having opposite side walls 13b, gate insulation film 15c formed on the top 13c of the projection 13a, N type source/drain regions BL1 and BL2 formed on the surface of the substrate at opposite sides of the projection 13a, and tunnel insulation layers 15a covering the side walls 13b and source/drain regions BL1 and BL2. The floating gates FG1 and FG2 face the side walls 13b of the projection 13a and source/drain regions BL1 and BL2 via the tunnel insulation layers 15a. The inter-polycrystalline insulation layers 15b are formed on the floating gates FG1 and FG2. The control gate CG at least partly faces the floating gates FG1 and Fg2 via the inter-polycrystalline insulation layers 15b and faces the top 13c of the projection 13a via the gate insulation layer 15c.

The portions of the control gate CG facing the floating gates FG1 and FG2 and the portion of the same facing the top 13c of the projection 13a may be formed electrically independently of each other and electrically controlled independently of each other.

In the illustrative embodiment, the floating gates FG1 and FG2 each are substantially rectangular, as seen in a section perpendicular to the direction of column. One of two sides of the rectangle contiguous with each other faces one side of the projection 13a via the tunnel insulation layer 15a while the other side faces the source/drain region BL1 or BL2 via the tunnel insulation layer 15a. Another side of the rectangle faces the control gate CG via the inter-polycrystalline insulation layer 15b. Because the floating gates FG1 and FG2 each are substantially square, let the memory of the illustrative embodiment be referred to as an S (Square) type memory hereinafter.

In the illustrative embodiment, the inter-polycrystalline insulation layer 15b is implemented as a stack made up of a silicon oxide layer 202a, a silicon nitride layer 202b, and a silicon oxide layer 202c. The gate insulation layer 15c includes, in addition to the layers 202a through 202c, a silicon oxide layer 204a and a silicon nitride layer 204b underlying the layers 202a through 202c.

The silicon oxide layer 204a may be formed by a method customary with a gate insulation layer (thermal oxide layer). This is also true with the layers 202a through 202c constituting the inter-polycrystalline insulation layer 15b. Further, the layers 202a through 202c are formed after the surfaces of the floating gates FG1 and FG2 facing the control gate CG have been flattened by CMP, achieving high breakdown voltage. Should the insulation film 15b be formed on, e.g., polycrystalline silicon having a rough surface and used for the floating gates FG1 and FG2, the breakdown voltage of the insulation layer 15b might be lowered to a critical degree. The flash memory 200 of the illustrative embodiment can be produced with a minimum of risk because the individual step is conventional.

It is noteworthy that the square floating gates FG1 and FG2 have a lower coupling ratio CR than the sectorial floating gates FG1 and FG2 shown in FIG. 1. A coupling ratio refers to a ratio $C_{CF1}/(C_{FG1}+C_{FS})$ or $C_{CF2}/(C_{FG2}+C_{FD})$ where $C_{CF1}$, $C_{CF2}$ and so forth denote the various capacitors stated earlier with reference to FIG. 2. More specifically, the cell transistor shown in FIG. 1 has a coupling capacitance CR of about 0.37 while the transistor of the illustrative embodiment achieves a coupling ratio of 0.35 or below or around 0.32 for the following reason. The floating gates FG1 and FG2 of FIG. 1 each have a generally sectorial shape whose center angle is 90°. By contrast, the floating gates FG1 and FG2 of the illustrative embodiment each have a square shape, so that the contact area with the control gate CG is reduced.

A low capacitance ratio CR is desirable as to the sensing characteristic during read-out. More specifically, because the floating gates FG1 and FG2 and source/drain regions BL1 and BL2 are so strongly coupled, the potentials of the floating gates FG1 and FG2 are sufficiently influenced by the potentials of the source/drain regions BL1 and BL2. Consequently, the current window is widened and promotes rapid read-out.

Some different schemes are available for reducing the capacitance ratio CR. For example, the tunnel insulation layers 15a may be made thinner than the inter-polycrystalline layers 15b. Alternatively, the area over which each floating gate FG1 or FG2 faces the control gate CG may be made smaller than the area over which the floating gate faces the source/drain region BL1 or BL2 as far as possible. To reduce this area, each floating gate FG1 or FG2 may be provided with a trapezoidal shape facing the control gate CG over a small area, but facing the source/drain region BL1 or BL2 over a large area.

As for the relation between the capacitance ratio CR and deletion, when electrons should be discharged from the floating gate FG1 or FG2 to the control gate CG, the capacitance ratio should preferably be as small as possible in order to reduce the potential difference between the source/drain region BL1 or BL2 and the control gate CG This is because a small capacitance ratio allows a potential difference to be easily established between the floating gate FG1 or FG2 and the control gate CG. Conversely, if the capacitance ratio RC is small when electrons should be withdrawn from the floating gate FG1 or FG2 to the source/drain region BL1 or BL2, then the potential difference between the source/drain region BL1 or BL2 and the control gate CG must be increased. This is because a potential difference cannot be easily established between the floating gate FG1 or FG2 and the source/drain region BL1 or BL2.

In the illustrative embodiment, a plurality of cell transistors are arranged in the direction in which the source/drain regions BL1 and BL2 are positioned side by side. As shown in FIG. 58, An insulation layer 15f is positioned between the floating gate FG1 of one of nearby cell transistors and the floating gate FG2 of the other cell transistor for the following reason.

In the configuration shown in FIG. 1, the control gate CG and bit line BL2 face each other in a portion 234 between the cell transistors TC adjoining each other in the direction of row. Therefore, there is a fear that a leak current flows between the control gate CG and the bit line BL2 in the portion during various kinds of operation. In light of this, it is preferable to connect the selective oxide layer or fourth insulation layer 4 to the tunnel insulation layers 15a and make the former thicker than the latter, thereby obviating the above leak current on the basis of the thickness of the selective oxide layer 34. For this purpose, in FIG. 1, the fourth insulation layer is formed by selective oxidation.

In the S type memory, after the floating gates FG1 and FG2 have been so formed as to be separate from, but adjoin, each other by etching, an insulator is filled in the space between the floating gates FG1 and FG2 to form the insulation layer 15f. Subsequently, the control gate CG is formed above the floating gates FG1 and FG2 and insulation layer 15f. In this configuration, the floating gates FG1 and FG2 face the control gate CG only in the portions where the inter-polycrystalline insulation layers 15b are present.

Data are written to, read out of, or deleted from the cell transistor of the illustrative embodiment in exactly the same manner as described with reference to FIG. 1. In the delete mode, electrons should preferably be withdrawn from the floating gate FG1 or FG2 to the source/drain region BL1 or bl2. FIG. 60 shows specific voltages assigned to the source/drain regions BL1 and BL2 and control gate CG in the write, read and delete modes.

Figure 59:
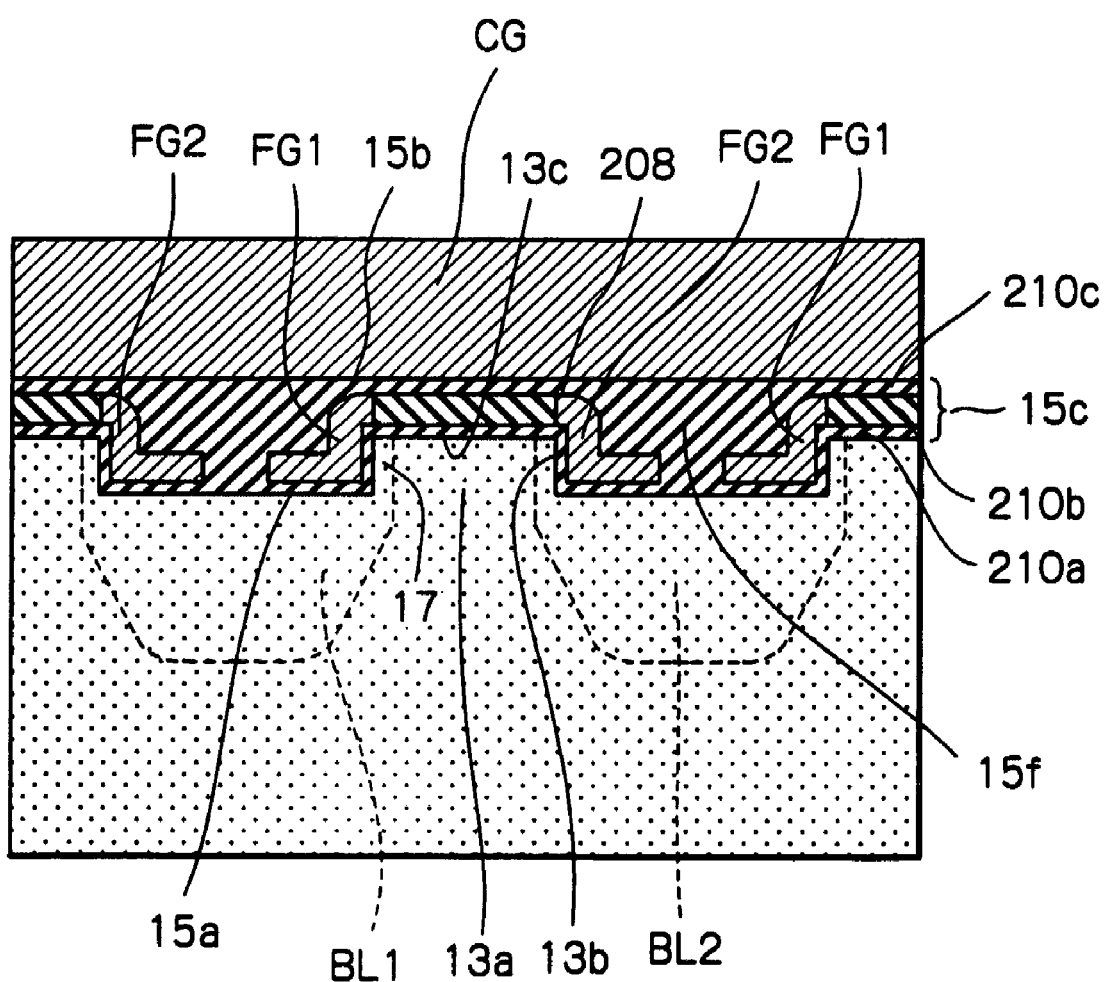
FIG. 59 is a section showing a specific configuration of an L type memory representative of a further alternative embodiment of the present invention.

Reference will be made to FIG. 59 for describing still another alternative embodiment of the present invention, which is also implemented as a flash memory 206. As shown, the flash memory 206 includes the P type semiconductor substrate formed with the projection 13a having opposite side walls 13b, gate insulation film 15c formed on the top 13c of the projection 13a, N type source/drain regions BL1 and BL2 formed on the surface of the substrate at opposite sides of the projection 13a, and tunnel insulation layers 15a covering the side walls 13b and source/drain regions BL1 and BL2. The floating gates FG1 and FG2 face the side walls 13b of the projection 13a and source/drain regions BL1 and BL2 via the tunnel insulation layers 15a. The inter-polycrystalline insulation layers 15b are formed on the floating gates FG1 and FG2. The control gate CG at least partly faces the floating gates FG1 and Fg2 via the inter-polycrystalline insulation layers 15b and faces the top 13c of the projection 13a via the gate insulation layer 15c.

Again, the portions of the control gate CG facing the floating gates FG1 and FG2 and the portion of the same facing the top 13c of the projection 13a may be formed electrically independently of each other and electrically controlled independently of each other.

In the illustrative embodiment, each floating gate FG1 or FG2 has a surface 208, which faces the control gate CG via the inter-polycrystalline insulation layer 15b, larger in area than a surface facing the source/drain region BL1 or BL2 via the tunnel insulation layer 15a, as seen in a section perpendicular to the direction of column. Particularly, in the illustrative embodiment, each floating gate FG1 or FG2 is generally configured in the form of a letter L; the side and bottom of the letter L respectively face the side wall 13b of the projection 13a and the source/drain region BL1 or BL2 via the tunnel insulation layer 15a. Further, the top of the letter L faces the control gate CG via the inter-polycrystalline insulation layer 15b. Let this cell transistor be referred to as an L type memory.

In the illustrative embodiment, the inter-polycrystalline insulation layer 15b is implemented as a silicon oxide layer formed by plasma oxidation. The gate insulation layer 15c includes, in addition to the inter-polycrystalline insulation layer 15b, a silicon oxide layer 210a and a silicon nitride layer 210b underlying the gate layer 15b. The tunnel insulation layer 15a is also implemented as a silicon oxide layer formed by plasma oxidation.

Plasma oxidation allows a uniform silicon oxide layer to be formed without regard to the plane direction, in both of (100) and (111) planes. This is desirable when the tunnel insulation layer 15a including a horizontal surface and a vertical surface should be formed by a single step. Further, an oxide layer formed by plasma oxidation has a high $Q_{BD}$ value representative of the resistance of an oxide layer to TDDB (Time Dependent Dielectric Breakdown) and has a low SILC (Stress Induced Leakage Current) value representative of resistance to dielectric breakdown.

In the illustrative embodiment, too, the inter-polycrystalline insulation layer 15b, i.e., the layer 210c is formed after the surfaces of the floating gates FG1 and FG2 facing the control gate CG have been flattened by CMP, achieving high breakdown voltage. Should the insulation film 15b be formed on, e.g., polycrystalline silicon having a rough surface and used for the floating gates FG1 and FG2, the breakdown voltage of the insulation layer 15b might be lowered to a critical degree. The flash memory 206 of the illustrative embodiment can also be produced with a minimum of risk because the individual step is conventional.

The L-shaped floating gates FG1 and FG2 have a lower coupling ratio CR than the floating gates shown in FIG. 1 and those shown in FIG. 58. More specifically, the cell transistor of FIG. 1 and S type memory of FIG. 58 have coupling ratios CR of about 0.37 and 0.32, respectively, the illustrative embodiment achieves a coupling ratio CR of 0.20 or below and can sufficiently reduce it even to about 0.17. This is because the surface 208 of each floating gate FG1 or FG2, which is generally L-shaped, facing the control gate CG is small.

A low capacitance ratio CR is desirable as to the sensing characteristic during read-out, as stated earlier. More specifically, the smaller the capacitance ratio, the wider the current window and therefore the higher the data reading speed. The illustrative embodiment allows the capacitance ratio to be reduced more easily than the embodiments shown in FIGS. 1 and 58, realizing a further increase in reading speed.

As for deletion, having such a small capacitance ratio CR, the illustrative embodiment allows electrons to be withdrawn from the floating gates FG1 and FG2 to the control gate CG only if a relatively low voltage is applied, as will be understood from the reason state earlier.

Again, after the floating gate FG1 and FG2 have been so formed as to be separate from, but adjoin, each other by etching, an insulator may be filled in the space between the floating gates FG1 and FG2 to form the insulation layer 15f. In this case, the control gate CG will also be formed above the floating gates FG1 and FG2 and insulation layer 15f. In this configuration, the floating gates FG1 and FG2 face the control gate CG only in the portions where the interpolycrystalline insulation layers 15b are present.

The size of each insulation layer 15f may be increased to substantially remove the bottom of the L-shaped floating gate FG1 or FG2, configuring the floating gate F1 or F2 in the form of a letter I. In such a case, although the capacities $C_{FS}$ and $C_{FD}$ between the floating gates FG1 and FG2 and the bit lines BL1 and BL2, respectively, decrease, the memory can be further integrated while preserving the advantages of the illustrative embodiment.

Data are written to, read out of, or deleted from the cell transistor of the illustrative embodiment in exactly the same manner as described with reference to FIG. 1. In the delete mode, electrons should preferably be withdrawn from the floating gate FG1 or FG2 to the control gate CG FIG. 61 shows specific voltages assigned to the source/drain regions BL1 and BL2 and control gate CG in the write, read and delete modes.

It is to be noted that the present invention is applicable not only to a semiconductor memory shown and described, but also to any other semiconductor device. While one conductivity type and counter conductivity type are respectively assumed to be P type and N type in the illustrative embodiments, they may, of course, be replaced with each other.

In summary, the present invention provides a semiconductor device and a semiconductor memory having the following various unprecedented advantages. A first and a second transistor has source/drain regions positioned in substantially the same plane, i.e., at the same level and therefore capable of being easily connected together in the same plane. This overcomes the technical difficulty particular to the conventional interconnection of source/drain regions.

Drive transistors and select transistors are positioned at different levels from each other, but can be formed at the same time by a single step, obviating the need for an extra step. Also, insulation films for protection are formed on the ends of projections in the direction of column at the same time as LDD side wall insulation layers, further reducing the number of manufacturing steps.

Cell transistors are divided into a plurality of blocks in the direction of row while, in an isolation region intervening between nearby blocks, conductors extending in the direction of row are connected to control gates. This substantially lowers the resistance of the control gates in the direction or row. Further, in each bank, the cell transistors share a channel region. This, coupled with the fact that banks are isolated from each other by a device isolation region positioned at the ends of the bank, allows the cell transistors to be controlled bank by bank.

Virtual ground lines, which extend in the direction of column and connected to the source/drain regions in connecting portions 218, substantially lower the resistance of the source/drain regions in the direction of column.

Data are written to or read out of a plurality of cell transistors belonging to different blocks at the same time, so that the writing speed or the reading speed of the entire semiconductor memory is increased.

Extending in the direction of column, third conductors are connected to the source/drain regions between the control gates adjoining each other in the direction of column, substantially lowering the resistance of the source/drain regions in the direction of column.

The entire disclosure of Japanese patent application Nos. 2002-89744 and 2003-36005 filed on Mar. 27, 2002, and Feb. 14, 2003, respectively, including the specification, claims, accompanying drawings and abstract of the disclosure is incorporated herein by reference in its entirety.

While the present invention has been described with reference to the particular illustrative embodiments, it is not to be restricted by the embodiments. It is to be appreciated that those skilled in the art can change or modify the embodiments without departing from the scope and spirit of the present invention.

What is claimed is:

1. A semiconductor memory comprising a plurality of cell transistors arranged in a direction of row, wherein each of said plurality of cell transistors comprises source/drain regions positioned at a lower level than a part of a channel region of the transistor and a control gate, said plurality of cell transistors share said control gate, said plurality of cell transistors are divided into a plurality of blocks, and said semiconductor memory further comprises an insulation isolation region intervening between nearby ones of the plurality of blocks and a conductor extending in the direction of row and connected to said control gate in a plurality of insulation isolation regions.

2. The semiconductor memory in accordance with claim 1, wherein said cell transistors are arranged in the direction of column as well as in the direction of row, said cell transistors arranged in the direction of column are divided into a plurality of groups and share a channel region in each of said plurality of groups, and said semiconductor memory further comprises insulation isolation regions positioned at ends of said plurality of groups for isolating nearby ones of said plurality of groups.

3. The semiconductor memory in accordance with claim 1, wherein data is written to or read out of a plurality of cell transistors belonging to different ones of said plurality of blocks in parallel.

4. A semiconductor memory comprising a plurality of cell transistors arranged in a direction of row and a direction of column, wherein each of said plurality of cell transistors comprises source/drain regions positioned at a lower level than a part of a channel region of said cell transistor and a control gate, said cell transistors arranged in the direction of row share said control gate, said plurality of cell transistors arranged in the direction of row are divided into a plurality of blocks, said semiconductor memory further comprises insulation isolation regions each intervening between nearby ones of said plurality of blocks, said cell transistor arranged in the direction of column are divided into a plurality of groups and share a channel region in each of said plurality of groups, and said semiconductor memory further comprises insulation isolation regions positioned at ends of said plurality of groups for thereby isolating said plurality of groups.

5. The semiconductor memory in accordance with claim 4, wherein data is written to or read out of a plurality of cell transistors belonging to different ones of said plurality of blocks in parallel.

6. A semiconductor memory comprising a plurality of cell transistors arranged in a direction of column, wherein each of said plurality of cell transistors is formed with source/drain regions at a lower level than a part of a channel region of said cell transistor and are divided into a plurality of groups, nearby ones of said cell transistors in the direction of column sharing one of said source/drain regions at least in each of said plurality of groups, and said semiconductor memory further comprises a plurality of connecting portions assigned to said plurality of groups and a conductor extending in the direction of column and connected to said source/drain regions at said plurality of connecting portions.

7. The semiconductor memory in accordance with claim 6, wherein said cell transistors belonging to a same group share said channel region, and said semiconductor memory further comprises insulation isolation regions positioned at ends of said groups for thereby isolating said groups from each other.

8. A semiconductor memory comprising a plurality of cell transistors arranged in a direction of row and a direction of column, wherein each of said plurality of cell transistors comprises a control gate, said cell transistors arranged in the direction of column sharing said control gate, each of said plurality of cell transistors is formed with source/drain regions at a lower level than a part of a channel region of said cell transistor, nearby ones of said cell transistors in the direction of column sharing one of said source/drain region, and said semiconductor memory further comprises a conductor extending in the direction of column and connected to said source/drain region between control gates adjoining each other in the direction of column, whereby a resistance of said source/drain region in the direction of column is substantially lowered.

9. A semiconductor memory comprising a plurality of cell transistors arranged in a direction of column and a direction of row, wherein each of said plurality of cell transistors is formed with source/drain regions at a lower level than a part of a channel region of said cell transistor, nearby ones of said cell transistors in the direction of column sharing one of said source/drain regions, nearby ones of said cell transistors in the direction of row share said source/drain region between said nearby ones, a high concentration region of same conductivity as said source/drain region being formed at an intermediate portion of said source/drain region, and said cell transistors arranged in the direction of column share said high concentration region.

* * * * *